US010288426B2

(12) United States Patent
Aoyama

(10) Patent No.: US 10,288,426 B2
(45) Date of Patent: May 14, 2019

(54) CIRCUIT DEVICE, PHYSICAL-QUANTITY DETECTING APPARATUS, ELECTRONIC APPARATUS, AND MOVING OBJECT

(71) Applicant: Seiko Epson Corporation, Tokyo (JP)

(72) Inventor: Takashi Aoyama, Chino (JP)

(73) Assignee: Seiko Epson Corporation (JP)

( * ) Notice: Subject to any disclaimer, the term of this patent is extended or adjusted under 35 U.S.C. 154(b) by 496 days.

(21) Appl. No.: 15/068,763

(22) Filed: Mar. 14, 2016

(65) Prior Publication Data

US 2016/0276990 A1     Sep. 22, 2016

(30) Foreign Application Priority Data

Mar. 16, 2015 (JP) ................................ 2015-051774
Mar. 16, 2015 (JP) ................................ 2015-051775

(51) Int. Cl.
| | |
|---|---|
| *G01D 3/08* | (2006.01) |
| *G01C 19/5642* | (2012.01) |
| *H03F 3/45* | (2006.01) |
| *H03K 5/24* | (2006.01) |
| *G01C 19/5776* | (2012.01) |

(52) U.S. Cl.
CPC ..... *G01C 19/5642* (2013.01); *G01C 19/5776* (2013.01); *G01D 3/08* (2013.01); *H03F 3/45475* (2013.01); *H03K 5/24* (2013.01); *H03F 2200/261* (2013.01); *H03F 2203/45118* (2013.01); *H03F 2203/45138* (2013.01); *H03F 2203/45522* (2013.01); *H03F 2203/45526* (2013.01); *H03F 2203/45528* (2013.01)

(58) Field of Classification Search
CPC ............ G01C 19/5642; G01C 19/5776; G01C 19/5607; G01C 19/5614; G01C 19/5649; G01C 19/5691; G01D 3/08
See application file for complete search history.

(56) References Cited

U.S. PATENT DOCUMENTS

| | | | | |
|---|---|---|---|---|
| 4,532,468 A | * | 7/1985 | Nishida .................... | G01K 1/20 323/367 |
| 4,982,422 A | * | 1/1991 | Itoh ...................... | H04M 19/005 379/324 |
| 5,434,467 A | * | 7/1995 | Abe .................... | G01C 19/5642 310/316.01 |

(Continued)

FOREIGN PATENT DOCUMENTS

| | | |
|---|---|---|
| JP | 2003-258577 A | 9/2003 |
| JP | 2008-122122 A | 5/2008 |

(Continued)

*Primary Examiner* — Helen C Kwok
(74) *Attorney, Agent, or Firm* — Harness, Dickey & Pierce, P.L.C.

(57) ABSTRACT

A circuit device includes a differential input-to-single-ended output first amplifier, to an inversion input terminal of which, of first and second signals forming differential signals, the first signal is input and to a non-inversion input terminal of which the second signal is input, a differential input-to-single-ended output second amplifier, to a non-inversion input terminal of which the first signal is input and to an inversion input terminal of which the second signal is input, and a failure detection circuit that performs failure detection on the basis of an output signal of the first amplifier and an output signal of the second amplifier.

20 Claims, 23 Drawing Sheets

(56) References Cited

U.S. PATENT DOCUMENTS

| | | | | |
|---|---|---|---|---|
| 5,612,488 | A * | 3/1997 | Yamamoto | G01D 3/08 73/1.38 |
| 6,422,088 | B1 * | 7/2002 | Oba | G01D 3/08 73/754 |
| 6,714,070 | B1 | 3/2004 | Smith | |
| 8,384,635 | B2 * | 2/2013 | Weng | G09G 3/3688 345/89 |
| 8,723,604 | B2 * | 5/2014 | Wan | H03F 1/34 330/100 |
| 2004/0189480 | A1 * | 9/2004 | Imai | B60T 17/22 340/663 |
| 2004/0237651 | A1 * | 12/2004 | Furuichi | G01P 15/125 73/514.32 |
| 2007/0041135 | A1 * | 2/2007 | Ito | G01C 19/5726 361/78 |
| 2009/0013785 | A1 | 1/2009 | Yoshida et al. | |
| 2009/0134940 | A1 * | 5/2009 | Nishizawa | H03F 1/34 330/149 |
| 2011/0107836 | A1 * | 5/2011 | Shoji | G01C 19/00 73/504.12 |
| 2012/0055230 | A1 * | 3/2012 | Naruse | G01C 19/5726 73/1.37 |
| 2013/0061680 | A1 * | 3/2013 | Sato | G01C 19/5607 73/662 |
| 2013/0088241 | A1 * | 4/2013 | Asako | G01R 31/343 324/546 |
| 2015/0149848 | A1 * | 5/2015 | Haneda | G05B 19/0423 714/746 |
| 2016/0173992 | A1 * | 6/2016 | Nicollini | H04R 19/005 381/113 |
| 2016/0335885 | A1 * | 11/2016 | Aoyama | G08C 15/06 |
| 2017/0108536 | A1 * | 4/2017 | Hebiguchi | G01R 15/08 |
| 2017/0288439 | A1 * | 10/2017 | Tamegai | G01R 31/3617 |

FOREIGN PATENT DOCUMENTS

| | | |
|---|---|---|
| JP | 2008-209182 A | 9/2008 |
| JP | 2008-298709 A | 12/2008 |
| JP | 2012-044571 A | 3/2012 |

* cited by examiner

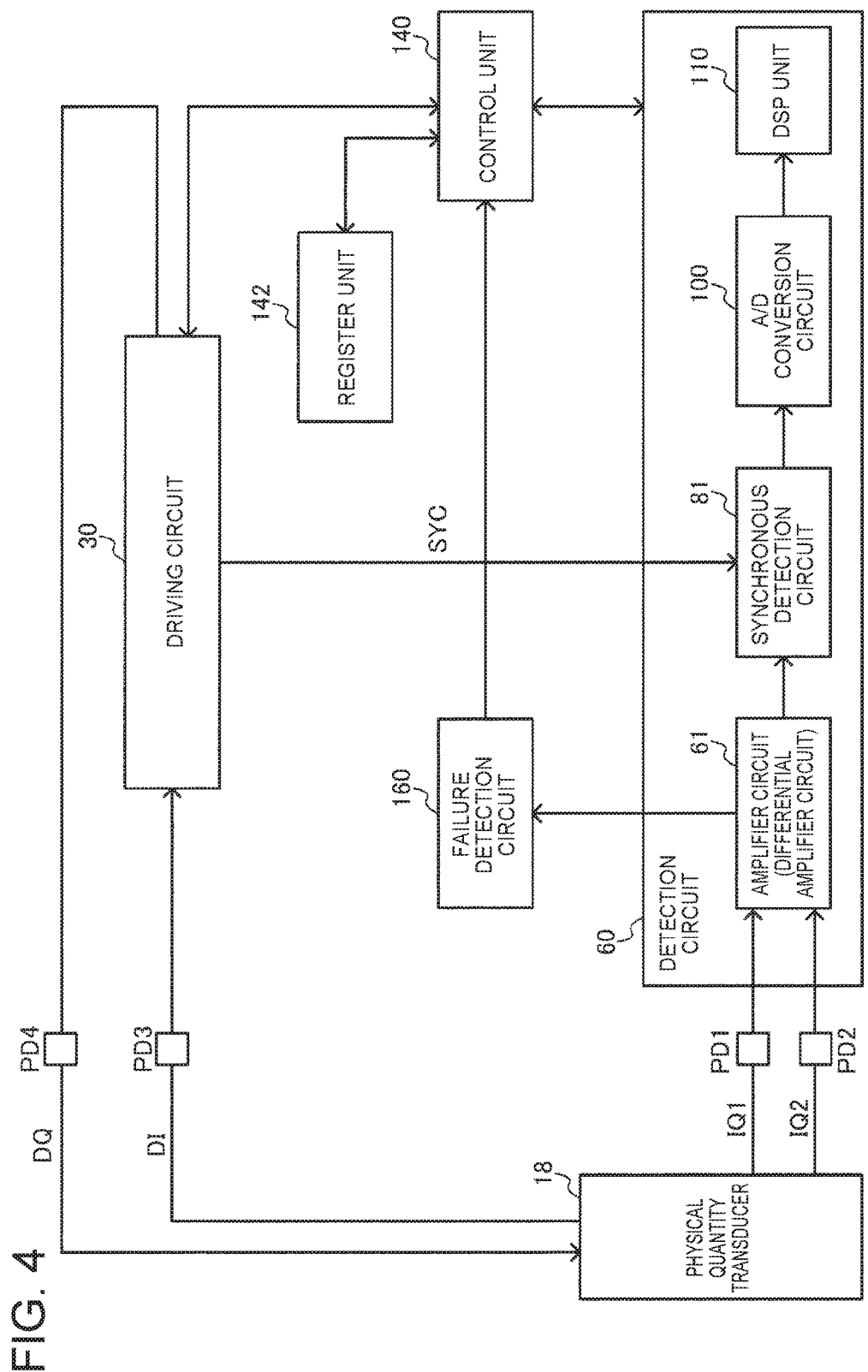

CIRCUIT DEVICE, PHYSICAL-QUANTITY DETECTING APPARATUS, ELECTRONIC APPARATUS, AND MOVING OBJECT

BACKGROUND

1. Technical Field

The present invention relates to a circuit device, a physical-quantity detecting apparatus, an electronic apparatus, a moving object, and the like.

2. Related Art

There has been known a circuit device that detects a physical quantity on the basis of a detection signal from a physical quantity transducer. Taking a gyro sensor as an example, the circuit device detects angular velocity and the like as physical quantities. The gyro sensor is incorporated in electronic apparatuses such as a digital camera and a smart phone and moving objects such as a car and an airplane. Camera shake correction, posture control, GPS autonomous navigation, and the like are performed using detected physical quantities such as angular velocity.

As the circuit device of such a gyro sensor, for example, there is a technique disclosed in JP-A-2008-122122.

In JP-A-2008-122122, a differential-signal processing circuit such as a differential amplifier circuit or a gain adjustment amplifier is provided at a post stage of first and second Q/V conversion circuits (charge/voltage conversion circuits) of a detection circuit. The differential-signal processing circuit amplifies a differential component between first and second signals from the first and second Q/V conversion circuits and outputs the differential component to a circuit at a post stage.

However, in the past, failure detection of the differential-signal processing circuit cannot be performed. For example, although failure detection of the entire detection circuit is possible, a failure of the differential-signal processing circuit cannot be individually detected. For example, when a differential component is seen as being normally differentially amplified, although the differential-signal processing circuit is actually out of order, proper failure detection of the differential-signal processing circuit cannot be realized by the failure detection of the entire detection circuit. Therefore, when a failure occurs over time in the differential-signal processing circuit while the circuit device is actually operating, appropriate measures cannot be taken against the failure. As a result, for example, deterioration in reliability occurs.

SUMMARY

An advantage of some aspects of the invention is to provide a circuit device, a physical-quantity detecting apparatus, an electronic apparatus, a moving object, and the like that can properly detect a failure of a differential-signal processing circuit.

The advantage of the invention can be implemented as the following forms or embodiments.

An aspect of the invention relates to a circuit device including: a differential input-to-single-ended output first amplifier, to an inversion input terminal of which, of first and second signals forming differential signals, the first signal is input and to a non-inversion input terminal of which the second signal is input; a differential input-to-single-ended output second amplifier, to a non-inversion input terminal of which the first signal is input and to an inversion input terminal of which the second signal is input; and a failure detection circuit that performs failure detection on the basis of an output signal of the first amplifier and an output signal of the second amplifier.

In the aspect of the invention, the differential input-to-single-ended output (differential input & single-ended output) first amplifier, to the inversion input terminal and the non-inversion input terminal of which the first and second signals forming the differential signals are respectively input, and the differential input-to-single-ended output (differential input & single-ended output) second amplifier, to the non-inversion input terminal and the inversion input terminal of which the first and second signals are respectively input, are provided. By providing the first and second amplifiers, the output signals of the first and second amplifiers change to differential output signals. It is possible to realize a differential input/differential output differential-signal processing circuit. In the aspect of the invention, failure detection is performed on the basis of the output signal of the first amplifier and the output signal of the second amplifier of the differential-signal processing circuit configured in this way. Consequently, even a failure likely to be overlooked when a differential-signal processing circuit is configured by one differential input/differential output fully differential amplifier can be detected. It is possible to provide a circuit device that can properly detect a failure of the differential-signal processing circuit.

In the aspect of the invention, the first and second amplifiers may be amplifiers that perform a single-end output based on the same analog common voltage.

With this configuration, for example, when the first amplifier outputs a positive polarity signal on the basis of the analog common voltage, the second amplifier can output a negative polarity signal on the basis of the analog common voltage. When the first amplifier outputs a negative polarity signal on the basis of the analog common voltage, the second amplifier can output a positive polarity signal on the basis of the analog common voltage. It is possible to realize a differential output differential-signal processing circuit.

In the aspect of the invention, the failure detection circuit may perform the failure detection by detecting whether a monitoring voltage based on a voltage of the output signal of the first amplifier and a voltage of the output signal of the second amplifier is within a determination voltage range based on the analog common voltage.

With this configuration, for example, when the monitoring voltage based on the voltages of the output signals of the first and second amplifiers is within the determination voltage range, it is possible to determine that the circuit device is in a normal state. When the monitoring voltage is outside the determination voltage range, it is possible to determine that a failure is likely to have occurred.

In the aspect of the invention, the failure detection circuit may perform the failure detection on the basis of a monitoring voltage obtained by dividing a voltage of the output signal of the first amplifier and a voltage of the output signal of the second amplifier.

With this configuration, simply by dividing the voltages of the output signals of the first and second amplifiers, it is possible to appropriately detect a failure using the monitoring voltage generated by the voltage division. It is possible to perform the failure detection with a simple configuration.

In the aspect of the invention, the failure detection circuit may perform the failure detection by detecting whether the monitoring voltage is within a determination voltage range between a threshold voltage on a high potential side and a threshold voltage on a low potential side.

With this configuration, for example, when the monitoring voltage is within the determination voltage range specified by the threshold voltage on the high potential side and the threshold voltage on the low potential side, it is possible to determine the circuit device is in the normal state. When the monitoring voltage is outside the determination voltage range, it is possible to determine that a failure is likely to have occurred.

In the aspect of the invention, the first amplifier may include: a first operational amplifier; a first resistance element provided between the inversion input terminal of the first amplifier and an inversion input terminal of the first operational amplifier; a second resistance element provided between the inversion input terminal of the first operational amplifier and an output terminal of the first operational amplifier; a third resistance element provided between the non-inversion input terminal of the first amplifier and a non-inversion input terminal of the first operational amplifier; and a fourth resistance element provided between the non-inversion input terminal of the first operational amplifier and an analog common voltage node. The second amplifier may include: a second operational amplifier; a fifth resistance element provided between the inversion input terminal of the second amplifier and an inversion input terminal of the second operational amplifier; a sixth resistance element provided between the inversion input terminal of the second operational amplifier and an output terminal of the second operational amplifier; a seventh resistance element provided between the non-inversion input terminal of the second amplifier and a non-inversion input terminal of the second operational amplifier; and an eighth resistance element provided between the non-inversion input terminal of the second operational amplifier and the analog common voltage node.

With this configuration, it is possible to realize, with the first operational amplifier and the first to fourth resistance elements, the differential input-to-single-ended output first amplifier, to the inversion input terminal and the non-inversion input terminal of which the first and second signals forming the differential signals are respectively input. The differential input-to-single-ended output second amplifier, to the non-inversion input terminal and the inversion input terminal of which the first and second signals are respectively input, can be realized by the second operational amplifier and the fifth to eighth resistance elements.

In the aspect of the invention, the circuit device may further include: a driving circuit configured to drive a physical quantity transducer; and a detection circuit to which first and second detection signals from the physical quantity transducer are input. The detection circuit may include a differential amplifier circuit configured by the first and second amplifiers and configured to receive an input of the first and second signals corresponding to the first and second detection signals.

With this configuration, it is possible to realize, with the differential input-to-single-ended output first and second amplifiers, the differential amplifier circuit of the detection circuit that performs a detection operation on the basis of the first and second detection signals from the physical quantity transducer driven by the driving circuit. In the detection circuit having such a configuration, it is possible to perform individual failure detection of the differential amplifier circuit configured by the first and second amplifiers and achieve, for example, improvement of reliability.

In the aspect of the invention, the detection circuit may include: a first charge/voltage conversion circuit provided on a pre-stage side of the differential amplifier circuit and configured to receive an input of the first detection signal and output the first signal; and a second charge/voltage conversion circuit provided on the pre-stage side of the differential amplifier circuit and configured to receive an input of the second detection signal and output the second signal.

With this configuration, it is possible to convert, with the first and second charge/voltage conversion circuits, the first and second detection signals, which are charge signals, into the first and second signals, which are voltage signals, and differentially amplify a differential component between the first and second signals with the differential amplifier circuit configured by the first and second amplifiers. In the detection circuit having such a configuration, it is possible to perform individual failure detection of the differential amplifier circuit and achieve, for example, improvement of reliability.

In the aspect of the invention, the circuit device may further include a gain adjustment amplifier provided on a post stage side of the differential amplifier circuit and configured to adjust a gain of an output signal of the differential amplifier circuit.

With this configuration, by using the gain adjustment amplifier provided on the post stage side of the differential amplifier circuit, it is possible to variably adjust the gain of the output signal of the differential amplifier circuit.

In the aspect of the invention, the circuit device may further include a synchronous detection circuit provided on a post stage side of the gain adjustment amplifier and configured to perform synchronous detection on the basis of a synchronization signal from the driving circuit.

With this configuration, in the detection circuit configured to extract, with the synchronous detection, a desired signal included in the first and second detection signals, it is possible to perform individual failure detection of the differential amplifier circuit and achieve, for example, improvement of reliability.

Another aspect of the invention relates to a circuit device including: a first operational amplifier, to a non-inversion input terminal of which, of first and second signals forming differential signals, the first signal is input; a second operational amplifier, to a non-inversion input terminal of which the second signal of the first and second signals is input; a first voltage division circuit configured to divide a voltage at a first node and a voltage at an output terminal of the first operational amplifier and set an inversion input terminal of the first operational amplifier to a voltage obtained by the voltage division; a second voltage division circuit configured to divide the voltage at the first node and a voltage at an output terminal of the second operational amplifier and set an inversion input terminal of the second operational amplifier to a voltage obtained by the voltage division; and a failure detection circuit configured to perform failure detection on the basis of a monitoring voltage, which is the voltage at the first node.

In the aspect of the invention, the first operational amplifier, to the non-inversion input terminal of which the first signal of the first and second signals forming the differential signals is input, and the second operational amplifier, to the non-inversion input terminal of which the second signal is input, are provided. By dividing the voltage at the first node and the voltage at the output terminal of the first operational amplifier, the voltage at the inversion input terminal of the first operational amplifier is set. By dividing the voltage at the first node and the voltage at the output terminal of the second operational amplifier, the voltage at the inversion input terminal of the second operational amplifier is set. By adopting such a configuration, the output signals of the first and second operational amplifiers change to differential output signals. It is possible to realize a differential input/ differential output differential-signal processing circuit. In the aspect of the invention, failure detection is performed using, as a monitoring voltage, the voltage at the first node of the differential-signal processing circuit configured as explained above. Consequently, it is possible to detect a failure effectively making use of the circuit elements configuring the first and second voltage division circuits. Therefore, it is possible to provide, while minimizing an increase in a circuit size, the circuit device that can properly detect a failure of the differential-signal processing circuit.

In the aspect of the invention, the first voltage division circuit may include: a first resistance element provided between the first node and the inversion input terminal of the first operational amplifier; and a second resistance element provided between the inversion input terminal of the first operational amplifier and the output terminal of the first operational amplifier. The second voltage division circuit may include: a third resistance element provided between the first node and the inversion input terminal of the second operational amplifier; and a fourth resistance element provided between the inversion input terminal of the second operational amplifier and the output terminal of the second operational amplifier.

With this configuration, it is possible to set the voltage at the inversion input terminal of the first operational amplifier to a voltage obtained by dividing, with the first and second resistance elements, the voltage at the first node and the voltage at the output terminal of the first operational amplifier. It is possible to set the voltage at the inversion input terminal of the second operational amplifier to a voltage obtained by dividing, with the third and fourth resistance elements, the voltage at the first node and the voltage at the output terminal of the second operational amplifier. It is possible to realize failure detection of the differential-signal processing circuit using, as a monitoring voltage, the voltage at the first node to which one end of the first resistance element and one end of the third resistance element are connected in common.

In the aspect of the invention, at least one of the first and second resistance elements and at least one of the third and fourth resistance elements may be resistance elements having variable resistance values.

With this configuration, by variably adjusting at least one of the first and second resistance elements and at least one of the third and fourth resistance elements, it is possible to realize a differential input/differential output gain adjustment amplifier.

In the aspect of the invention, the first signal may be a signal that changes to a positive side or a negative side on the basis of an analog common voltage, the second signal may be a signal that changes to the positive side or the negative side on the basis of the analog common voltage, and the failure detection circuit may perform failure detection by detecting whether the monitoring voltage is within a determination voltage range based on the analog common voltage.

With this configuration, for example, when the monitoring voltage is within the determination voltage range based on the analog common voltage, it is possible to determine that the circuit device is in a normal state. When the monitoring voltage is outside the determination voltage range, it is possible to determine that a failure is likely to have occurred.

In the aspect of the invention, the failure detection circuit may perform failure detection by detecting whether the monitoring voltage is within the determination voltage range between a threshold voltage on a high potential side and a threshold voltage on a low potential side.

With this configuration, for example, when the monitoring voltage is within the determination voltage range specified by the threshold voltage on the high potential side and the threshold voltage on the low potential side, it is possible to determine that the circuit device is in a normal state. When the monitoring voltage is outside the determination voltage range, it is possible to determine that a failure is likely to have occurred.

In the aspect of the invention, the circuit device may further include: a driving circuit configured to drive a physical quantity transducer; and a detection circuit to which first and second detection signals from the physical quantity transducer are input. The detection circuit may include again adjustment amplifier configured by the first and second operational amplifiers and the first and second voltage division circuits and configured to receive an input of the first and second signals corresponding to the first and second detection signals.

With this configuration, it is possible to realize, with the first and second operational amplifiers and the first and second voltage division circuits, the gain adjustment amplifier of the detection circuit that performs a detection operation on the basis of the first and second detection signals from the physical quantity transducer driven by the driving circuit. In the detection circuit having such a configuration, it is possible to perform individual failure detection of the gain adjustment amplifier and achieve, for example, improvement of reliability.

In the aspect of the invention, the circuit device may further include a synchronous detection circuit provided on a post stage side of the gain adjustment amplifier and configured to perform synchronous detection on the basis of a synchronization signal from the driving circuit.

With this configuration, in the detection circuit configured to extract, with the synchronous detection, a desired signal included in the first and second detection signals, it is possible to perform individual failure detection of the gain adjustment amplifier and achieve, for example, improvement of reliability.

In the aspect of the invention, the detection circuit may include a differential amplifier circuit provided on a pre-stage side of the gain adjustment amplifier and configured to output the first and second signals.

With this configuration, it is possible to input the first and second signals differentially amplified by the differential amplifier circuit to the gain adjustment amplifier and variably adjust a gain of the first and second signals.

In the aspect of the invention, the detection circuit may include: a first charge/voltage conversion circuit provided on a pre-stage side of the differential amplifier circuit and configured to receive an input of the first detection signal; and a second charge/voltage conversion circuit provided on the pre-stage side of the differential amplifier circuit and configured to receive an input of the second detection signal.

With this configuration, it is possible to convert, with the first and second charge/voltage conversion circuits, the first and second detection signals, which are charge signals, into voltage signals and input the first and second signals of the voltage signals corresponding to the first and second detection signals to the gain adjustment amplifier. In the detection circuit having such a configuration, it is possible to perform individual failure detection of the gain adjustment amplifier and achieve, for example, improvement of reliability.

Still another aspect of the invention relates to a physical-quantity detecting apparatus including: the circuit device described above; and the physical quantity transducer.

Yet another aspect of the invention relates to an electronic apparatus including the circuit device described above.

Still yet another aspect of the invention relates to a moving object including the circuit device described above.

BRIEF DESCRIPTION OF THE DRAWINGS

The invention will be described with reference to the accompanying drawings, wherein like numbers reference like elements.

FIG. 4 is an overall system configuration example of the circuit device according to the first embodiment.

DESCRIPTION OF EXEMPLARY EMBODIMENTS

Preferred embodiments of the invention are explained in detail below. Note that the embodiments explained below do not unduly limit contents of the invention described in the appended claims. Not all of components explained in the embodiments are always essential as solving means of the invention.

1. A Circuit Device

Figure 1:
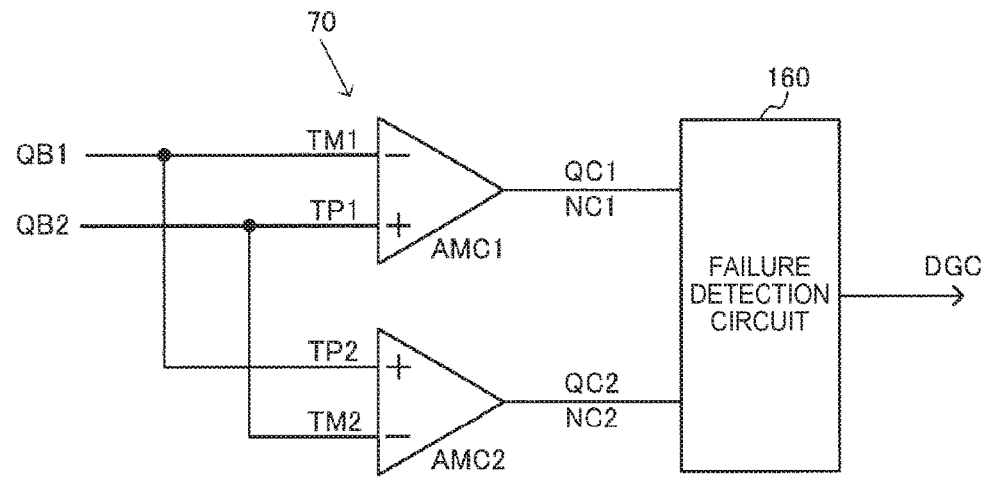
FIG. 1 is a basic configuration example of a circuit device according to a first embodiment.

A circuit device according to a first embodiment of the invention is explained below. A basic configuration example of the circuit device according to the first embodiment is shown in FIG. 1. The circuit device according to this embodiment includes a first amplifier AMC1 and a second amplifier AMC2. A differential amplifier circuit 70 (in a broad sense, a differential-signal processing circuit) is configured by the first and second amplifiers AMC1 and AMC2. Further, the circuit device according to this embodiment includes a failure detection circuit 160.

The first amplifier AMC1 is a differential input-to-single-ended output (differential input & single-ended output) amplifier. Specifically, in the first amplifier AMC1, of first and second signals QB1 and QB2 forming differential signals, the first signal QB1 is input to an inversion input terminal TM1(−) and the second signal QB2 is input to a non-inversion input terminal TP1(+). The first amplifier AMC1 outputs a single-ended signal QC1 to an output node NC1.

The second amplifier AMC2 is also a differential input-to-single-ended output (differential input & single-ended output) amplifier. Specifically, in the second amplifier AMC2, of the first and second signals QB1 and QB2 forming the differential signals, the first signal QB1 is input to a non-inversion input terminal TP2(+) and the second signal QB2 is input to an inversion input terminal TM2(−). The second amplifier AMC2 outputs a single-ended signal QC2 to an output node NC2.

The first and second amplifiers AMC1 and AMC2 are amplifiers that perform a single-ended output based on the same analog common voltage. The output signals QC1 and QC2 of the amplifiers AMC1 and AMC2 form differential output signals of the differential amplifier circuit 70. For example, when the first amplifier AMC1 is outputting the signal QC1 of a positive voltage on the basis of an analog common voltage (analog ground), the second amplifier AMC2 outputs the signal QC2 of a negative voltage on the basis of the analog common voltage. When the first amplifier AMC1 is outputting the signal QC1 of the negative voltage on the basis of the analog common voltage, the second amplifier AMC2 outputs the signal QC2 of the positive voltage on the basis of the analog common voltage. Therefore, the signals QC1 and QC2 change to differential output signals.

The failure detection circuit 160 performs failure detection on the basis of the output signal QC1 of the first amplifier AMC1 and the output signal QC2 of the second amplifier AMC2. For example, the failure detection circuit 160 performs the failure detection on the basis of a voltage of the output signal QC1 of the first amplifier AMC1 and a voltage of the output signal QC2 of the second amplifier AMC2. Specifically, the failure detection circuit 160 performs the failure detection by detecting whether a monitoring voltage based on the voltage of the output signal QC1 of the first amplifier AMC1 and the voltage of the output signal QC2 of the second amplifier AMC2 is within a determination voltage range based on (centering on) the analog common voltage.

For example, the failure detection circuit 160 performs the failure detection on the basis of a monitoring voltage (a divided voltage) obtained by dividing the voltage of the output signal QC1 of the first amplifier AMC1 and the voltage of the output signal QC2 of the second amplifier AMC2. That is, the failure detection circuit 160 performs the failure detection by detecting whether the monitoring voltage is within a determination voltage range between a threshold voltage on a high potential side and a threshold voltage on a low potential side. The failure detection circuit 160 outputs a monitoring result signal DGC (a diagnosis signal or a failure detection signal).

In this way, in this embodiment, the differential amplifier circuit 70 is configured by the two differential input-to-single-ended output amplifiers AMC1 and AMC2.

That is, usually, in general, the differential amplifier circuit 70 is realized using one differential input/differential output fully differential amplifier.

In this embodiment, contrary to this, the differential amplifier circuit 70 is realized using the two differential-input-to-single-ended output amplifiers AMC1 and AMC2. When the two amplifiers AMC1 and AMC2 are used in this way, a circuit size is likely to increase. However, in this embodiment, priority is given to properly detecting a failure of the differential amplifier circuit 70 and improving reliability.

In this way, the differential amplifier circuit 70 is configured by the two differential input-to-single-ended output amplifiers AMC1 and AMC2 and the failure detection circuit 160 performs the failure detection using the output signals QC1 and QC2 of the differential input-to-single-ended output amplifiers AMC1 and AMC2. Consequently, it is possible to realize proper failure detection of the differential amplifier circuit 70. For example, in the normal differential input/differential output fully differential amplifier, even if a failure occurs in a circuit, a differential component is sometimes seen as being properly amplified. In such a case, it is likely that proper failure detection of the differential amplifier circuit 70 cannot be realized.

In this regard, in this embodiment, since the differential amplifier circuit 70 is configured by the two differential input-to-single-ended output amplifiers AMC1 and AMC2, the failure detection circuit 160 can properly detect even the failure in the case described above by performing the failure detection based on the output signals QC1 and QC2. That is, the output signal QC1 of the amplifier AMC1 is generated on the basis of both of the signals QB1 and QB2. The output signal QC1 of the amplifier AMC1 is also generated on the basis of both of the signals QB1 and QB2. Therefore, when a failure occurs on a path of the signal QB1 or when a failure occurs on a path of the signal QB2, the failure affects the output signals QC1 and QC2 of the amplifiers AMC1 and AMC2. Therefore, the failure detection circuit 160 monitors the output signals QC1 and QC2. Consequently, it is possible to properly detect the occurrence of the failure in both the cases and realize proper failure detection of the differential amplifier circuit.

Figure 2:
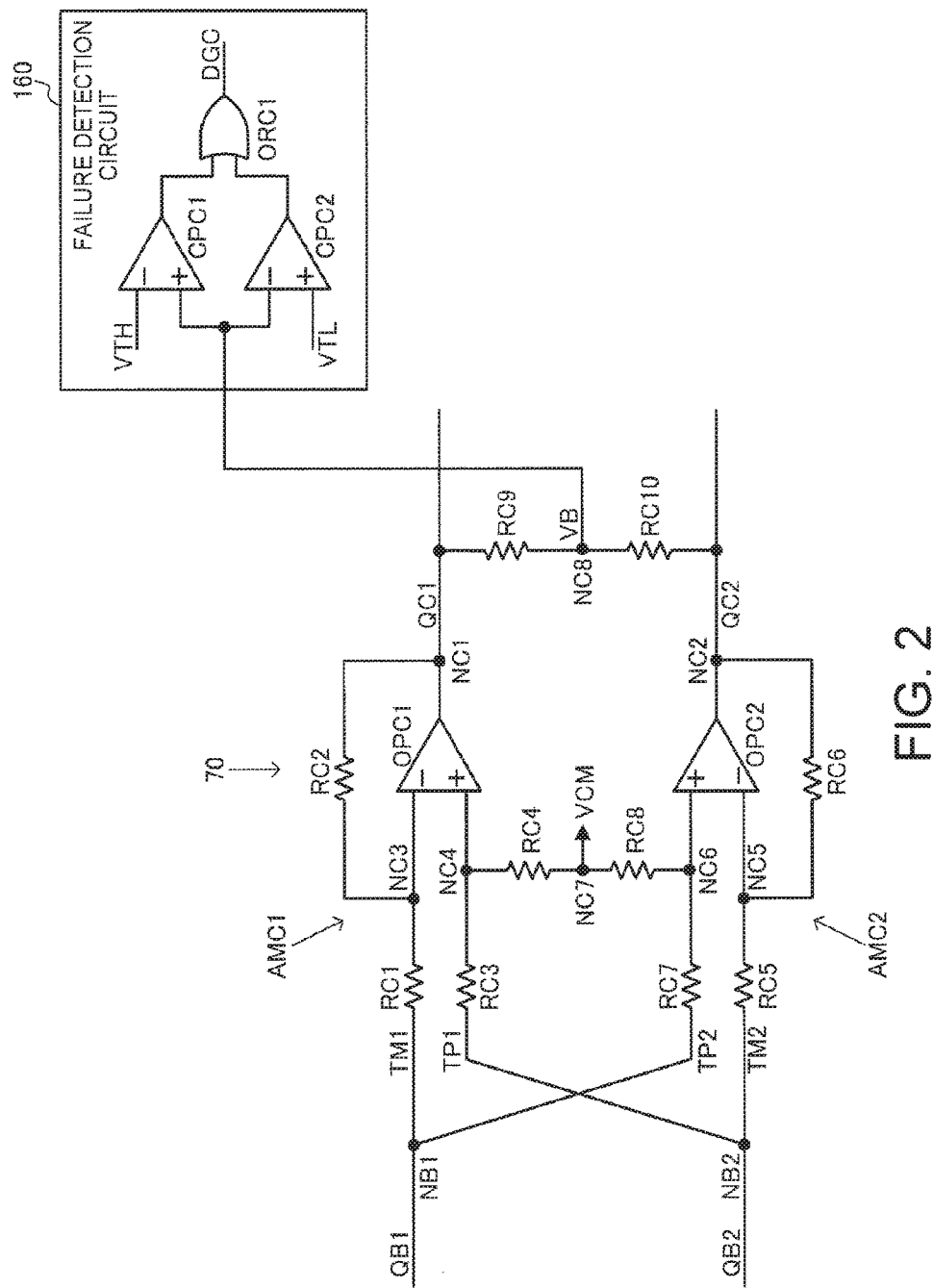
FIG. 2 is a detailed configuration example of the circuit device according to the first embodiment.

A detailed configuration example of the circuit device according to this embodiment is shown. In FIG. 2, the differential amplifier circuit 70 includes the amplifier AMC1 and the amplifier AMC2. The amplifier AMC1 includes a first operational amplifier OPC1 and first to fourth resistance elements RC1 to RC4.

The first resistance element RC1 is provided between the inversion input terminal TM1 (a node NB1) of the amplifier AMC1 and the inversion input terminal (a node NC3) of the first operational amplifier OPC1. The second resistance element RC2 is provided between the inversion input terminal of the first operational amplifier OPC1 and an output terminal of the first operational amplifier OPC1 (an output terminal of the amplifier AMC1; a node NC1). That is, the first and second resistance elements RC1 and RC2 are connected in series between the inversion input terminal TM1 of the amplifier AMC1 and the output terminal (NC1) of the first operational amplifier OPC1. The signal QB1 is input to an inversion input terminal TM1(−) of the amplifier AMC1 from a circuit at a pre-stage.

The third resistance element RC3 is provided between a non-inversion input terminal TP1 (a node NB2) of the amplifier AMC1 and a non-inversion input terminal (a node NC4) of the first operational amplifier OPC1. The fourth resistance element RC4 is provided between a non-inversion input terminal (NC4) of the first operational amplifier OPC1 and a node NC7 having an analog common voltage VCM. That is, the third and fourth resistance elements RC3 and RC4 are connected in series between the non-inversion input terminal TP1 of the amplifier AMC1 and the node NC7. The signal QB2 from the circuit at the pre-stage is input to the non-inversion input terminal TP1(+) of the amplifier AMC1.

Note that, in FIG. 2, the node NC7 is set to the analog common voltage VCM (the analog common voltage). The analog common voltage VCM is generated by an analog-common-voltage generation circuit explained below. For example, an output terminal of the analog-common-voltage generation circuit is connected to the node NC7, whereby the node NC7 is set to the analog common voltage VCM.

The amplifier AMC2 includes a second operational amplifier OPC2 and fifth to eighth resistance elements RC5 to RC8.

The fifth resistance element RC5 is provided between the inversion input terminal TM2 (the node NB2) of the amplifier AMC2 and an inversion input terminal (a node NC5) of the second operational amplifier OPC2. The sixth resistance element RC6 is provided between the inversion input terminal (NC5) of the second operational amplifier OPC2 and an output terminal of the second operational amplifier OPC2 (an output terminal of the amplifier AMC2; the node NC2). That is, the fifth and sixth resistance elements RC5 and RC6 are connected in series between the inversion input terminal TM2 of the amplifier AMC2 and the output terminal (NC2) of the second operational amplifier OPC2. The signal QB2 from the circuit at the pre-stage is input to the inversion input terminal TM2(−) of the amplifier AMC2.

The seventh resistance element RC7 is provided between the non-inversion input terminal TP2 (the node NB1) of the amplifier AMC2 and a non-inversion input terminal (a node NC6) of the second operational amplifier OPC2. The eighth resistance element RC8 is provided between the non-inversion input terminal (NC6) of the second operational amplifier OPC2 and the node NC7 having the analog common voltage VCM. That is, the seventh and eighth resistance elements RC7 and RC8 are connected in series between the non-inversion input terminal TP2 of the amplifier AMC2 and the node NC7. The signal QB1 from the circuit at the pre-stage is input to the non-inversion input terminal TP2 of the amplifier AMC2. Note that the resistance elements RC1 to RC8 can be realized by polysilicon resistors and the like.

In this way, the differential amplifier circuit 70 is configured by the two differential input-to-single-ended output amplifiers AMC1 and AMC2. That is, the differential amplifier circuit 70 is configured by the amplifier AMC1, to the inversion input terminal TM1(−) of which the signal QB1 of the signals QB1 and QB2 forming the differential signals is input and to the non-inversion input terminal TP1 (+) of which the signal QB2 is input, and the amplifier AMC2, to the non-inversion input terminal TP2(+) of which the signal QB1 is input and to the inversion input terminal TM2(−) of which the signal QB2 is input.

By adopting such a configuration, the differential signals QC1 and QC2, voltages of which change to the positive side or the negative side on the basis of the analog common voltage VCM (the analog ground), are output from the differential amplifier circuit 70. For example, when the signal QC1 has a positive voltage with respect to the analog common voltage VCM, the signal QC2 has a negative voltage with respect to the analog common voltage VCM. When the signal QC1 has a negative voltage with respect to the analog common voltage VCM, the signal QC2 has a positive voltage with respect to the analog common voltage VCM.

Resistance elements RC9 and RC10 are provided between the output node NC1 of the output signal QC1 of the amplifier AMC1 and the output node NC2 of the output signal QC2 of the amplifier AMC2. A voltage division circuit is configured by the resistance elements RC9 and RC10. A monitoring voltage VB obtained by dividing the voltage of the output signal QC1 of the amplifier AMC1 and the voltage of the output signal QC2 of the amplifier AMC2 is generated at a connection node NC8 of the resistance element RC9 and the resistance element RC10. For example, when resistance values of the resistance elements RC9 and RC10 are equal, the monitoring voltage VB is a midpoint voltage between the voltage of the signal QC1 and the voltage of the signal QC2. Therefore, when the voltage of the signal QC1 is represented as VQC1 and the voltage of the signal QC2 is represented as VQC2, the monitoring voltage can be represented as VB=(VQC1+VQC2)/2. The resistance values of the resistance elements RC9 and RC10 are optional.

The failure detection circuit 160 performs failure detection of the differential amplifier circuit 70 on the basis of the monitoring voltage VB. That is, the failure detection circuit 160 performs the failure detection by detecting whether the monitoring voltage VB obtained by the voltage division of the signals QC1 and QC2 is within a determination voltage range based on (centering on) the analog common voltage VCM. For example, the failure detection circuit 160 performs the failure detection by detecting whether the monitoring voltage VB is within a determination voltage range between a threshold voltage VTH on a high potential side and a threshold voltage VTL on a low potential side.

Specifically, the failure detection circuit 160 includes comparators CPC1 and CPC2 and an OR circuit ORC1. The threshold voltage VTH on the high potential side is input to an inversion input terminal of the comparator CPC1. The monitoring voltage VB, which is the divided voltage (the midpoint voltage) by the resistance elements RC9 and RC10, is input to a non-inversion input terminal of the comparator CPC1. The monitoring voltage VB is input to an inversion input terminal of the comparator CPC2. The threshold voltage VTL on the low potential side is input to a non-inversion input terminal of the comparator CPC2. Output signals of the comparators CPC1 and CPC2 are input to the OR circuit ORC1. The OR circuit ORC1 outputs a monitoring result signal DGC (a diagnosis signal or a failure detection signal).

For example, when the monitoring voltage VB is within the determination voltage range between the threshold voltage VTH and the threshold voltage VTL, the monitoring result signal DGC changes to an L level to inform that a failure is not detected. On the other hand, when the monitoring voltage VB is outside the determination voltage range, the monitoring result signal DGC changes to an H level to inform that a failure is detected.

In FIG. 2, for example, when a resistance value of the resistance elements RC1, RC3, RC5, and RC7 is represented as R1, a resistance value of the resistance elements RC2, RC4, RC6, and RC8 is represented as R2, and a gain of differential amplification of the differential amplifier circuit 70 is represented as GC, a relation of GC/2=R2/R1 holds.

A voltage at the node NC3 of the inversion input terminal of the operational amplifier OPC1 and a voltage at the node NC4 of the non-inversion input terminal are equalized by virtual grounding (virtual short) by the operational amplifier OPC1. Therefore, the following Expression (1) holds.

$$QB1+\{R1/(R1+R2)\}(QC1-QB1)=QB2+\{R1/(R1+R2)\}(VCM-QB2) \quad (1)$$

When A=R1/(R1+R2), the following Expression (2) is derived from the above Expression (1).

$$QC1=VCM-\{(1-A)/A\}\times(QB1-QB2) \quad (2)$$

A voltage at the node NC5 of the inversion input terminal of the operational amplifier OPC2 and a voltage at the node NC6 of the non-inversion input terminal are equalized by virtual grounding by the operational amplifier OPC2. Therefore, the following Expression (3) holds.

$$QB2+\{R1/(R1+R2)\}(QC2-QB2)=QB1+\{R1/(R1+R2)\}(VCM-QB1) \quad (3)$$

The following Expression (4) is derived from the above Expression (3).

$$QC2=VCM+\{(1-A)/A\}\times(QB1-QB2) \quad (4)$$

In the expression, since A=R1/(R1+R2), (1−A)/A=R2/R1=GC/2. Therefore, the above Expressions (2) and (4) can be represented like the following Expressions (5) and (6).

$$QC1=VCM-(GC/2)\times(QB1-QB2) \quad (5)$$

$$QC2=VCM+(GC/2)\times(QB1-QB2) \quad (6)$$

The following Expression (7) is derived from the above Expressions (5) and (6).

$$QC1-QC2=-GC\times(QB1-QB2) \quad (7)$$

In this way, when the differential signals QB1 and QB2 are input, the differential amplifier circuit 70 outputs signals of QC1=VCM−(GC/2)×(QB1−QB2) and QC2=VCM+(GC/2)×(QB1−QB2). That is, the differential amplifier circuit 70 outputs differential signals QC1 and QC2 obtained by multiplying a differential component (QB1−QB2) between the signals QB1 and QB2 with the gain GC and inverting a polarity on the basis of the analog common voltage VCM.

Figure 3A:
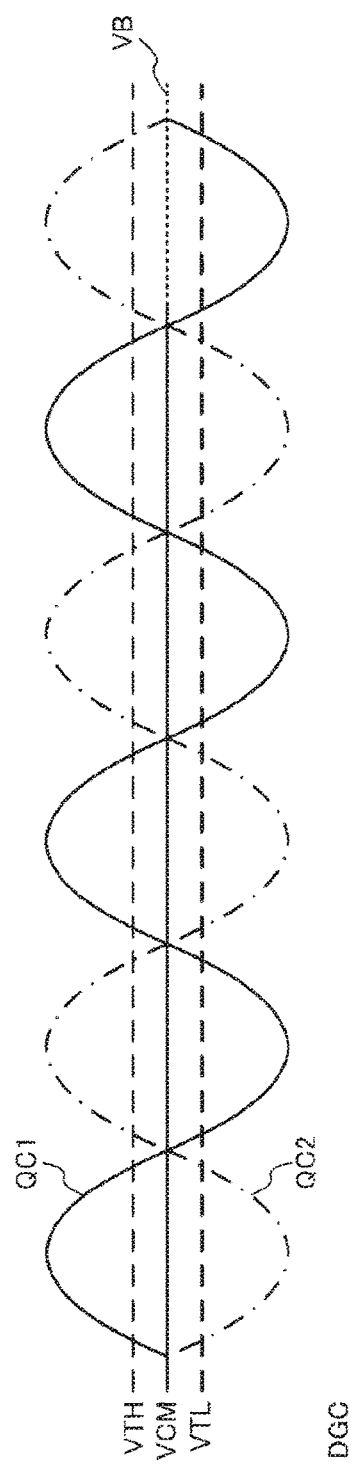
FIG. 3A is a signal waveform chart for explaining the operation of the circuit device according to the first embodiment.
Figure 3B:
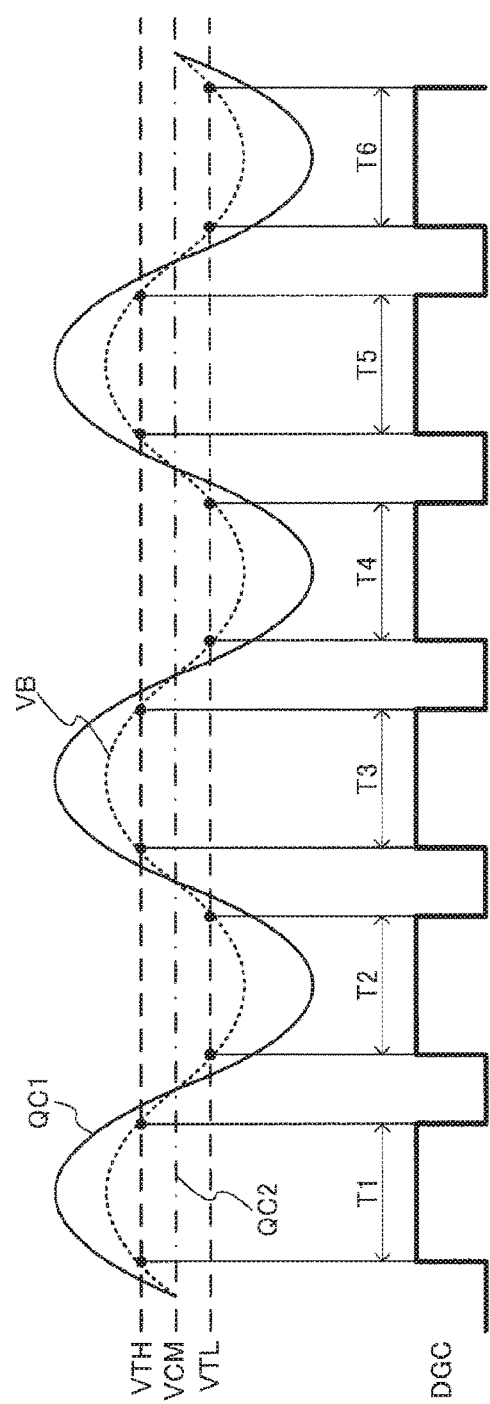
FIG. 3B is a signal waveform chart for explaining the operation of the circuit device according to the first embodiment.

FIGS. 3A and 3B are signal waveform charts for explaining the operation of the circuit device according to this embodiment. FIG. 3A shows signal waveforms at the time when a failure does not occur. FIG. 3B shows signal waveforms at the time when a failure occurs.

As explained above, the amplifiers AMC1 and AMC2 are the amplifiers that perform the single-ended output based on the same analog common voltage VCM. Therefore, as shown in FIG. 3A, the output signal QC1 of the amplifier AMC1 and the output signal QC2 of the amplifier AMC2 have symmetrical signal waveforms centering on (based on) the analog common voltage VCM. That is, when the signal QC1 has a positive voltage with respect to the analog common voltage VCM, the signal QC2 has a negative voltage with respect to the analog common voltage VCM. When the signal QC1 has a negative voltage with respect to the analog common voltage VCM, the signal QC2 has a positive voltage with respect to the analog common voltage VCM. That is, in the above Expressions (5) and (6), as represented as QC1=VCM−(GC/2)×(QB1−QB2) and QC2=VCM+(GC/2)×(QB1−QB2), voltage levels of the signals QC1 and QC2 change according to the signals QB1 and QB2. A relation of (QC1+QC2)/2=VCM holds.

Resistance values of the resistance elements RC9 and RC10 shown in FIG. 2 are equal. The monitoring voltage VB, which is the divided voltage by the resistance elements RC9 and RC10, is the midpoint voltage between the signals QC1 and QC2. Therefore, VB=(QC1+QC2)/2=VCM. The monitoring voltage VB coincides with the analog common voltage VCM.

The determination voltage range by the failure detection circuit 160 is a voltage range specified by the threshold voltages VTH and VTL as shown in FIG. 3A. For example, (VTH+VTL)/2=VCM holds. That is, the analog common voltage VCM is a midpoint voltage between the threshold voltages VTH and VTL.

When a failure does not occur, as shown in FIG. 3A, the monitoring voltage VB is within the determination voltage range specified by the threshold voltages VTH and VTL. As a result, the failure detection circuit 160 outputs the monitoring result signal DGC of the L level.

FIG. 3B shows signal waveforms at the time when, for example, a failure occurs in which the output signal QC2 of the amplifier AMC2 is short-circuited with the analog common voltage VCM. In this case, the signal QC1 and the signal QC2 do not have the symmetrical signal waveforms centering on the analog common voltage VCM. Therefore, a voltage level of the monitoring voltage VB fluctuates.

That is, the voltage level of the signal QC1 changes according to the signals QB1 and QB2 as represented as QC1=VCM−(GC/2)×(QB1−QB2). However, the signal QC2 is short-circuited with the analog common voltage VCM. The relation of QC2=VCM+(GC/2)×(QB1−QB2) does not hold. The signal QC2 is equal to VCM. Therefore, VB=(QC1+QC2)/2=VCM holds in FIG. 3A but does not hold in FIG. 3B. That is, the voltage level of the monitoring voltage VB fluctuates as represented as VB=(QC1+QC2)/2=(QC1+VCM)/2=VCM−(GC/4)×(QB1−QB2).

In a period T1 in FIG. 3B, the monitoring voltage VB exceeds the threshold voltage VTH and changes to a voltage outside the determination voltage range. Therefore, the monitoring result signal DGC changes to the H level. In a period T2, the monitoring voltage VB falls below the threshold voltage VTL and changes to a voltage outside the determination voltage range. Therefore, the monitoring result signal DGC changes to the H level. The same applies to periods T3, T4, T5, and T6. It is possible to detect a failure from determination results in these periods.

Specifically, for example, when a time period in which the monitoring voltage VB is outside the determination range is equal to or longer than a specified time, it is determined that a failure (abnormality) has occurred. For example, the monitoring result signal DGC, which is a monitoring result, may be cyclically monitored. When the number of times the monitoring result signal DGC changes to the H level is equal to or larger than a specified number of times, it may be determined that a failure has occurred. Alternatively, when a duty ratio (a ratio of a period of the H level) of the monitoring result signal DGC is equal to or higher than a specified duty ratio, it may be determined that a failure has occurred.

As explained above, in this embodiment, the failure detection is performed by detecting whether the monitoring voltage VB based on the voltage of the output signal QC1 of the amplifier AMC1 and the voltage of the output signal QC2 of the amplifier AMC2 is within the determination voltage range based on the analog common voltage VCM. That is, the failure detection is performed on the basis of the monitoring voltage VB obtained by dividing the voltage of the output signal QC1 of the amplifier AMC1 and the voltage of the output signal QC2 of the amplifier AMC2. Consequently, it is possible to properly realize, with a simple circuit configuration, individual failure detection of the differential amplifier circuit 70.

FIG. 4 is an overall system configuration example of the circuit device according to this embodiment. The circuit device shown in FIG. 4 includes a driving circuit 30, a detection circuit 60, a control unit 140, a register unit 142, and the failure detection circuit 160.

The driving circuit 30 drives a physical quantity transducer 18. For example, the driving circuit 30 receives a feedback signal DI from the physical quantity transducer 18 and outputs a driving signal DQ corresponding to the feedback signal DI to drive the physical quantity transducer 18. For example, first and second detection signals IQ1 and IQ2 from the physical quantity transducer 18 are input to the detection circuit 60 of the circuit device via terminals PD1 and PD2 (pads). The feedback signal DI from the physical quantity transducer 18 is input to the driving circuit 30 of the circuit device via a terminal PD3 (a pad). The driving circuit 30 outputs the driving signal DQ to the physical quantity transducer 18 via a terminal PD4 (a pad).

The detection circuit 60 includes an amplifier circuit 61, an A/D conversion circuit 100, and a DSP unit 110 (a digital-signal processing unit). The amplifier circuit 61 includes the differential amplifier circuit 70 explained with reference to FIGS. 1 and 2. In this way, the circuit device according to this embodiment includes the driving circuit 30 that drives the physical quantity transducer 18 and the detection circuit 60 to which the first and second detection signals IQ1 and IQ2 from the physical quantity transducer 18 are input. The detection circuit 60 is configured by the first and second amplifiers AMC1 and AMC2 as shown in FIGS. 1 and 2. The detection circuit 60 includes the differential amplifier circuit 70 to which the first and second signals QB1 and QB2 corresponding to the first and second detection signals IQ1 and IQ2 are input. Details of the amplifier circuit 61, the A/D conversion circuit 100, and the DSP unit 110 are explained below.

Note that the detection circuit 60 is not limited to the configuration shown in FIG. 4. Various modified implementations such as omission of a part of the components thereof and addition of other components are possible. For example, the detection circuit 60 may be the detection circuit 60 of a type that does not include the A/D conversion circuit 100 and the DSP unit 110 and outputs an analog detection result.

The control unit 140 performs various kinds of control processing. For example, the control unit 140 performs control processing of the driving circuit 30 and control processing of the detection circuit 60. The control unit 140 receives the monitoring result signal DGC from the failure detection circuit 160 and performs failure determination processing. That is, the control unit 140 performs the various kinds of failure determination processing explained with reference to FIGS. 3A and 3B. The control unit 140 can be realized by, for example, a logic circuit generated by an automatic arrangement and wiring method such as a gate array or a processor that operates on the basis of firmware or the like.

The register unit 142 includes a register in which various kinds of information are set. The register unit 142 can be realized by, for example, a memory such as an SRAM or a flip-flop circuit. For example, failure determination result information in the control unit 140 is stored in the register unit 142. An external controller or the like can read out the failure determination result information by accessing the register unit 142.

Figure 5:
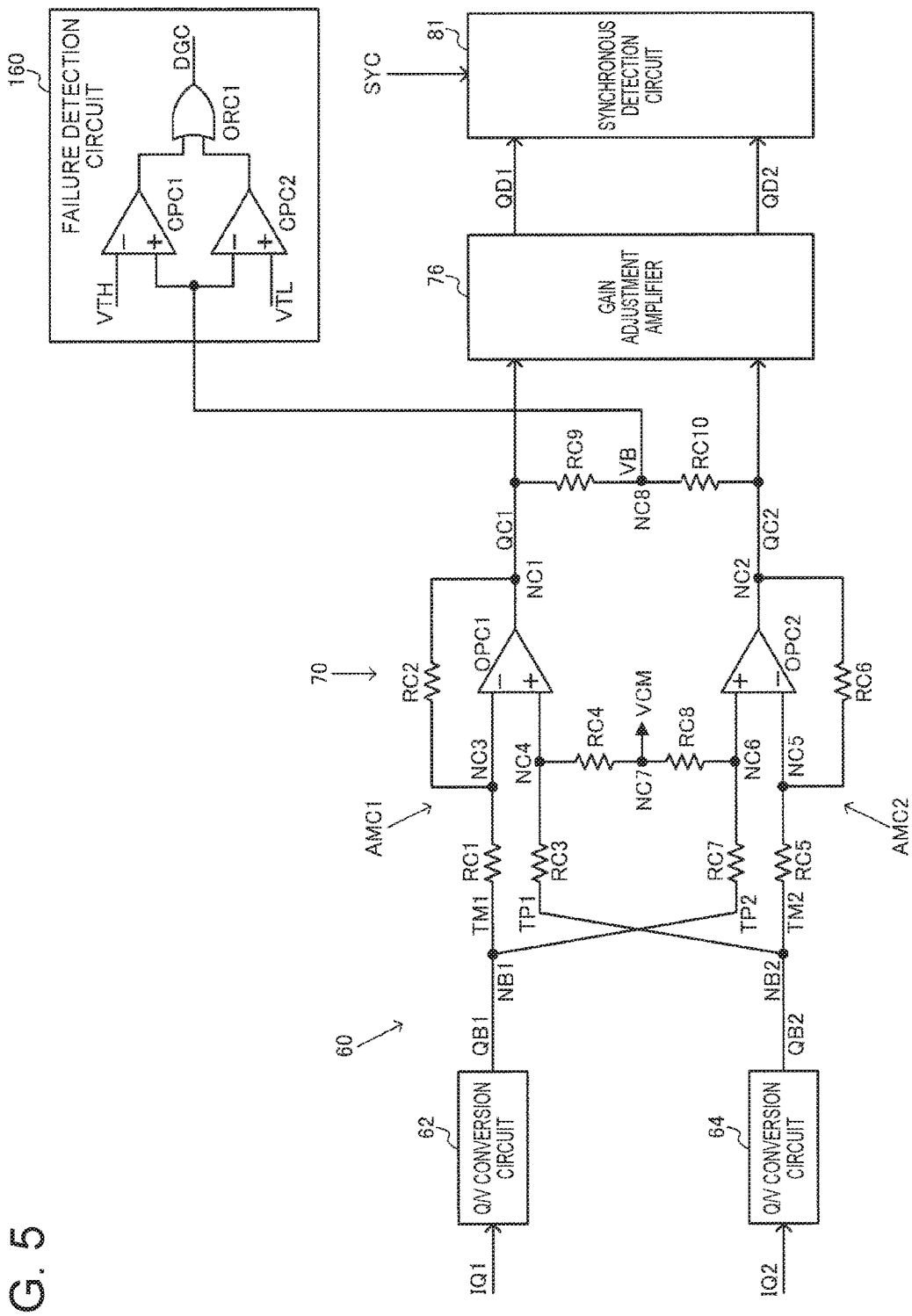
FIG. 5 is a configuration example of a detection circuit in the first embodiment.

A configuration example of the detection circuit 60 is shown in FIG. 5. Note that the detection circuit 60 is not limited to a configuration shown in FIG. 5. Various modified implementations such as omission of a part of the components thereof and addition of other components are possible.

The detection circuit 60 includes Q/V conversion circuits 62 and 64 (first and second charge/voltage conversion circuits). The Q/V conversion circuit 62 is provided on a pre-stage side of the differential amplifier circuit 70. The first detection signal IQ1 is input to the Q/V conversion circuit 62. The Q/V conversion circuit 62 outputs the first signal QB1. The Q/V conversion circuit 64 is provided on the pre-stage side of the differential amplifier circuit 70. The second detection signal IQ2 is input to the Q/V conversion circuit 64. The Q/V conversion circuit 64 outputs the second signal QB2. The first signal QB1 is input to the inversion input terminal TM1 of the amplifier AMC1 and the non-inversion input terminal TP2 of the amplifier AMC2 of the differential amplifier circuit 70. The second signal QB2 is input to the non-inversion input terminal TP1 of the amplifier AMC1 and the inversion input terminal TM2 of the amplifier AMC2 of the differential amplifier circuit 70.

The Q/V conversion circuits 62 and 64 (charge amplifiers) are circuits that convert a charge signal (a micro charge signal or a micro current signal) from the physical quantity transducer 18 into a voltage signal. The Q/V conversion circuits 62 and 64 can also be considered a type of an I/V conversion circuit. For example, the Q/V conversion circuit 62 converts the first detection signal IQ1, which is a micro charge signal, into the first signal QB1, which is a voltage signal. The Q/V conversion circuit 64 converts the second detection signal IQ2, which is a micro charge signal, into the second signal QB2, which is a voltage signal. The first and second signals QB1 and QB2 after the conversion are also differential signals of opposite phases each other. The Q/V conversion circuits 62 and 64 include, for example, operational amplifiers and feedback capacitors. The Q/V conversion circuits 62 and 64 may include feedback resistance elements.

The detection circuit 60 includes a gain adjustment amplifier 76 provided on a post stage side of the differential amplifier circuit 70. The gain adjustment amplifier 76 adjusts gains of the output signals QC1 and QC2 of the differential amplifier circuit 70. Specifically, the differential signals QC1 and QC2 are input to the gain adjustment amplifier 76. The gain adjustment amplifier 76 amplifies the signals with an adjustable gain and outputs differential signals QD1 and QD2.

The detection circuit 60 includes a synchronous detection circuit 81 provided on the post stage side of the gain adjustment amplifier 76. The synchronous detection circuit 81 performs synchronous detection on the basis of a synchronization signal SYC from the driving circuit 30. The synchronous detection circuit 81 performs the synchronous detection based on the synchronization signal SYC on the output signals QD1 and QD2 from the gain adjustment amplifier 76 and performs, while removing an unnecessary signal, synchronous detection for extracting a desired signal.

As explained above, with the circuit device according to this embodiment, a differential input/differential output amplifier circuit is realized by configuring the differential amplifier circuit 70 with the two differential input-to-single-ended output amplifiers AMC1 and AMC2. Individual failure detection of the differential amplifier circuit 70 is realized by monitoring the output signals QC1 and QC2 of the amplifiers AMC1 and AMC2.

For example, as a method in a comparative example of this embodiment, a method of configuring the differential amplifier circuit 70 with one differential input/differential output fully differential amplifier is conceivable.

However, the fully differential amplifier only amplifies a differential component between first and second input signals. A shift of a midpoint voltage level of differential first and second output signals is allowed. That is, a situation in which the differential component between the first and second output signals is properly amplified but the midpoint voltage level of the first and second output signals fluctuates is allowed in general. Therefore, for example, a situation is likely to be overlooked in which some kind of failure occurs in the differential amplifier circuit and the differential component is seen as being properly amplified but a voltage level of the first and second output signals is an abnormal voltage level. For example, only with a method of performing failure detection of the entire detection circuit 60, such a situation is overlooked and, for example, reliability is deteriorated.

In this regard, in this embodiment, the differential amplifier circuit 70 is configured by the two differential input-to-single-ended output amplifiers AMC1 and AMC2. The failure detection is performed on the basis of the output signals QC1 and QC2 of the amplifiers AMC1 and AMC2. Therefore, concerning a circuit size, a configuration is slightly redundant. However, a failure can be detected by individual failure diagnosis of the differential amplifier circuit 70 even in the situation explained above.

For example, as explained with reference to FIG. 3A, in this embodiment, the amplifiers AMC1 and AMC2 are the amplifiers that perform the single-ended output based on the same analog common voltage VCM. Therefore, in a normal state, the signals QC1 and QC2 having the symmetrical signal waveforms having the positive and negative voltages on the basis of the analog common voltage VCM are output. That is, not only the differential component between the signals QB1 and QB2 is amplified but the voltage level of the signals QC1 and QC2 is maintained at a voltage level based on the analog common voltage VCM.

As explained with reference to FIG. 3B, when a failure occurs in the differential amplifier circuit 70, the symmetry of the signal waveforms of the signals QC1 and QC2 collapses. Therefore, it is possible to detect the failure by monitoring the signals QC1 and QC2. The determination voltage range for the failure detection also only has to be set in a voltage range based on the analog common voltage VCM. Therefore, the operation of the failure detection can also be simplified. Therefore, compared with the method in the comparative example in which the differential amplifier circuit 70 is configured by one fully differential amplifier, it is possible to greatly improve reliability and the like.

In the detection circuit 60 shown in FIG. 5, in the method of simply performing failure detection of the entire detection circuit 60, when the differential amplifier circuit 70 individually fails, the failure is likely to be overlooked.

In this regard, in this embodiment, states of the output signals QC1 and QC2 of the differential amplifier circuit 70 configured by the two differential input-to-single-ended output amplifiers AMC1 and AMC2 are monitored by the failure detection circuit 160 and the failure detection is performed. Therefore, it is possible to perform individual failure detection of the differential amplifier circuit 70. Therefore, for example, when a failure occurs in the differential amplifier circuit 70 over time, it is possible to appropriately take measures against the failure. It is possible to greatly improve reliability for a failure that occurs over time.

2. Detailed Configurations of an Electronic Apparatus, a Gyro Sensor, and a Circuit Device A detailed configuration example of a circuit device 20, a gyro sensor 510 (in a broad sense, a physical-quantity detecting apparatus) including the circuit device 20, and an electronic apparatus 500 including the gyro sensor 510 according to the first embodiment is shown in FIG. 6.

Figure 6:
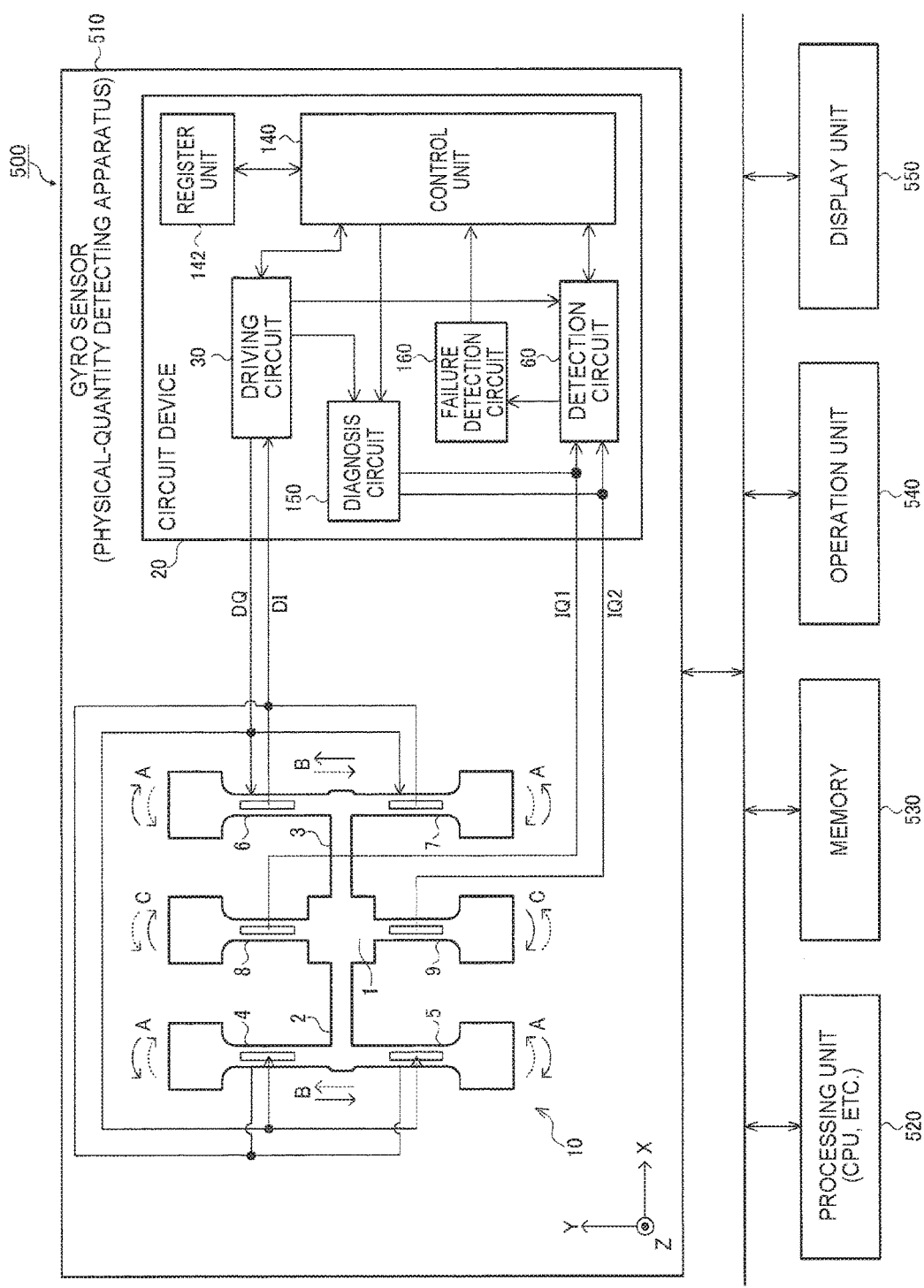
FIG. 6 is a configuration example of a circuit device, an electronic apparatus, and a gyro sensor (a physical-quantity detecting apparatus) according to the first embodiment.

Note that the circuit device 20, the electronic apparatus 500, and the gyro sensor 510 are not limited to configurations shown in FIG. 6. Various modified implementations such as omission of a part of components thereof and addition of other components are possible. As the electronic apparatus 500 according to this embodiment, various apparatuses such as a digital camera, a video camera, a smart phone, a cellular phone, a car navigation system, a robot, a biological-information detecting apparatus, a game machine, a clock, a health instrument, and a portable information terminal can be assumed. In the following explanation, an example is explained in which a physical quantity transducer is a piezoelectric vibrator element (a vibration gyro) and a sensor is a gyro sensor. However, the invention is not limited to this. The invention is also applicable to, for example, a vibration gyro of a capacitance detection system formed of a silicon substrate or the like and a physical quantity transducer that detects a physical quantity equivalent to angular velocity information and physical quantities other than the angular velocity information.

The electronic apparatus 500 includes the gyro sensor 510 and a processing unit 520. The electronic apparatus 500 can include a memory 530, an operation unit 540, and a display unit 550. The processing unit 520 (a controller) realized by a CPU, an MPU, or the like performs control of the gyro sensor 510 and the like and overall control of the electronic apparatus 500. The processing unit 520 performs processing on the basis of angular velocity information (in abroad sense, a physical quantity) detected by the gyro sensor 510. The processing unit 520 performs processing for camera shake correction, posture control, GPS autonomous navigation, and the like on the basis of, for example, the angular velocity information. The memory 530 (a ROM, a RAM, etc.) stores a control program and various data and functions as a work area and a data storage area. The operation unit 540 is used by a user to operate the electronic apparatus 500. The display unit 550 displays various kinds of information to the user.

The gyro sensor 510 (the physical-quantity detecting apparatus) includes a vibrator element 10 and the circuit device 20. The vibrator element 10 (in a broad sense, a physical quantity transducer) is a piezoelectric vibrator element formed of a thin plate of a piezoelectric material such as quartz crystal. Specifically, the vibrator element 10 is a vibrator element of a double T type formed of a Z-cut quartz substrate.

The circuit device 20 includes the driving circuit 30, the detection circuit 60, the control unit 140, the register unit 142, a diagnosis circuit 150, and the failure detection circuit 160. Note that various modified implementations such as omission of apart of these components and addition of other components are possible.

The driving circuit 30 outputs the driving signal DQ and drives the vibrator element 10. For example, the driving circuit 30 receives the feedback signal DI from the vibrator element 10 and outputs the driving signal DQ corresponding to the feedback signal DI to excite the vibrator element 10. The detection circuit 60 receives the detection signals IQ1 and IQ2 (detection currents or charges) from the vibrator element 10 driven by the driving signal DQ and detects (extracts), from the detection signals IQ1 and IQ2, a desired signal (a Coriolis force signal) corresponding to a physical quantity applied to the vibrator element 10.

The diagnosis circuit 150 is a circuit for diagnosing (self-diagnosing) the detection circuit 60 (the circuit device) in a diagnosis mode (a diagnosis period). For example, the diagnosis circuit 150 performs an operation for generating a pseudo-desired signal (a pseudo angular velocity signal, etc.) for diagnosing the detection circuit 60 and supplying the pseudo-desired signal to the detection circuit 60. Diagnosis for determining whether the detection circuit 60 and the like are normally operating is performed on the basis of a detection result of the pseudo-desired signal. Note that details of the diagnosis circuit 150 are explained below.

The vibrator element 10 includes a base 1, coupling arms 2 and 3, driving arms 4, 5, 6, and 7, and detection arms 8 and 9. The detection arms 8 and 9 extend in a +Y-axis direction and a −Y-axis direction with respect to the base 1 having a rectangular shape. The coupling arms 2 and 3 extend in a −X-axis direction and a +X-axis direction with respect to the base 1. The driving arms 4 and 5 extend in the +Y-axis direction and the −Y-axis direction with respect to the coupling arm 2. The driving arms 6 and 7 extend in the +Y-axis direction and the −Y-axis direction with respect to the coupling arm 3. Note that the X axis, the Y axis, and the Z axis indicate the axes of quartz crystal. The X axis, the Y axis, and the Z axis are also respectively called electric axis, mechanical axis, and optical axis.

The driving signal DQ from the driving circuit 30 is input to drive electrodes provided on the upper surfaces of the driving arms 4 and 5 and drive electrodes provided on side surfaces of the driving arms 6 and 7. Signals from drive electrodes provided on side surfaces of the driving arms 4 and 5 and drive electrodes provided on the upper surfaces of the driving arms 6 and 7 are input to the driving circuit 30 as the feedback signal DI. Signals from detection electrodes provided on the upper surfaces of the detection arms 8 and 9 are input to the detection circuit 60 as the detection signals IQ1 and IQ2. Note that common electrodes provided on side surfaces of the detection arms 8 and 9 are, for example, grounded.

When the driving signal DQ of an alternating current is applied by the driving circuit 30, the driving arms 4, 5, 6, and 7 perform flexural vibration (excitation vibration) as indicated by an arrow A according to an inverse piezoelectric effect. That is, the driving arms 4, 5, 6, and 7 perform flexural vibration in which the distal ends of the driving arms 4 and 6 repeat approach and separation each other and the distal ends of the driving arms 5 and 7 also repeat approach and separation each other. At this point, the driving arms 4 and 5 and the driving arms 6 and 7 are performing symmetrical vibration with respect to the Y axis that passes the center of gravity position of the base 1. Therefore, the base 1, the coupling arms 2 and 3, and the detection arms 8 and 9 hardly vibrate.

In this state, when angular velocity about the Z axis serving as a rotation axis is applied to the vibrator element 10 (when the vibrator element 10 rotates about the Z axis), the driving arms 4, 5, 6, and 7 vibrate as indicated by an arrow B with the Coriolis force. That is, the Coriolis force in a direction of the arrow B orthogonal to a direction of the arrow A and a direction of the Z axis acts on the driving arms 4, 5, 6, and 7, whereby a vibration component in the direction of the arrow B is generated. The vibration in the arrow B direction is transmitted to the base 1 via the coupling arms 2 and 3. The detection arms 8 and 9 perform flexural vibration in a direction of an arrow C. Charge signals generated by a piezoelectric effect by the flexural vibration of the detection arms 8 and 9 are input to the detection circuit 60 as the detection signals IQ1 and IQ2. The vibration in the arrow B direction of the driving arms 4, 5, 6, and 7 is vibration in a circumferential direction with respect to the center of gravity position of the base 1. The vibration of the detection arms 8 and 9 is vibration in the direction of the arrow C in a direction opposite to the arrow B direction in the circumferential direction. Therefore, the detection signals IQ1 and IQ2 are signals having a phase 90 degrees shifted from the phase of the driving signal DQ.

For example, when the angular velocity of the vibrator element 10 (the gyro sensor) around the Z axis is represented as ω, the mass of the vibrator element 10 is represented as m, and the vibration speed of the vibrator element 10 is represented as v, the Coriolis force is represented as Fc=2 m·v·ω. Therefore, the detection circuit 60 can calculate the angular velocity ω by detecting a desired signal, which is a signal corresponding to the Coriolis force. The processing unit 520 can perform various kinds of processing for camera shake correction, posture correction, GPS autonomous navigation, and the like by using the calculated angular velocity ω.

Note that, in the example shown in FIG. 6, the vibrator element 10 is the double T type. However, the vibrator element 10 in this embodiment is not limited to such a structure. The vibrator element 10 may be, for example, a tuning fork type, an H type, or the like. The piezoelectric material of the vibrator element 10 may be a material such as ceramics or silicon other than quartz crystal.

Figure 7:
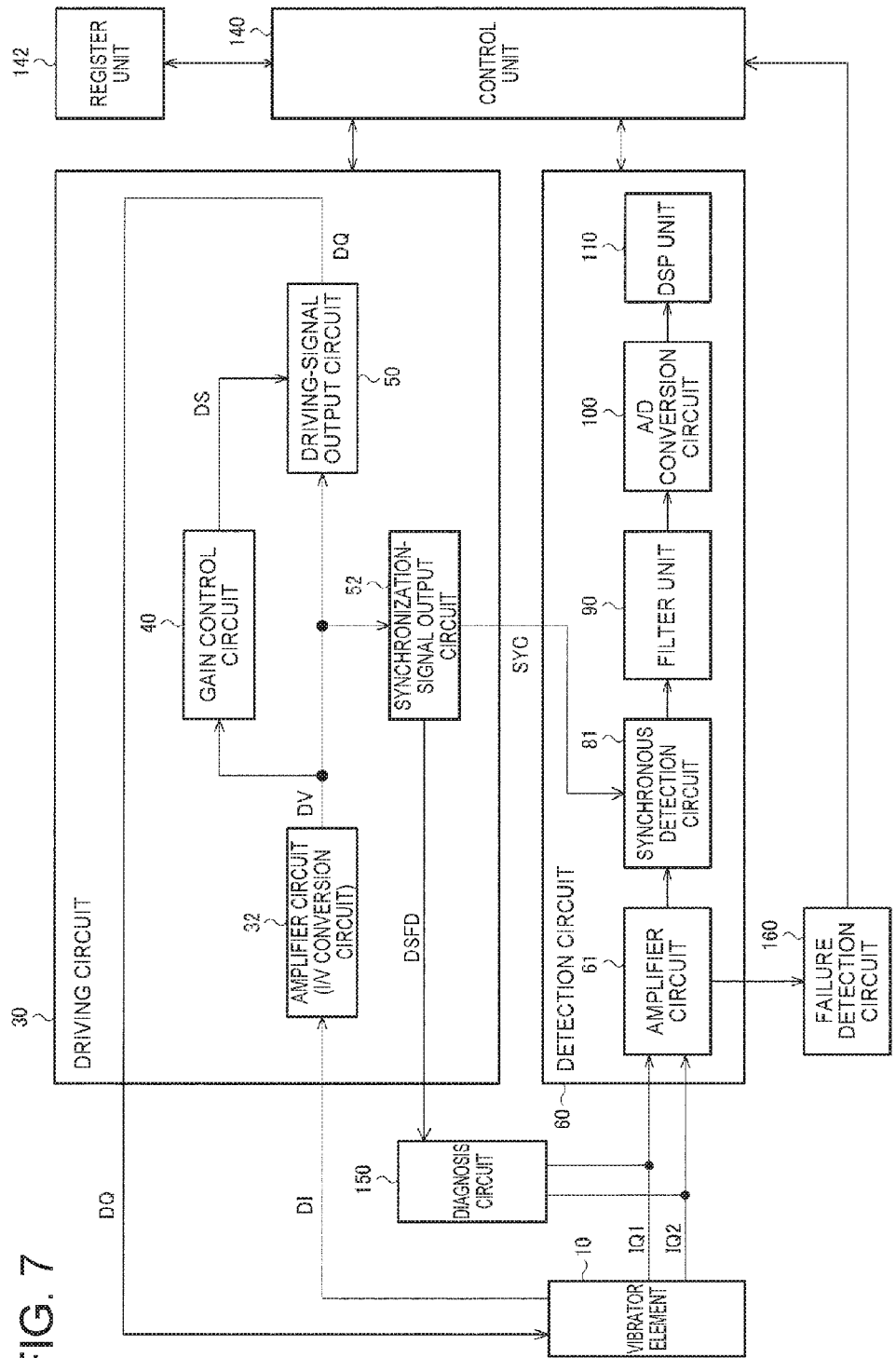
FIG. 7 is a detailed configuration example of a driving circuit and the detection circuit in the first embodiment.

A detailed configuration example of the driving circuit 30 and the detection circuit 60 of the circuit device is shown in FIG. 7.

The driving circuit 30 includes an amplifier circuit 32 to which the feedback signal DI from the vibrator element 10 is input, a gain control circuit 40 that performs automatic gain control, and a driving-signal output circuit 50 that outputs the driving signal DQ to the vibrator element 10. The driving circuit 30 includes a synchronization-signal output circuit 52 that outputs the synchronization signal SYC to the detection circuit 60. Note that the configuration of the driving circuit 30 is not limited to FIG. 7. Various modified implementations such as omission of a part of these components and addition of other components are possible.

The amplifier circuit 32 (an I/V conversion circuit) amplifies the feedback signal DI from the vibrator element 10. For example, the amplifier circuit 32 converts a signal DI of an electric current from the vibrator element 10 into a signal DV of a voltage and outputs the signal DV. The amplifier circuit 32 can be realized by an operational amplifier, a feedback resistance element, a feedback capacitor, and the like.

The driving-signal output circuit 50 outputs the driving signal DQ on the basis of the signal DV after the amplification by the amplifier circuit 32. For example, when the driving-signal output circuit 50 outputs a driving signal of a rectangular wave (or a sine wave), the driving-signal output circuit 50 can be realized by a comparator and the like.

The gain control circuit 40 (AGC) outputs a control voltage DS to the driving-signal output circuit 50 and controls the amplitude of the driving signal DQ. Specifically, the gain control circuit 40 monitors the signal DV and controls a gain of an oscillation loop. For example, in the driving circuit 30, the amplitude of the driving signal supplied to the vibrator element 10 (a vibrator element for driving) needs to be kept fixed in order to keep the sensitivity of the gyro sensor 510 fixed. Therefore, the gain control circuit 40 for automatically adjusting a gain is provided in an oscillation loop of a drive vibration system. The gain control circuit 40 variably automatically adjusts the gain such that the amplitude of the feedback signal DI from the vibrator element 10 (vibration speed v of the vibrator element) is fixed. The gain control circuit 40 can be realized by a full-wave rectifier that full-wave rectifies the output signal DV of the amplifier circuit 32, an integrator that performs integration processing of an output signal of the full-wave rectifier, and the like.

The synchronization-signal output circuit 52 receives the signal DV after the amplification by the amplifier circuit 32 and outputs the synchronization signal SYC (a reference signal) to the detection circuit 60. The synchronization-signal output circuit 52 can be realized by a comparator that performs binarization processing of the signal DV of a sine wave (an alternating current) and generates the synchronization signal SYC of a rectangular wave, a phase adjustment circuit (a phase shifter) that performs phase adjustment of the synchronization signal SYC, and the like.

The synchronization-signal output circuit 52 outputs a signal DSFD to the diagnosis circuit 150. The signal DSFD is a signal having a phase same as the phase of the synchronization signal SYC and is generated by, for example, a comparator that performs binarization processing of the signal DV of the sine wave. Note that the synchronization signal SYC itself may be output to the diagnosis circuit 150 as the signal DSFD.

The detection circuit 60 includes the amplifier circuit 61, the synchronous detection circuit 81, a filter unit 90, the A/D conversion circuit 100, and the DSP unit 110. The amplifier circuit 61 receives the first and second detection signals IQ1 and IQ2 from the vibrator element 10 and performs charge-voltage conversion, differential signal amplification, gain adjustment, and the like. The synchronous detection circuit 81 performs synchronous detection on the basis of the synchronization signal SYC from the driving circuit 30. The filter unit 90 (a low-pass filter) functions as a pre-filter of the A/D conversion circuit 100. The filter unit 90 also functions as a circuit that attenuates an unnecessary signal that cannot be fully removed by the synchronous detection. The A/D conversion circuit 100 performs A/D conversion of a signal after the synchronous detection. The DSP unit 110 performs digital signal processing such as digital filter processing and digital correction processing on a digital signal from the A/D conversion circuit 100.

Note that, for example, the detection signals IQ1 and IQ2, which are charge signals (current signals), from the vibrator element 10 have a phase 90 degrees behind the phase of the driving signal DQ, which is a voltage signal. The phase delays 90 degrees in a Q/V conversion circuit and the like of the amplifier circuit 61. Therefore, an output signal of the amplifier circuit 61 has a phase 180 degrees behind the phase of the driving signal DQ. Therefore, for example, by performing the synchronous detection using the synchronization signal SYC in phase with the driving signal DQ (DV), it is possible to remove an unnecessary signal or the like having a phase 90 degrees behind the phase of the driving signal DQ.

The control unit 140 performs control processing of the circuit device 20. The control unit 140 can be realized by a logic circuit (a gate array, etc.), a processor, and the like. Various kinds of switch control, mode setting, and the like in the circuit device 20 are performed by the control unit 140.

Note that, in FIG. 7, a configuration example of a circuit device of a digital gyro that outputs detected angular velocity as digital data is shown. However, this embodiment is not limited to this and may be a configuration of a circuit device of an analog gyro that outputs detected angular velocity as an analog voltage (a DC voltage).

3. Detailed Circuit Configuration Example of the Detection Circuit

Figure 8:
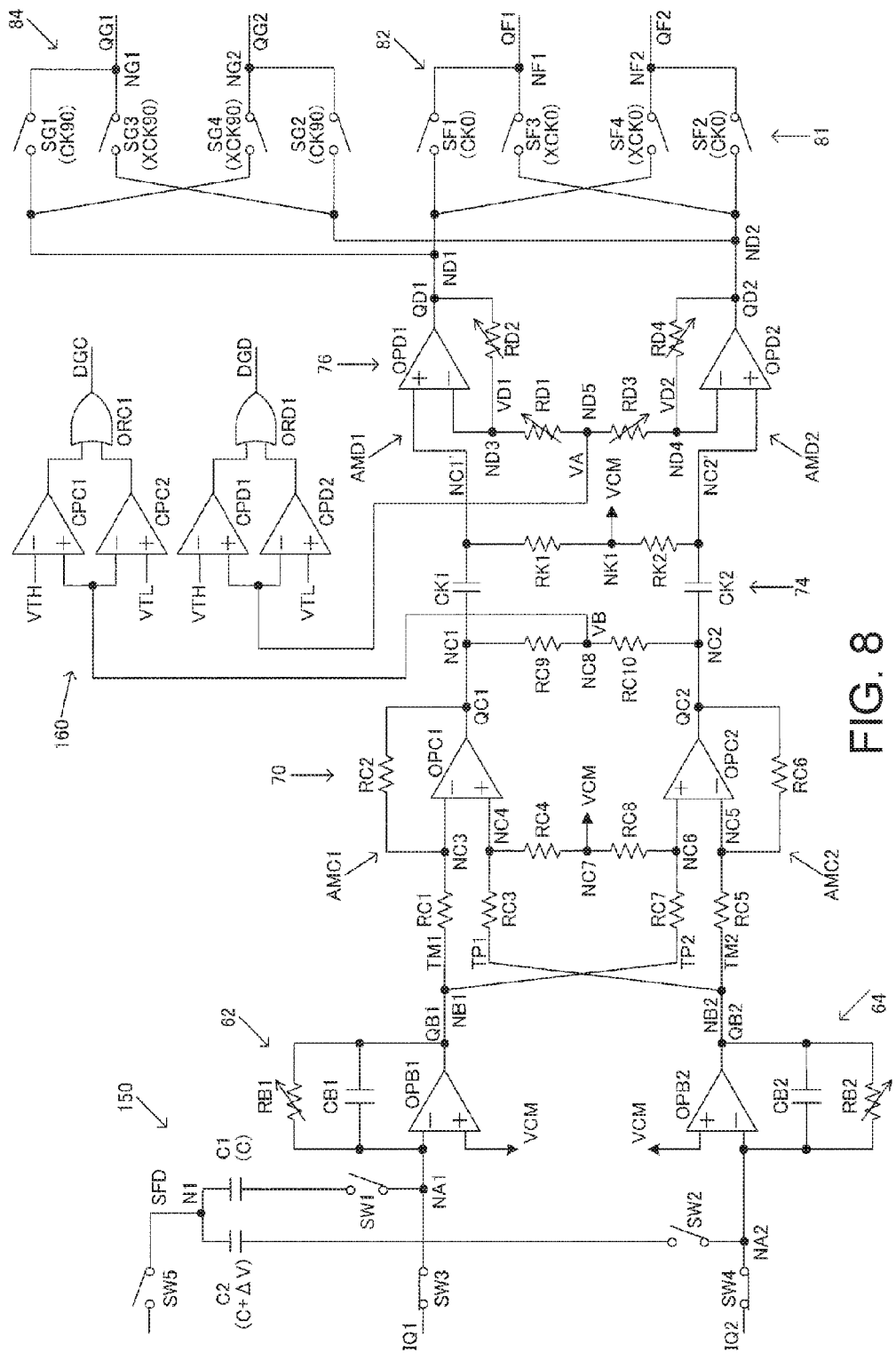
FIG. 8 is a more detailed configuration example of the detection circuit in the first embodiment.

A more detailed configuration example of the detection circuit 60 is shown in FIG. 8. Note that the detection circuit 60 is not limited to a configuration shown in FIG. 8. Various modified implementations such as omission of a part of these components and addition of other components are possible.

The diagnosis circuit 150 includes first and second capacitors C1 and C2. The first capacitor C1 is provided between an input node NA1 of the Q/V conversion circuit 62, to which the detection signal IQ1 is input, and a first node N1. The second capacitor C2 is provided between an input node NA2 of the Q/V conversion circuit 64, to which the detection signal IQ2 is input, and the first node N1. The input nodes NA1 and NA2 are nodes on one end sides of the first and second capacitors C1 and C2. The first node N1 is a node on the other end sides of the first and second capacitors C1 and C2.

A capacity value of the second capacitor C2 is different from a capacity value of the first capacitor C1. For example, when the capacity value of the first capacitor C1 is represented as C, the capacity value of the second capacitor C2 is C+ΔC. ΔC may be a positive capacity value or may be a negative capacity value. A ratio of ΔC (the absolute value of ΔC) to the capacity value C can be set to, for example, approximately 5% to 30%.

During the diagnosis mode (the diagnosis period), a diagnosis signal SFD is input to the first node N1. For example, after power-on and before a normal operation period, the diagnosis signal SFD is supplied to the first node N1. Diagnosis processing (self-diagnosis) of the detection circuit 60 (the circuit device) is executed. For example, the diagnosis signal SFD is not a signal supplied from the outside of the circuit device and is a signal generated on the inside of the circuit device. For example, as shown in FIG. 7, the diagnosis signal SFD is a signal generated on the basis of the signal DSFD from the driving circuit 30. Specifically, the diagnosis signal SFD is a signal having a phase same as (substantially the same as) the phase of the synchronization signal SYC (the reference signal) output by the driving circuit 30.

In this way, the diagnosis signal SFD is input to the first node N1 in the diagnosis mode. Consequently, the Q/V conversion circuit 62 outputs the signal QB1 having first voltage amplitude corresponding to a first capacity ratio of the first capacitor C1 and the feedback capacitor of the Q/V conversion circuit 62. The Q/V conversion circuit 64 outputs the signal QB2 having second voltage amplitude corresponding to a second capacity ratio of the second capacitor C2 and the feedback capacitor of the Q/V conversion circuit 64. Since the capacity values of the first and second capacitors C1 and C2 are different, the first and second capacity ratios are also different capacity ratios. Therefore, the first voltage amplitude of the signal QB1 output by the Q/V conversion circuit 62 and the second voltage amplitude of the signal QB2 output by the Q/V conversion circuit 64 are also different voltages. Therefore, a voltage difference between the first and second voltage amplitudes is differentially amplified by the differential amplifier circuit 70 or the like at a post stage. Consequently, in the diagnosis mode, it is possible to supply a desired signal for diagnosis, which is a pseudo-desired signal, to the detection circuit 60. It is possible to diagnose on the basis of a detection result of the detection circuit 60 for the desired signal for diagnosis whether the detection circuit 60 is normally operating.

The diagnosis circuit 150 includes first, second, third, and fourth switch elements SW1, SW2, SW3, and SW4. The diagnosis circuit 150 includes a fifth switch SW5 for inputting the diagnosis signal SFD to the first node N1. The first switch element SW1 is provided between one end of the first capacitor C1 and the input node NA1. The second switch element SW2 is provided between one end of the second capacitor C2 and the input node NA2.

The third switch element SW3 is provided between the terminal PD1 (FIG. 4) of the circuit device and the input node NA1. The fourth switch element SW4 is provided between the terminal PD2 and the input node NA2.

During the diagnosis mode (the diagnosis period), the first and second switch elements SW1 and SW2 are turned on and the third and fourth switch elements SW3 and SW4 are turned off. Consequently, it is possible to supply the desired signal for diagnosis (the pseudo-desired signal) obtained by using the diagnosis signal SFD to the detection circuit 60 via the turned-on first and second switch elements SW1 and SW2 while cutting off, with the turned-off third and fourth switch elements SW3 and SW4, electric connection to the first and second terminals PD1 and PD2 side.

In the normal operation period, the first and second switch elements SW1 and SW2 are turned off and the third and fourth switch elements SW3 and SW4 are turned on. The normal operation period is a period in which the detection circuit 60 performs a detection operation. That is, the normal operation period is a period in which the detection circuit 60 performs detection processing of a desired signal using the detection signals IQ1 and IQ2. Consequently, in the normal operation period, it is possible to realize detection processing using the first and second detection signals IQ1 and IQ2 input via the turned-on third and fourth switch elements SW3 and SW4 while cutting off, with the turned-off first and second switch elements SW1 and SW2, electric connection to the first and second capacitors C1 and C2 side.

The Q/V conversion circuit 62 includes an operational amplifier OPB1, a feedback capacitor CB1, and a feedback resistance element RB1. A non-inversion input terminal of the operational amplifier OPB1 is set to the analog common voltage VCM. The feedback capacitor CB1 is provided between an output terminal and an inversion input terminal of the operational amplifier OPB1. The feedback resistance element RB1 is also provided between the output terminal and the inversion input terminal of the operational amplifier OPB1. The feedback resistance element RB1 is an element for setting a DC bias point of an output signal of the operational amplifier OPB1. The feedback resistance element RB1 may be omitted.

The Q/V conversion circuit 64 includes an operational amplifier OPB2, a feedback capacitor CB2, and a feedback resistance element RB2. A non-inversion input terminal of the operational amplifier OPB2 is set to the analog common voltage VCM. The feedback capacitor CB2 is provided between an output terminal and an inversion input terminal of the operational amplifier OPB2. The feedback resistance element RB2 is also provided between the output terminal and the inversion input terminal of the operational amplifier OPB2. The feedback resistance element RB2 is an element for setting a DC bias point of an output signal of the operational amplifier OPB2. The feedback resistance element RB2 may be omitted.

The Q/V conversion circuits 62 and 64 store charges of charge signals, which are the detection signals IQ1 and IQ2, from the vibrator element 10 in the feedback capacitors CB1 and CB2 to convert the charge signals into voltage signals. The Q/V conversion circuits 62 and 64 have a low-pass filter characteristic. For example, the capacity values of the feedback capacitors CB1 and CB2 are set such that a cut-off frequency of the Q/V conversion circuits 62 and 64 is sufficiently lower than a driving frequency (a resonance frequency) of the physical quantity transducer 18.

The differential amplifier circuit 70 is provided at a post stage of the Q/V conversion circuits 62 and 64. The configuration of the differential amplifier circuit 70 is as explained with reference to FIG. 2 and the like. Therefore, explanation of the configuration is omitted.

A high-pass filter unit 74 is provided at a post stage of the differential amplifier circuit 70. The high-pass filter unit 74 includes capacitors CK1 and CK2 and resistance elements RK1 and RK2. One end of the capacitor CK1 is connected to the output node NC1 of the differential amplifier circuit 70. The other end of the capacitor CK1 is connected to one end of the resistance element RK1. One end of the capacitor CK2 is connected to the output node NC2 of the differential amplifier circuit 70. The other end of the capacitor CK2 is connected to one end of the resistance element RK2. The other end of the resistance element RK1 and the other end of the resistance element RK2 are connected to a node NK1. The node NK1 is set to the analog common voltage VCM.

By providing the high-pass filter unit 74 at the post stage of the differential amplifier circuit 70, it is possible to remove DC bias components and the like of the signals QC1 and QC2. Since the node NK1 is set to the analog common voltage VCM, even after passing through the high-pass filter unit 74, the signals QC1 and QC2 from the differential amplifier circuit 70 have symmetrical signal waveforms centering on the analog common voltage VCM.

The gain adjustment amplifier 76 includes first and second operational amplifiers OPD1 and OPD2 and first to fourth resistance elements RD1 to RD4.

The signal QC1 of the signals QC1 and QC2 (first and second signals) forming differential signals is input to a non-inversion input terminal (a first input terminal) of the first operational amplifier OPD1. The signal QC2 of the signals QC1 and QC2 is input to a non-inversion input terminal (a first input terminal) of the second operational amplifier OPD2.

The first resistance element RD1 is provided between a first node ND5 and an inversion input terminal (a second input terminal or a node ND3) of the first operational amplifier OPD1. The second resistance element RD2 is provided between the inversion input terminal (ND3) of the first operational amplifier OPD1 and the output terminal (a node ND1) of the first operational amplifier OPD1.

The first and second resistance elements RD1 and RD2 function as a first voltage division circuit that divides a voltage (VA) at the first node ND5 and a voltage at an output terminal of the first operational amplifier OPD1 (a voltage of the output signal QD1) and sets an inversion input terminal of the first operational amplifier OPD1 to a voltage VD1 obtained by the voltage division.

The third resistance element RD3 is provided between the first node ND5 and an inversion input terminal (a second input terminal; a node ND4) of the second operational amplifier OPD2. The fourth resistance element RD4 is provided between the inversion input terminal (ND4) of the second operational amplifier OPD2 and an output terminal (a node ND2) of the second operational amplifier OPD2.

The third and fourth resistance elements RD3 and RD4 function as a second voltage division circuit that divides a voltage (VA) of the first node ND5 and a voltage at the output terminal of the second operational amplifier OPD2 (a voltage of the output signal QD2) and sets an inversion input terminal of the second operational amplifier OPD2 to a voltage VD2 obtained by the voltage division.

In this way, the gain adjustment amplifier 76 is configured by a first amplifier AMD1 including the first operational amplifier OPD1 and the first and second resistance elements RD1 and RD2 and a second amplifier AMD2 including the second operational amplifier OPD2 and third and fourth resistance elements RD3 and RD4. One end of the resistance element RD1 of the first amplifier AMD1 and one end of the resistance element RD3 of the second amplifier AMD2 are connected to the node ND5 in common. In this way, an instrumentation amplifier is configured by the first amplifier AMD1 and the second amplifier AMD2.

The differential signals QC1 and QC2 are input to the gain adjustment amplifier 76. The gain adjustment amplifier 76 outputs the differential signals QD1 and QD2 to the nodes ND1 and ND2.

The resistance elements RD1 to RD4 are resistance elements having variable resistance values. A gain GD in the gain adjustment amplifier 76 is adjusted by adjusting the resistance values of the resistance elements. For example, the resistance value of the resistance elements RD1 and RD3 is represented as R1, the resistance value of the resistance elements RD2 and RD4 is represented as R2, and a reference resistance value is represented as R. Then, the resistance values R1 and R2 for setting the gain GD can be represented as R1=R/GD and R2=R×(1−1/GD). When the signals QC1 and QC2 are input, the differential amplifier circuit 70 outputs the signals QD1 and QD2 indicated by the following expressions.

$$QD1=VA+(GD/2)\times(QC1-QC2)$$

$$QD2=VA-(GD/2)\times(QC1-QC2)$$

$$QD1-QD2=GD\times(QC1-QC2)$$

In the expressions, VA represents a voltage at the node ND5. The voltage VA is a voltage obtained by dividing the voltages of the signals QD1 and QD2 with the resistance elements RD1 and RD2 and the resistance elements RD3 and RD4 and is a midpoint voltage between the voltages of the signals QD1 and QD2. Therefore, a relation of VA=(QD1+QD2)/2 holds. When the signals QC1 and QC2 are differential signals based on the analog common voltage VCM (a center voltage) and a relation of VCM=(QC1+QC2)/2 holds, a relation of VA=VCM holds.

Note that the gain adjustment amplifier 76 may be omitted by providing a function of gain adjustment in the differential amplifier circuit 70.

A monitoring voltage VA, which is the voltage at the node ND5, is input to the failure detection circuit 160. Specifically, in addition to the components explained with reference to FIG. 2, the failure detection circuit 160 includes comparators CPD1 and CPD2 and an OR circuit ORD1. The threshold voltage VTH on the high potential side is input to an inversion input terminal of the comparator CPD1. The monitoring voltage VA is input to a non-inversion input terminal of the comparator CPD1. The monitoring voltage VA is input to an inversion input terminal of the comparator CPD2. The threshold voltage VTL on the low potential side is input to a non-inversion input terminal of the comparator CPD2. Output signals of the comparators CPD1 and CPD2 are input to the OR circuit ORD1. The OR circuit ORD1 outputs a monitoring result signal DGD.

For example, when the monitoring voltage VA is within the determination voltage range between the threshold voltage VTH and the threshold voltage VTL, the monitoring result signal DGD changes to the L level to inform the control unit 140 and the like that a failure is not detected. On the other hand, when the monitoring voltage VA is outside the determination voltage range, the monitoring result signal DGD changes to the H level to inform the control unit 140 and the like that a failure is detected.

Consequently, in FIG. 8, individual failure detection of the gain adjustment amplifier 76 is realized. That is, in the normal state, the output signals QD1 and QD2 of the gain adjustment amplifier 76 also have symmetrical signal waveforms centering on the analog common voltage VCM as shown in FIG. 3A. The monitoring voltage VA, which is the midpoint voltage between the output signals QD1 and QD2, coincides with the analog common voltage VCM. On the other hand, when a failure occurs, the symmetry collapses, the output signals QD1 and QD2 change to the signal waveforms shown in FIG. 3B, and a voltage level of the monitoring voltage VA fluctuates. The fluctuation in the monitoring voltage VA is detected by the failure detection circuit 160 (the comparators CPD1 and CPD2 and the OR circuit ORD1). That is, the failure detection circuit 160 detects whether the monitoring voltage VA is within the determination voltage range to perform the failure detection. Consequently, it is possible to realize individual failure detection of the gain adjustment amplifier 76.

Moreover, in FIG. 8, the monitoring voltage VA is generated by voltage division making use of the resistance elements RD1 and RD2 included in the amplifier AMD1 and the resistance elements RD3 and RD4 included in the amplifier AMD2.

That is, in the differential amplifier circuit 70, the resistance elements RC9 and RC10 are provided anew for generation of the monitoring voltage VB. On the other hand, the gain adjustment amplifier 76 generates the monitoring voltage VA effectively making use of the resistance elements RD1 and RD2 and the resistance elements RD3 and RD4 used for gain adjustment. Therefore, it is possible to realize failure detection based on the monitoring voltage VA without substantially increasing a circuit size.

Note that the determination voltage range in performing the failure detection of the differential amplifier circuit 70 and the determination voltage range in performing the failure detection of the gain adjustment amplifier 76 may be different. That is, the threshold voltages VTH and VTL on the high potential side and the low potential side for specifying the determination voltage ranges may be set to different voltages.

The synchronous detection circuit 81 includes a switching mixer 82 and a switching mixer 84. The switching mixer 82 is a mixer for extraction of a desired signal (angular velocity) (for a normal operation). That is, the switching mixer 82 performs differential synchronous detection on the basis of the synchronization signal SYC from the driving circuit 30 to detect a desired signal. The switching mixer 84 is a mixer for extraction (for diagnosis) of an unnecessary signal.

For example, the synchronous detection circuit 81 causes the vibrator element 10 to arbitrarily generate a vibration leak signal. The switching mixer 84 detects the vibration leak signal to perform failure diagnosis of the detection circuit 60.

For example, in FIG. 6, if vibration energy is balanced between the driving arms 4 and 5 and the driving arms 6 and 7 when the driving arms 4 and 5 and the driving arms 6 and 7 perform flexural vibration, the detection arms 8 and 9 do not perform the flexural vibration in a state in which angular velocity is not applied to the vibrator element 10. On the other hand, if the balance of the vibration energy of the driving arms 4 and 5 and the driving arms 6 and 7 is collapsed, the flexural vibration of the detection arms 8 and 9 occurs even in a state in which angular velocity is not applied to the vibrator element 10. The flexural vibration is called leak vibration and is flexural vibration in the direction of the arrow C like the vibration based on the Coriolis force. The vibration based on the Coriolis force (the detection signals IQ1 and IQ2) is a signal having a phase 90 degrees shifted from the phase of the driving signal DQ. However, the leak vibration is vibration in a phase same as the phase of the driving signal DQ. Note that a phase shifts 90 degrees in the Q/V conversion circuits 62 and 64. Therefore, at a stage of the synchronous detection, a signal based on the leak vibration is a signal having a phase 90 degrees shifted from the phase of the synchronization signal SYC.

In this embodiment, a vibration leak component of a desired level is actively generated such that the balance of the vibration energy of the driving arms 4 and 5 and the driving arms 6 and 7 slightly collapses. Mass is differentiated in weight sections at the distal ends of the driving arms 4 and 5 and weight sections at the distal ends of the driving arms 6 and 7 by laser machining or the like to collapse the balance of the vibration energy and cause an arbitrary vibration leak. A level of the vibration leak is a known value. Therefore, it is possible to perform failure diagnosis of the detection circuit 60 by detecting a signal of the vibration leak with the switching mixer 84.

The signal QD1 from the gain adjustment amplifier 76 at a pre-stage is input to the first input node ND1 of the switching mixer 82. The signal QD2 from the gain adjustment amplifier 76 is input to the second input node ND2 of the switching mixer 82. The switching mixer 82 performs differential synchronous detection with the synchronization signal SYC (CK0) from the driving circuit 30 and outputs differential signals QF1 and QF2 to first and second output nodes NF1 and NF2.

The switching mixer 82 includes switch elements SF1, SF2, SF3, and SF4. The switch element SF1 is provided between the first input node ND1 and the first output node NF1 of the switching mixer 82. The switch element SF2 is provided between the second input node ND2 and the second output node NF2 of the switching mixer 82. The switch element SF3 is provided between the second input node ND2 and the first output node NF1. The switch element SF4 is provided between the first input node ND1 and the second output node NF2. The switch elements SF1 to SF4 can be configured by, for example, MOS transistors (e.g., NMOS transistors or transfer gates).

The switch elements SF1 and SF2 are turned on and off by a clock signal CK0. The switch elements SF3 and SF4 are turned on and off by a clock signal XCK0. The clock signal CK0 is equivalent to the synchronization signal SYC. The clock signal XCK0 is an inverted signal of the clock signal CK0 (a signal having a phase 180 degrees different from the phase of the clock signal CK0). Therefore, the switch elements SF1 and SF3 are exclusively turned on and off and the switch elements SF2 and SF4 are exclusively turned on and off. For example, when the clock signal CK0 (SYC) is at the H level (in a broad sense, a first voltage level), the switch elements SF1 and SF2 are turned on and the switch elements SF3 and SF4 are turned off. When the clock signal CK0 is at the L level (in a broad sense, a second voltage level), the switch elements SF1 and SF2 are turned off and the switch elements SF3 and SF4 are turned on.

Consequently, the differential signals QD1 and QD2 from the gain adjustment amplifier 76 are synchronously detected in a state of differential signals. Signals after the synchronous detection are output as the differential signals QF1 and QF2. An unnecessary signal such as noise (1/f noise) generated by the circuit (the Q/V conversion circuit, the differential amplifier circuit, or the gain adjustment amplifier) at the pre-stage is frequency-converted into a high-frequency band by the switching mixer 82. The desired signal, which is the signal corresponding to the Coriolis force, is dropped to a direct-current signal. The unnecessary signal such as the 1/f noise frequency-converted into the high-frequency band by the switching mixer 82 is removed by the filter unit 90 (FIG. 7) provided at a post stage. The filter unit 90 is, for example, a passive filter configured by a passive element. That is, as the filter unit 90, a passive filter configured by a passive element such as a resistance element or a capacitor without using an operational amplifier can be adopted.

The signal QD1 from the gain adjustment amplifier 76 at the pre-stage is input to the first input node ND1 of the switching mixer 84. The signal QD2 from the gain adjustment amplifier 76 is input to the second input node ND2 of the switching mixer 82. The switching mixer 84 outputs differential signals QG1 and QG2 to first and second output nodes NG1 and NG2.

The switching mixer 84 includes switch elements SG1, SG2, SG3, and SG4. The switch element SG1 is provided between the first input node ND1 and the first output node NG1. The switch element SG2 is provided between the second input node ND2 and the second output node NG2. The switch element SG3 is provided between the second input node ND2 and the first output node NG1. The switch element SG4 is provided between the first input node ND1 and the second output node NG2. The switch elements SG1 to SG4 can be configured by, for example, MOS transistors (e.g., NMOS transistors or transfer gates).

The switch elements SG1 and SG2 are turned on and off by a clock signal CK90. The switch elements SG3 and SG4 are turned on and off by a clock signal XCK90. The clock signal CK90 is a signal having a phase 90 degrees different from the phase of the clock signal CK0 (the synchronization signal SYC). The clock signal XCK90 is an inverted signal of the clock signal CK90 (a signal having a phase 180 degrees different from the phase of the clock signal CK90). Therefore, the switch elements SG1 and SG3 are exclusively turned on and off. The switch elements SG2 and SG4 are exclusively turned on and off. For example, when the clock signal CK90 is at the H level, the switch elements SG1 and SG2 are turned on and the switch elements SG3 and SG4 are turned off. When the clock signal CK90 is at the L level, the switch elements SG1 and SG2 are turned off and the switch elements SG3 and SG4 are turned on.

The signal of the vibration leak (in a broad sense, an unnecessary signal) arbitrarily generated in the vibrator element 10 has a phase 90 degrees different from the phase of the synchronization signal SYC (the desired signal). Therefore, the switching mixer 84 synchronously detects the signals QD1 and QD2 on the basis of the clock signal CK90 having a phase 90 degrees different from the phase of the clock signal CK0, which is the synchronization signal SYC. Consequently, it is possible to extract an arbitrarily mixed vibration leak signal. A level of the vibration leak signal in this case is known. Therefore, by A/D-converting a detection result by the switching mixer 84 and comparing the detection result with an expected value, it is possible to detect that an expected vibration leak signal is mixed in the signals QD1 and QD2. When the expected vibration leak signal is detected, it is possible to determine that the detection circuit 60 is normally operating. This diagnosis processing performed using the switching mixer 84 is executed in a period of constant diagnosis shown in FIG. 11 referred to below.

Figure 9:
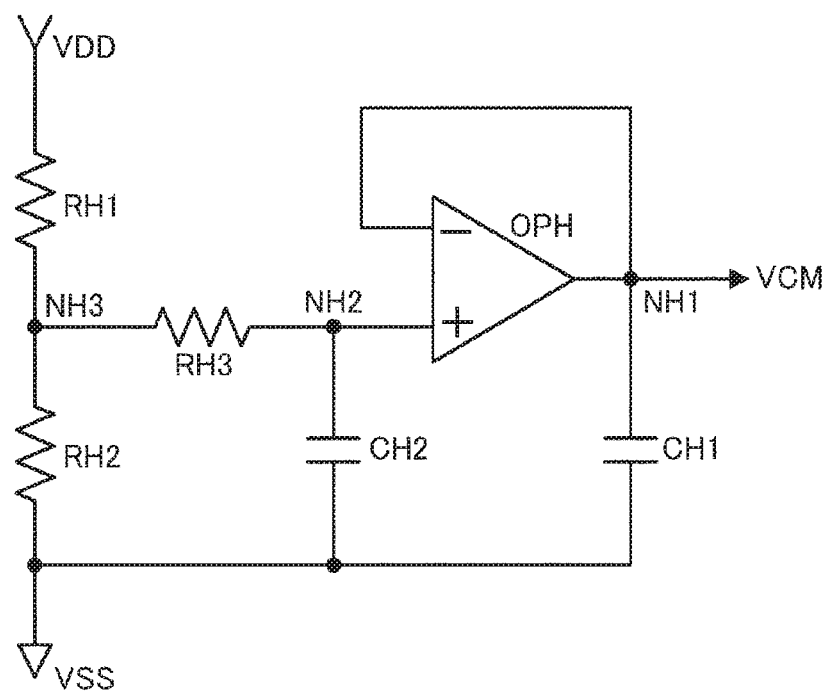
FIG. 9 is a configuration example of an analog-common-voltage generation circuit.

FIG. 9 is a configuration example of an analog-common-voltage generation circuit that generates an analog common voltage VCM. The analog-common-voltage generation circuit includes an operational amplifier OPH, resistance elements RH1, RH2, and RH3, and capacitors CH1 and CH2. The resistance elements RH1 and RH2 are connected in series between power supplies VDD and VSS. The resistance elements RH1 and RH2 generate a divided voltage at a node NH3. The divided voltage is, for example, a midpoint voltage between the power supplies VDD and VSS. The divided voltage is supplied to a node NH2 of a non-inversion input terminal of the operational amplifier OPH via a low-pass filter for noise reduction configured by the resistance element RH3 and the capacitor CH2. The operational amplifier OPH is connected in so-called voltage follower connection. The operational amplifier OPH outputs a voltage corresponding to the divided voltage to a node NH1 as the analog common voltage VCM. The capacitor CH1 is a capacitor for potential stabilization.

Figure 10:
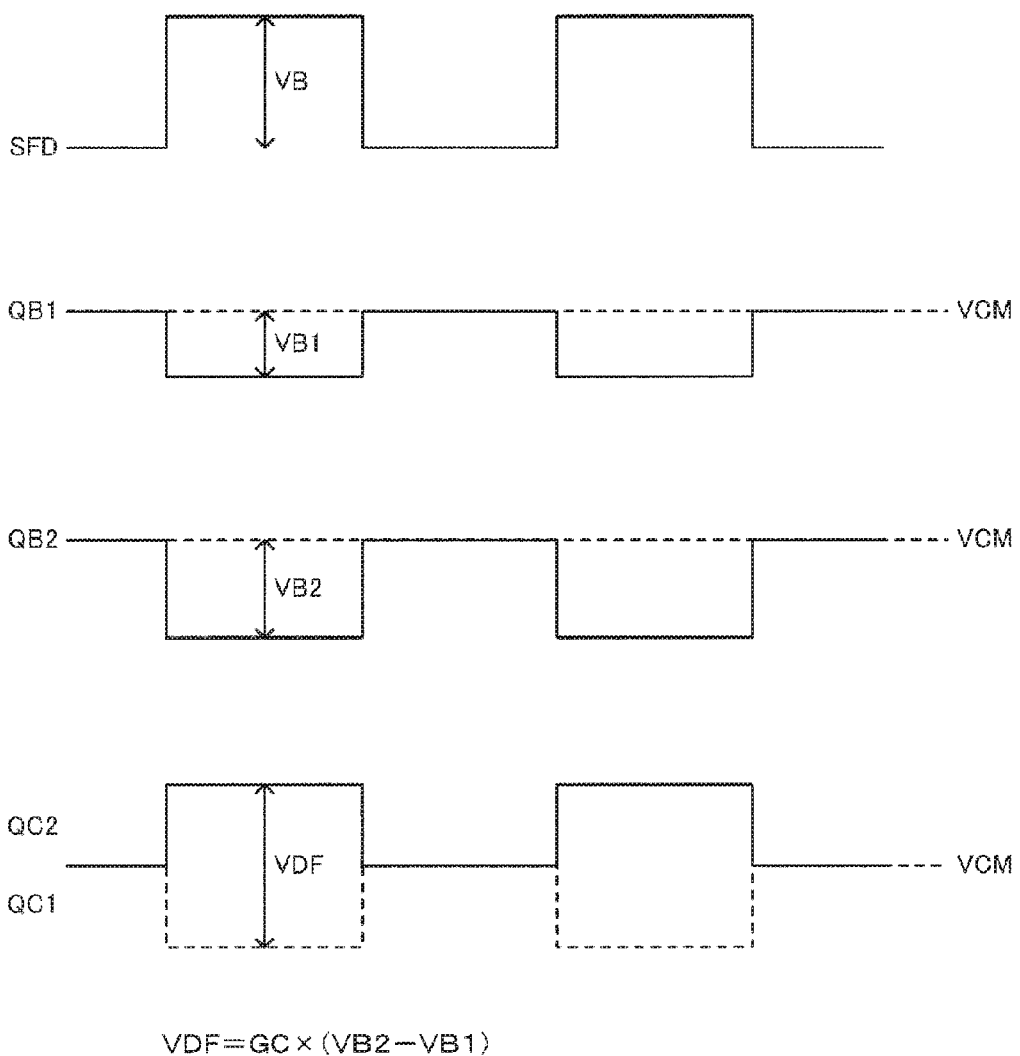
FIG. 10 is a signal waveform chart for explaining self-diagnosis by a diagnosis circuit.

FIG. 10 is a signal waveform chart for explaining self-diagnosis by the diagnosis circuit 150. In FIG. 10, the diagnosis signal SFD, voltage amplitude of which is VB, is input to the first node N1 shown in FIG. 8. Then, the Q/V conversion circuit 62 outputs the signal QB1, voltage amplitude of which is VB1. The Q/V conversion circuit 64 outputs the signal QB2, voltage amplitude of which is VB2. Note that, in FIG. 10, the diagnosis signal SFD is a rectangular wave. However, the diagnosis signal SFD may be a periodical signal such as a sine wave.

For example, capacity values of the feedback capacitors CB1 and CB2 are equal. A capacity value of the capacitor C2 is larger than a capacity value of the capacitor C1. The capacity value of the capacitors CB1 and CB2 is, for example, approximately 0.5 pF to 1.5 pF. A capacity value C of the capacitor C1 is, for example, approximately 250 fF to 750 fF. A difference ΔC between the capacity values of the capacitors C1 and C2 is, for example, approximately 50 fF to 150 fF. Note that the capacitors C1, C2, CB1, and CB2 can be realized by, for example, capacitors (poly double layer capacitors) formed of polysilicon or capacitors formed of MIM (Meal-Insulator-Metal).

In the way, when the capacitor C2 has the larger capacity value compared with the capacitor C1, as shown in FIG. 10, the Q/V conversion circuits 62 and 64 output the signals QB1 and QB2 that satisfy a relation of VB1<VB2. Specifically, the Q/V conversion circuits 62 and 64 are inverting amplifiers. Therefore, as shown in FIG. 10, when the diagnosis signal SFD has a positive polarity, the Q/V conversion circuits 62 and 64 output the signals QB1 and QB2 that have a negative polarity based on (centering on) the analog common voltage VCM and satisfy the relation of VB1<VB2 concerning voltage amplitude.

That is, both potentials at the input nodes NA1 and NA2 are set to the analog common voltage VCM by virtual grounding (virtual short) by the operational amplifiers OPB1 and OPB2 of the Q/V conversion circuits 62 and 64. Since the capacitor C2 has the larger capacity value compared with the capacitor C1, when the diagnosis signal SFD, voltage amplitude of which is VB, is applied to the other ends of the capacitors C1 and C2, a stored charge amount of the capacitor C2 is larger than a stored charge amount of the capacitor C1. Since the capacity values of the feedback capacitors CB1 and CB2 of the Q/V conversion circuits 62 and 64 are equal, a relation of VB1<VB2 holds concerning the voltage amplitudes of the signals QB1 and QB2. That is, the voltage amplitude VB1 of the signal QB1 is set to amplitude corresponding to a capacity ratio (C1/CB1) of the capacitor C1 and the feedback capacitor CB1. The voltage amplitude VB2 of the signal QB2 is set to amplitude corresponding to a capacity ratio (C2/CB2) of the capacitor C2 and the feedback capacitor CB2. Since the capacitor C2 has the larger capacity value compared with the capacitor C1, the relation of VB1<VB2 holds.

The differential amplifier circuit 70 amplifies a differential component between the signals QB1 and QB2. Therefore, as shown in FIG. 10, signals obtained by multiplying a difference between the signals QB1 and QB2 with a gain and inverting the difference are output as the differential signals QC1 and QC2. For example, when a gain of the differential amplification of the differential amplifier circuit 70 is represented as GC, a differential voltage between the signal QC1 and the signal QC2 can be represented as VDF=GC×(VB2−VB1).

In this way, by inputting the diagnosis signal SFD to the node N1 on the other end side of the capacitor C1, it is possible to supply a desired signal (a pseudo-desired signal) for diagnosis indicated by the signals QC1 and QC2 to the detection circuit 60. By performing a detection operation for the desired signal for diagnosis and monitoring a result of the detection, the detection circuit 60 is capable of diagnosing whether the detection circuit 60 is normally operating (self-diagnosis or failure diagnosis). Specifically, it is possible to perform diagnosis of the detection circuit 60 by detecting a differential voltage VDF between the signals QC1 and QC2 shown in FIG. 10.

For example, since the capacity values of the capacitors C1, C2, CB1, and CB2 and the voltage amplitude of the diagnosis signal SFD are known, the differential voltage VDF between the signals QC1 and QC2 is also known. Therefore, if a detection result of the detection circuit 60 corresponding to the differential voltage VDF is within a range of an expected value, it is possible to diagnose that the detection circuit 60 is normally operating. Specifically, an unnecessary signal having a phase different from the phase of the synchronization signal SYC (e.g., an unnecessary signal having a phase shifted degrees) is removed by, for example, the synchronous detection of the synchronous detection circuit 81. On the other hand, a desired signal for diagnosis having a phase same as the phase of the synchronization signal SYC is extracted. That is, a component of the desired signal for diagnosis appears in a frequency band of a DC or the like in a frequency spectrum. Therefore, if a value of a DC component (a DC voltage value or an A/D-converted value of a DC voltage) of the desired signal for diagnosis is within the range of the expected value, it is possible to diagnose that the detection circuit 60 is normally operating.

Figure 11:
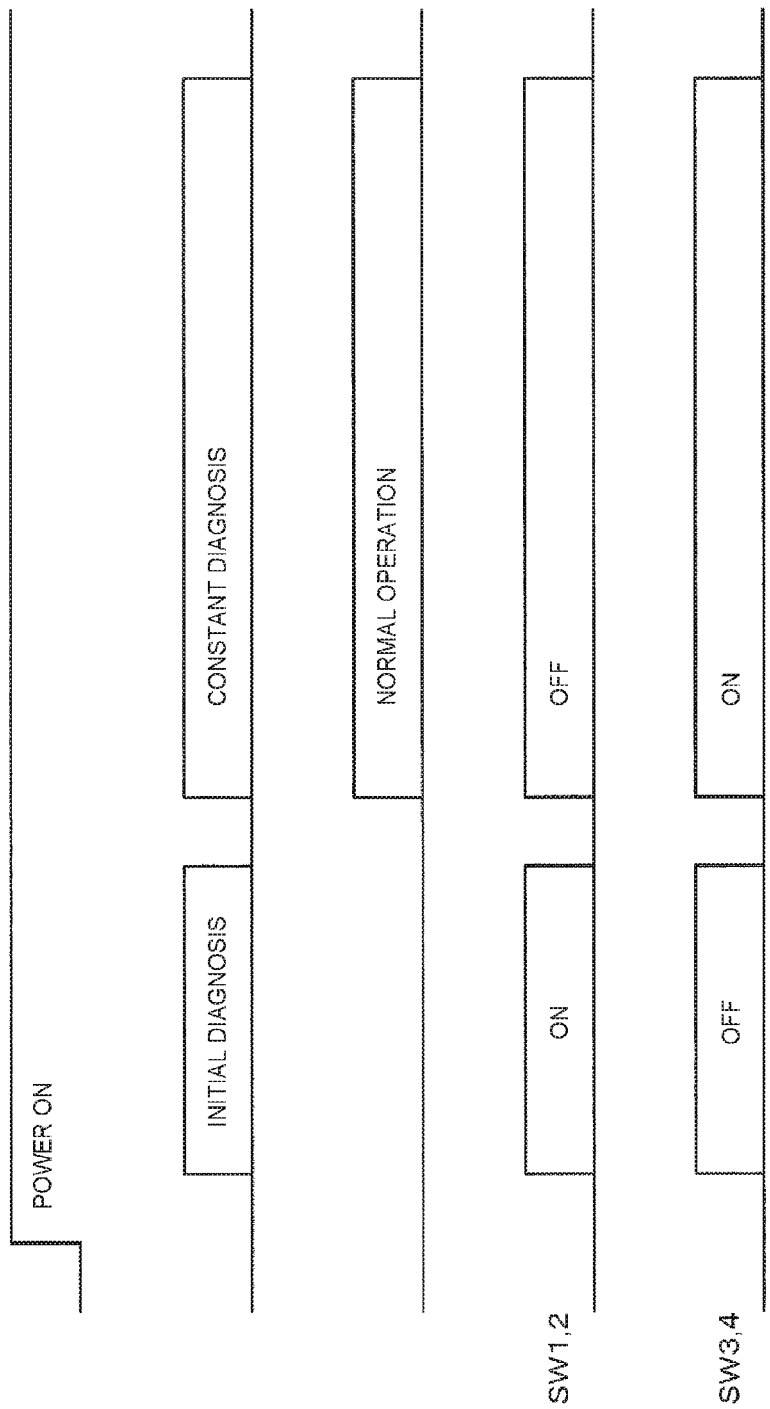
FIG. 11 is an operation sequence chart for explaining the operation of the circuit device.

FIG. 11 is an operation sequence chart for explaining the operation of the circuit device according to this embodiment. As shown in FIG. 11, after electric power is input to the circuit device and the power supply is turned on, the circuit device is set in the diagnosis mode and initial diagnosis is performed. That is, diagnosis for verifying whether the detection circuit 60 is normally operating is performed. During the initial diagnosis (the diagnosis mode), the switch elements SW1 and SW2 of the diagnosis circuit 150 are turned on and, on the other hand, the switch elements SW3 and SW4 are turned off. Consequently, the input of the detection signals IQ1 and IQ2 from the vibrator element 10 is electrically cut off. A signal obtained by converting a voltage level of a signal from the driving circuit 30 is input to the node N1 at the other ends of the capacitors C1 and C2 as the diagnosis signal SFD. Consequently, as explained with reference to FIG. 10, it is possible to supply a pseudo-desired signal for diagnosis to the detection circuit 60 and diagnose whether the circuits of the detection circuit 60 are normally operating.

When the initial diagnosis ends and the circuit device changes to the normal operation period in which the desired signal is detected, the switch elements SW3 and SW4 are turned on and, on the other hand, the switch elements SW1 and SW2 are turned off. Consequently, the detection signals IQ1 and IQ2 from the vibrator element 10 are input to the detection circuit 60 and detection processing of the desired signal is performed. At this point, since the switch elements SW1 and SW2 are turned off, it is possible to prevent a situation in which, for example, noise based on a signal from the driving circuit 30 is transmitted to the input nodes NA1 and NA2 of the detection circuit 60.

In this way, in FIG. 11, after the power-on and before the normal operation period, the circuit device is set in the diagnosis mode. The setting in the diagnosis mode is realized when, for example, a controller on the outside of the circuit device issues a command for starting the diagnosis mode (the initial diagnosis) and the command is received via an interface of the circuit device. Alternatively, after the power-on, the operation mode of the circuit device may be automatically set to the diagnosis mode. Note that, after the start of the normal operation, the normal operation may be stopped once and the diagnosis processing of the circuit device may be performed on the basis of, for example, the issuance of the command from the controller on the outside of the circuit device.

As shown in FIG. 11, in the normal operation period, constant diagnosis for constantly checking whether the detection circuit 60 is normally operating is performed.

In the constant diagnosis, the failure detection circuit 160 performs failure detection of the differential amplifier circuit 70 and the gain adjustment amplifier 76. That is, the failure detection circuit 160 detects whether the monitoring voltages VB and VA are within the determination voltage range. The control unit 140 performs failure diagnosis of the differential amplifier circuit 70 and the gain adjustment amplifier 76 on the basis of the monitoring result signals DGC and DGD from the failure detection circuit 160.

In the constant diagnosis, the switching mixer 84 performs the synchronous detection for extracting an arbitrarily generated vibration leak signal. The control unit 140 performs failure diagnosis of the entire detection circuit 60 by detecting whether a component of the extracted vibration leak signal is within the range of the expected value. At this point, the switching mixer 82 is performing the normal synchronous detection for extracting the desired signal. Therefore, it is possible to simultaneously execute the failure diagnosis by the extraction of the vibration leak signal and the extraction processing of the desired signal by the synchronous detection. The constant diagnosis is realized.

As explained above, in the first embodiment, it is possible to execute, while performing the extraction processing of the desired signal by the synchronous detection, the failure diagnosis of the differential amplifier circuit 70 and the gain adjustment amplifier 76 by the failure detection circuit 160 and the failure diagnosis of the entire detection circuit 60 by the switching mixer 84 in parallel to the extraction processing. It is possible to realize the constant diagnosis during the actual operation of the circuit device. Therefore, it is possible to greatly improve reliability against a failure and performance deterioration due to a change with time.

Second Embodiment

A circuit device according to a second embodiment of the invention is explained below. However, in some case, components same as the components of the circuit device 20 according to the first embodiment are denoted by the same reference numerals and signs and explanation of the components is omitted.

1. A Circuit Device

Figure 12:
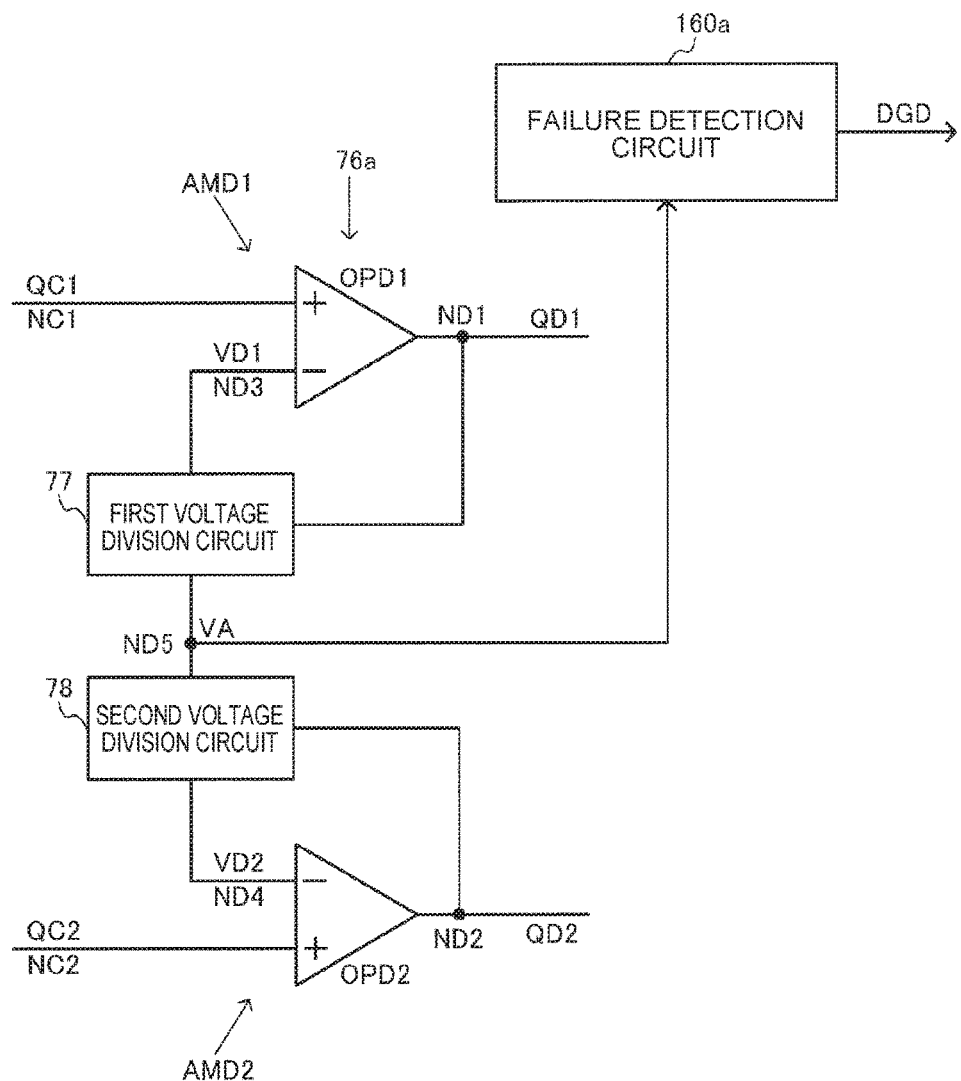
FIG. 12 is a basic configuration example of a circuit device according to a second embodiment.

A basic configuration example of the circuit device according to the second embodiment is shown in FIG. 12. The circuit device according to this embodiment includes the first and second operational amplifiers OPD1 and OPD2 and first and second voltage division circuits 77 and 78. A gain adjustment amplifier 76*a* (in a broad sense, a differential-signal processing circuit) is configured by the first and second operational amplifiers OPD1 and OPD2 and the first and second voltage division circuits 77 and 78. Further, the circuit device according to this embodiment includes a failure detection circuit 160*a*.

The first signal QC1 of the first and second signals QC1 and QC2 forming the differential signals is input to the non-inversion input terminal (the first input terminal) of the first operational amplifier OPD1. The second signal QC2 is input to the non-inversion input terminal (the first input terminal) of the second operational amplifier OPD2.

The first voltage division circuit 77 divides the voltage (VA) at the first node ND5 and the voltage at the output terminal of the first operational amplifier OPD1 (the voltage of the output signal QD1). The first voltage division circuit 77 sets the inversion input terminal of the first operational amplifier OPD1 to the voltage VD1 obtained by the voltage division. For example, the first voltage division circuit 77 is provided between the first node ND5 and the node ND1 of the output terminal of the first operational amplifier OPD1. The first voltage division circuit 77 generates, at the node ND3 of the inversion input terminal of the first operational amplifier OPD1, the voltage VD1 obtained by the voltage division. The voltage VD1 is equalized with the voltage of the first signal QC1 by virtual grounding (virtual short) by the first operational amplifier OPD1.

The second voltage division circuit 78 divides the voltage (VA) at the first node ND5 and the voltage at the output terminal of the second operational amplifier OPD2 (the voltage of the output signal QD2). The second voltage division circuit 78 sets the inversion input terminal of the second operational amplifier OPD2 to the voltage VD2 obtained by the voltage division. For example, the second voltage division circuit 78 is provided between the first node ND5 and the node ND2 of the output terminal of the second operational amplifier OPD2. The second voltage division circuit 78 generates, at the node ND4 of the inversion input terminal of the second operational amplifier OPD2, the voltage VD2 obtained by the voltage division. The voltage VD2 is equalized with the voltage of the second signal QC2 by virtual grounding (virtual short) by the second operational amplifier OPD2.

In this embodiment, for example, the first amplifier AMD1 is configured by the first operational amplifier OPD1 and the first voltage division circuit 77. For example, the second amplifier AMD2 is configured by the second operational amplifier OPD2 and the second voltage division circuit 78. One end of the first voltage division circuit 77 of the first amplifier AMD1 and one end of the second voltage division circuit 78 of the second amplifier AMD2 are connected to the node ND5 in common. In this way, an instrumentation amplifier is configured by the first amplifier AMD1 and the second amplifier AMD2.

The failure detection circuit 160*a* performs failure detection on the basis of the monitoring voltage VA, which is the voltage at the first node ND5. That is, the failure detection circuit 160*a* performs the failure detection using, as the monitoring voltage VA, the voltage at the node ND5 to which one end of the first voltage division circuit 77 and one end of the second voltage division circuit 78 are connected in common.

For example, the first signal QC1 input to the gain adjustment amplifier 76*a* is a signal that changes to a positive side or a negative side on the basis of (centering on) an analog common voltage. The second signal QC2 is also a signal that changes to the positive side or the negative side on the basis of (centering on) the analog common voltage. For example, when the first signal QC1 is a positive voltage based on the analog common voltage, the second signal QC2 is a negative voltage based on the analog common voltage. When the first signal QC1 is a negative voltage based on the analog common voltage, the second signal QC2 is a positive voltage based on the analog common voltage.

When the first and second signals QC1 and QC2 input to the gain adjustment amplifier 76*a* are the signals that change to the positive side or the negative side on the basis of the analog common voltage in this way, the output signals QD1 and QD2 of the gain adjustment amplifier 76*a* are also the signals that change to the positive side or the negative side on the basis of (centering on) the analog common voltage. For example, when the output signal QD1 is a positive voltage based on the analog common voltage, the output signal QD2 is a negative voltage based on the analog common voltage. When the output signal QD1 is a negative voltage based on the analog common voltage, the output signal QD2 is a positive voltage based on the analog common voltage.

The failure detection circuit 160*a* performs failure detection by detecting whether the monitoring voltage VA is within a determination voltage range based on (centering on) the analog common voltage. For example, the failure detection circuit 160*a* performs the failure detection by detecting whether a monitoring voltage is within a determination voltage range between a threshold voltage on a high potential side and a threshold voltage on a low potential side. The failure detection circuit 160*a* outputs the monitoring result signal DGD (a diagnosis signal or a failure detection signal).

In this way, in this embodiment, the gain adjustment amplifier 76*a* (the differential-signal processing circuit) is realized by the instrumentation amplifier configured by the two amplifiers AMD1 and AMD2.

That is, usually, in general, the differential input/differential output gain adjustment amplifier 76*a* is realized using one fully differential amplifier.

In this embodiment, contrary to this, the differential input/differential output gain adjustment amplifier 76*a* is realized using the instrumentation amplifier configured by the two single-ended input/single-ended output amplifiers AMD1 and AMD2.

The failure detection circuit 160*a* performs the failure detection using, as the monitoring voltage VA, the voltage at the node ND5, to which one ends of the first and second voltage division circuits 77 and 78 are connected in common, effectively making use of the first and second voltage division circuits 77 and 78 included in the amplifiers AMD1 and AMD2. Consequently, it is possible to detect a proper failure of the gain adjustment amplifier 76*a*. For example, in the normal differential input/differential output fully differential amplifier, even if a failure occurs in a circuit, a differential component of the failure is sometimes seen as being properly amplified. In such a case, it is likely that proper failure detection of the gain adjustment amplifier 76*a* cannot be realized.

In this regard, in this embodiment, the gain adjustment amplifier 76*a* is realized by the instrumentation amplifier configured by the two single-ended input/single-ended output amplifiers AMD1 and AMD2.

Therefore, the failure detection circuit 160*a* is capable of properly detecting the failure described above by performing the failure detection on the basis of the monitoring voltage VA at the node ND5.

Figure 13:
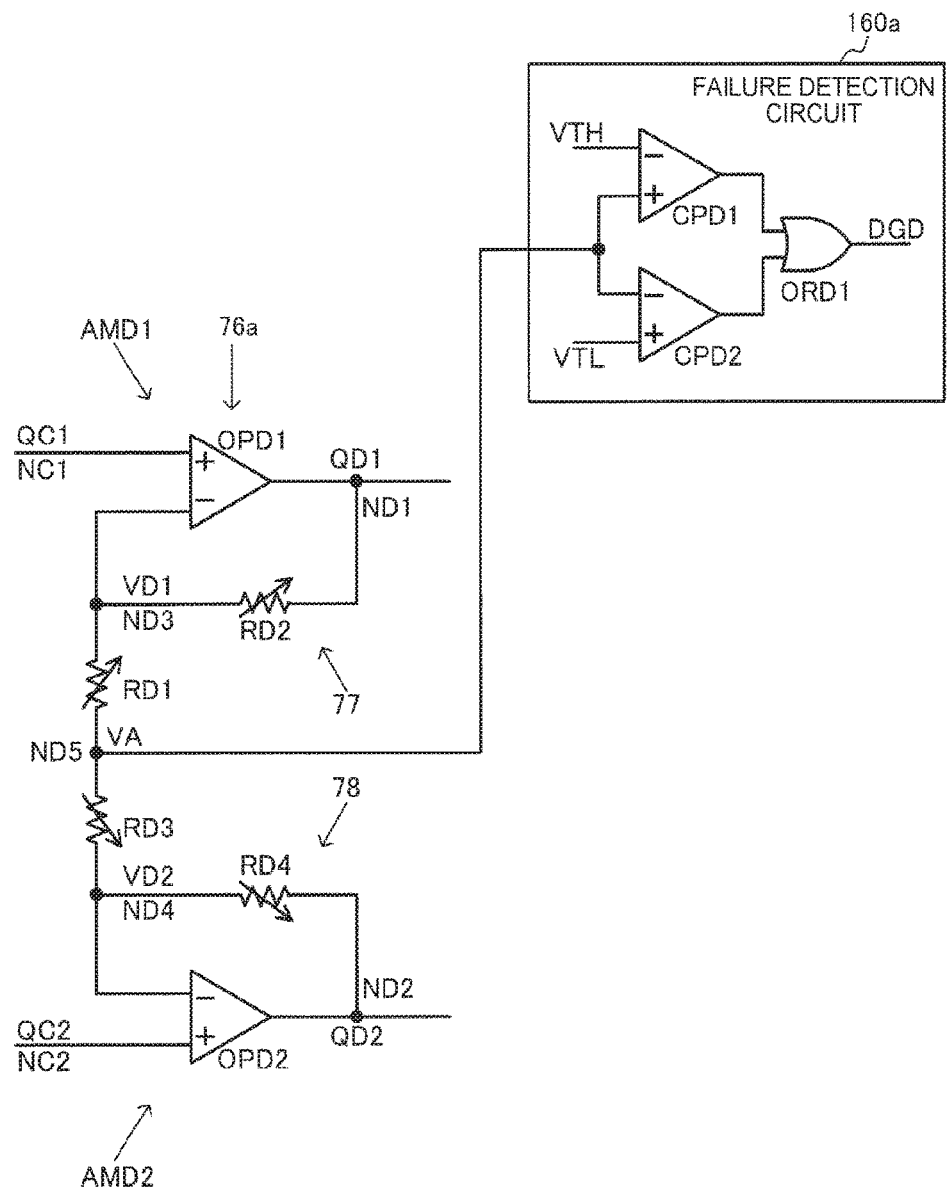
FIG. 13 is a detailed configuration example of the circuit device according to the second embodiment.

A detailed configuration example of the circuit device in this embodiment is shown in FIG. 13. In FIG. 13, the first voltage division circuit 77 includes the first and second resistance elements RD1 and RD2. The second voltage division circuit 78 includes the third and fourth resistance elements RD3 and RD4.

The first resistance element RD1 is provided between the node ND5 and the inversion input terminal (ND3) of the first operational amplifier OPD1. The second resistance element RD2 is provided between the inversion input terminal (ND3) of the first operational amplifier OPD1 and the output terminal (ND1) of the first operational amplifier OPD1. The first and second resistance elements RD1 and RD2 are resistance elements having variable resistance values. Note that both of the first and second resistance elements RD1 and RD2 do not need to be the resistance elements having variable resistance values. At least one of the first and second resistance elements RD1 and RD2 only has to be the resistance element having a variable resistance value. When a gain adjustment function is unnecessary, the resistance values of the first and second resistance elements RD1 and RD2 may be fixed values.

The voltage (VA) at the node ND5 and the voltage at the output terminal of the first operational amplifier OPD1 (the voltage of the signal QD1) can be divided by the first and second resistance elements RD1 and RD2. The inversion input terminal of the first operational amplifier OPD1 can be set to the voltage VD1 obtained by the voltage division.

The third resistance element RD3 is provided between the node ND5 and the inversion input terminal (ND4) of the second operational amplifier OPD2. The fourth resistance element RD4 is provided between the inversion input terminal (ND4) of the second operational amplifier OPD2 and the output terminal (ND2) of the second operational amplifier OPD2. The third and fourth resistance elements RD3 and RD4 are resistance elements having variable resistance values. Note that both of the third and fourth resistance elements RD3 and RD4 do not need to be the resistance elements having variable resistance values. At least one of the third and fourth resistance elements RD3 and RD4 only has to be the resistance element having a variable resistance value. When the gain adjustment function is unnecessary, the resistance values of the third and fourth resistance elements RD3 and RD4 may be fixed values. The resistance elements RD1 to RD4 can be realized by polysilicon resistors and the like.

The voltage (VA) at the node ND5 and the voltage at the output terminal of the second operational amplifier OPD2 (the voltage of the signal QD2) can be divided by the third and fourth resistance elements RD3 and RD4. The inversion input terminal of the second operational amplifier OPD2 can be set to the voltage VD2 obtained by the voltage division.

As explained above, in this embodiment, the gain adjustment amplifier 76*a* is configured by the amplifiers AMD1 and AMD2. One end of the resistance element RD1 of the amplifier AMD1 and one end of the resistance element RD3 of the amplifier AMD2 are connected to the node ND5 in common.

By adopting such a configuration, when the differential signals QC1 and QC2 are input, the gain adjustment amplifier 76*a* can output the differential signals QD1 and QD2 to a circuit at a post stage. That is, when the differential signals QC1 and QC2 that change to the positive side or the negative side on the basis of the analog common voltage are input, the gain adjustment amplifier 76*a* outputs the signals QD1 and QD2 that change to the positive side or the negative side on the basis of the analog common voltage. Consequently, it is possible to realize the differential input/differential output gain adjustment amplifier 76*a*. That is, even if a fully differential amplifier is not used, it is possible to realize the differential input/differential output gain adjustment amplifier 76*a* with the instrumentation amplifier configured by the amplifiers AMD1 and AMD2.

In this embodiment, the voltage at the node ND5, to which one end of the resistance element RD1 of the amplifier AMD1 and one end of the resistance element RD3 of the amplifier AMD2 are connected in common, is input to the failure detection circuit 160*a* as the monitoring voltage VA. The failure detection circuit 160*a* performs the failure detection of the gain adjustment amplifier 76*a* on the basis of the monitoring voltage VA.

As explained above, in this embodiment, the monitoring voltage VA is generated by the voltage division effectively making use of the resistance elements RD1 and RD2 included in the amplifier AMD1 and the resistance elements RD3 and RD4 included in the amplifier AMD2.

That is, as a method of a comparative example of this embodiment, it is conceivable to adopt a method of separately providing circuits that divide the voltage of the output signal QD1 and the voltage of the output signal QD2 of the gain adjustment amplifier 76*a* and performing the failure detection using, as a monitoring voltage, a voltage obtained by the voltage division.

However, in the method of the comparative example, a voltage division circuit configured by a plurality of resistance elements needs to be prepared separately from the gain adjustment amplifier 76*a*. A circuit size increases. In particular, the resistance elements of the voltage division circuit function as paths of a through-current. Therefore, for a reduction in power consumption, it is necessary to increase resistance values of the resistance elements. When the resistance values of the resistance elements are increased, a layout area of the resistance elements increases and the circuit size substantially increases.

In this regard, in this embodiment, the monitoring voltage VA is generated effectively making use of the resistance elements RD1 and RD2 and the resistance elements RD3 and RD4 used for gain adjustment. That is, the monitoring voltage VA is generated at the node ND5 by dividing the voltage of the output signal QD1 and the voltage of the output signal QD2 of the gain adjustment amplifier 76a using the resistance elements RD1 and RD2 of the amplifier AMD1 and the resistance elements RD3 and RD4 of the amplifier AMD2. The monitoring voltage VA is input to the failure detection circuit 160a. Therefore, it is unnecessary to provide a new resistance element for realizing a voltage division circuit. It is possible to realize the failure detection based on the monitoring voltage VA without substantially increasing the circuit size.

The failure detection circuit 160a performs the failure detection of the gain adjustment amplifier 76a on the basis of the monitoring voltage VA at the node ND5. That is, the failure detection circuit 160a performs the failure detection by detecting whether the monitoring voltage VA obtained by the voltage division of the resistance elements RD1 and RD2 and the resistance elements RD3 and RD4 is within the determination voltage range based on (centering on) the analog common voltage VCM. For example, the failure detection circuit 160a performs the failure detection by detecting whether the monitoring voltage VA is within the determination voltage range between the threshold voltage VTH on the high potential side and the threshold voltage VTL on the low potential side.

Specifically, the failure detection circuit 160a includes the comparators CPD1 and CPD2 and the OR circuit ORD1. The threshold voltage VTH on the high potential side is input to the inversion input terminal of the comparator CPD1. The monitoring voltage VA is input to the non-inversion input terminal of the comparator CPD1. The monitoring voltage VA is input to the inversion input terminal of the comparator CPD2. The threshold voltage VTL on the low potential side is input to the non-inversion input terminal of the comparator CPD2. Output signals of the comparators CPD1 and CPD2 are input to the OR circuit ORD1. The OR circuit ORD1 outputs the monitoring result signal DGD (a diagnosis signal or a failure detection signal).

For example, when the monitoring voltage VA is within the determination voltage range between the threshold voltage VTH and the threshold voltage VTL, the monitoring result signal DGD changes to the L level to inform the control unit 140 and the like that a failure is not detected. On the other hand, when the monitoring voltage VA is outside the determination voltage range, the monitoring result signal DGD changes to the H level to inform the control unit 140 and the like that a failure is detected.

For example, in FIG. 13, the resistance elements RD1 to RD4 are resistance elements having variable resistance values. The gain GD in the gain adjustment amplifier 76a is adjusted by adjusting the resistance values of the resistance elements. For example, the resistance value of the resistance elements RD1 and RD3 is represented as R1, the resistance value of the resistance elements RD2 and RD4 is represented as R2, and a reference resistance value is represented as R. Then, the resistance values R1 and R2 for setting the gain GD can be represented as R1=R/GD and R2=R×(1−1/GD).

The voltage VD1 at the node ND3 of the inversion input terminal of the operational amplifier OPD1 is equalized with the voltage of the signal QC1 by the virtual grounding by the operational amplifier OPD1. Therefore, the following Expression (1) holds.

$$QD1 = VA + \{(R1+R2)/R1\} \times \{VD1 - VA\} \qquad (1)$$
$$= VA + \{(R1/R2)/R1\} \times (QC1 - VA)$$

The voltage VD2 at the node ND4 of the inversion input terminal of the operational amplifier OPD2 is equalized with the voltage of the signal QC2 by the virtual grounding by the operational amplifier OPD2. Therefore, the following Expression (2) holds.

$$QD2 = VA + \{(R1+R2)/R1\} \times \{VD2 - VA\} \qquad (2)$$
$$= VA + \{(R1/R2)/R1\} \times (QC2 - VA)$$

As explained above, the resistance values are represented as R1=R/GD and R2=R×(1−1/GD) using the gain GD of the gain adjustment amplifier 76a. Therefore, the following Expression (3) holds.

$$(R1+R2)/R1=GD \qquad (3)$$

Therefore, the above Expressions (1) and (2) can be represented as the following Expressions (4) and (5).

$$QD1 = VA + GD \times (QC1 - VA) \qquad (3)$$
$$= (1 - GD) \times VA + GD \times QC1$$
$$QD2 = VA + GD \times (QC2 - VA)$$
$$QD2 = (1 - GD) \times VA + GD \times QC2 \qquad (4)$$

The monitoring voltage VA is a voltage obtained by dividing the voltage of the signal QD1 and the voltage of the signal QD2 with the resistance elements RD1 and RD2, a resistance value of which is R1+R2, and the resistance elements RD3 and RD4, a resistance value of which is R1+R2. That is, the monitoring voltage VA is a midpoint voltage between the voltage of the signal QD1 and the voltage of the signal QD2 and is represented as VA=(QD1+QD2)/2. Therefore, the following Expression (6) holds.

$$QD1+QD2=2 \times VA \qquad (6)$$

The following Expression (7) is derived from the above Expressions (4) and (5).

$$QD1 - QD2 = \{(1 - GD) \times VA + GD \times QC1\} - \qquad (7)$$
$$\{(1 - GD) \times VA + GD \times QC2\}$$
$$= GD \times (QC1 - QC2)$$

The following Expressions (8) and (9) are derived from the above Expressions (6) and (7).

$$QD1=VA+(GD/2) \times (QC1-QC2) \qquad (8)$$
$$QD2=VA-(GD/2) \times (QC1-QC2) \qquad (9)$$

The signals QC1 and QC2 are differential signals having the analog common voltage VCM as a midpoint voltage and are represented as VCM=(QC1+QC2)/2. Therefore, the following Expression (10) holds.

$$QC1+QC2=2 \times VCM \qquad (10)$$

The following Expression (11) holds from the above Expressions (4), (5), (6), and (10).

$$QD1 + QD2 = 2 \times (1 - GD) \times VA + GD \times (QC1 + QC2) \quad (11)$$
$$= 2 \times (1 - GD) \times VA + GD \times 2 \times VCM$$
$$= 2 \times VA$$

Therefore, VA=VCM holds from the above Expression (11). That is, when the input signals QC1 and QC2 of the gain adjustment amplifier are differential signals having the analog common voltage VCM as a midpoint voltage, the output signals QD1 and QD2 of the gain adjustment amplifier are also differential signals centering on the analog common voltage VCM=VA. Therefore, eventually, the following Expressions (12), (13), and (14) hold.

$$QD1=VCM+(GD/2)\times(QC1-QC2) \quad (12)$$

$$QD2=VCM-(GD/2)\times(QC1-QC2) \quad (13)$$

$$QD1-QD2=GD\times(QC1-QC2) \quad (14)$$

As explained above, when the differential signals QC1 and QC2 having the analog common voltage VCM as the midpoint voltage are input, the gain adjustment amplifier 76a outputs signals of QD1=VCM+(GD/2)×(QC1−QC2) and QD2=VCM−(GD/2)×(QC1−QC2). That is, the gain adjustment amplifier 76a outputs the differential signals QD1 and QD2 obtained by multiplying a differential component (QC1−QC2) between the signals QC1 and QC2 with the gain GD and having the analog common voltage VCM as the midpoint voltage.

Figure 14A:
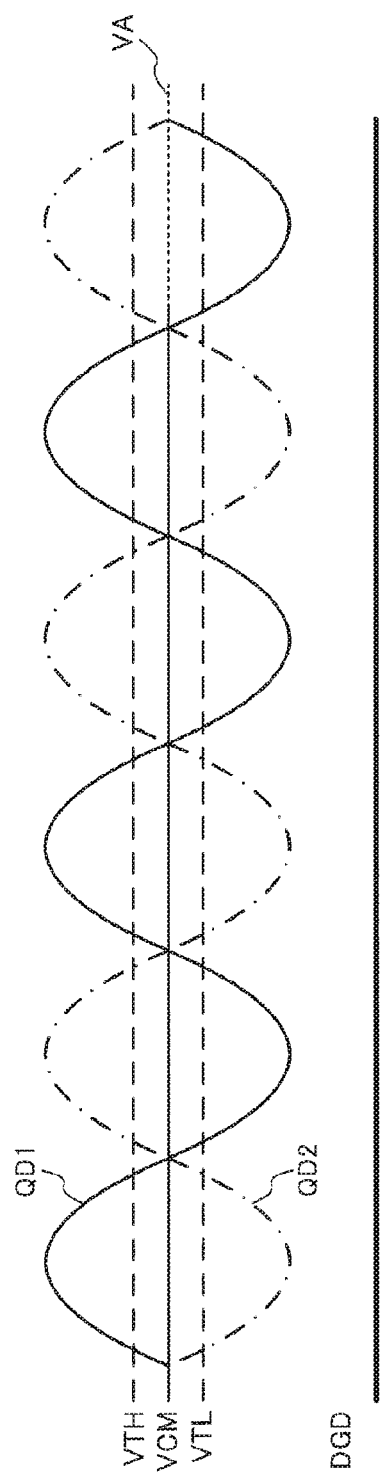
FIG. 14A is a signal waveform chart for explaining the operation of the circuit device according to the second embodiment.
Figure 14B:
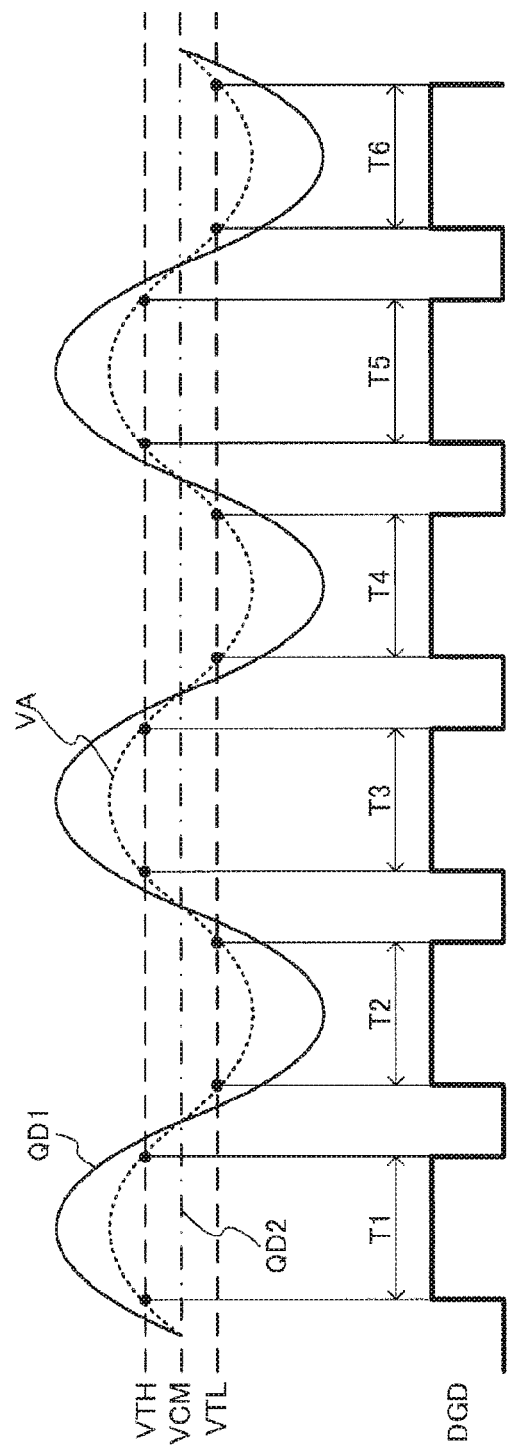
FIG. 14B is a signal waveform chart for explaining the operation of the circuit device according to the second embodiment.

FIGS. 14A and 14B are signal waveform charts for explaining the operation of the circuit device according to this embodiment. FIG. 14A shows signal waveforms at the time when a failure does not occur. FIG. 14B shows signal waveforms at the time when a failure occurs.

As explained above, the gain adjustment amplifier 76a outputs the differential signals QD1 and QD2 having the analog common voltage VCM as the midpoint voltage. Therefore, as shown in FIG. 14A, the signal QD1 and the signal QD2 have symmetrical signal waveforms centering on (based on) the analog common voltage VCM. That is, when the signal QD1 is a positive voltage with respect to the analog common voltage VCM, the signal QD2 is a negative voltage with respect to the analog common voltage VCM. When the signal QD1 is a negative voltage with respect to the analog common voltage VCM, the signal QD2 is a positive voltage with respect to the analog common voltage VCM. That is, voltage levels of the signals QD1 and QD2 change according to the signals QC1 and QC2 as represented as QD1=VCM+(GD/2)×(QC1−QC2) and QD2=VCM−(GD/2)×(QC1−QC2) in the above Expressions (12) and (13). A relation of (QD1+QD2)/2=VCM holds.

The monitoring voltage VA is obtained by dividing the voltage of the signal QD1 and the voltage of the signal QD2 with the resistance elements RD1 and RD2 and the resistance elements RD3 and RD4 and is a midpoint voltage between the voltage of the signal QD1 and the voltage of the signal QD2. Therefore, VA=(QD1+QD2)/2=VCM. The monitoring voltage VA coincides with the analog common voltage VCM.

As shown in FIG. 14A, the determination voltage range by the failure detection circuit 160a is a voltage range specified by the threshold voltages VTH and VTL. For example, (VTH+VTL)/2=VCM holds. That is, the analog common voltage VCM is a midpoint voltage between the threshold voltages VTH and VTL.

When a failure does not occur, as shown in FIG. 14A, the monitoring voltage VA is within the determination voltage range specified by the threshold voltages VTH and VTL. As a result, the failure detection circuit 160a outputs the monitoring result signal DGD of the L level.

FIG. 14B shows signal waveforms, for example, at the time when a failure occurs in which the signal QD2 is short-circuited with the analog common voltage VCM. In this case, the signal QD1 and the signal QD2 do not have symmetrical signal waveforms centering on the analog common voltage VCM. Therefore, a voltage level of the monitoring voltage VA fluctuates.

That is, a voltage level of the signal QD1 changes according to the signals QC1 and QC2 such that the signal QD1 is represented as QD1=VCM+(GD/2)×(QC1−QC2). However, the signal QD2 is short-circuited with the analog common voltage VCM. A relation of QD2=VCM−(GD/2)× (QC1−QC2) does not hold. The signal QD2 is equal to the analog common voltage VCM. Therefore, although VA= (QD1+QD2)/2=VCM holds in FIG. 14A, VA=(QD1+QD2)/ 2=VCM does not hold in FIG. 14B. That is, a voltage level of the monitoring voltage VA fluctuates such that the monitoring voltage VA is represented as VA=(QD1+QD2)/2= (QD1+VCM)/2=VCM+(GD/4)×(QC1−QC2).

In a period T1 in FIG. 14B, the monitoring voltage VA exceeds the threshold voltage VTH and changes to a voltage outside the determination voltage range. Therefore, the monitoring result signal DGD changes to the H level. In a period T2, the monitoring voltage VA falls below the threshold voltage VTL and changes to a voltage outside the determination voltage range. Therefore, the monitoring result signal DGD changes to the H level. The same applies to periods T3, T4, T5, and T6. A failure can be detected from these determination results.

Specifically, for example, when a time period in which the monitoring voltage VA is outside the determination range is equal to or longer than a specified time, it is determined that a failure (abnormality) has occurred. For example, when the monitoring result signal DGD, which is a monitoring result, may be cyclically monitored and, when the number of times the monitoring result signal DGD changes to the H level is equal to or larger than a specified number of times, it may be determined that a failure has occurred. Alternatively, when a duty ratio (a ratio of a period of the H level) of the monitoring result signal DGD is equal to or higher than a specified duty ratio, it may be determined that a failure has occurred.

As explained above, in this embodiment, the failure detection is performed by detecting whether the monitoring voltage VA, which is the midpoint voltage between the voltage of the output signal QD1 and the voltage of the output signal QD2 of the gain adjustment amplifier 76a, is within the determination voltage range based on (centering on) the analog common voltage VCM. Consequently, it is possible to properly realize, with a simple circuit configuration, individual failure detection of the gain adjustment amplifier 76a.

Figure 15:
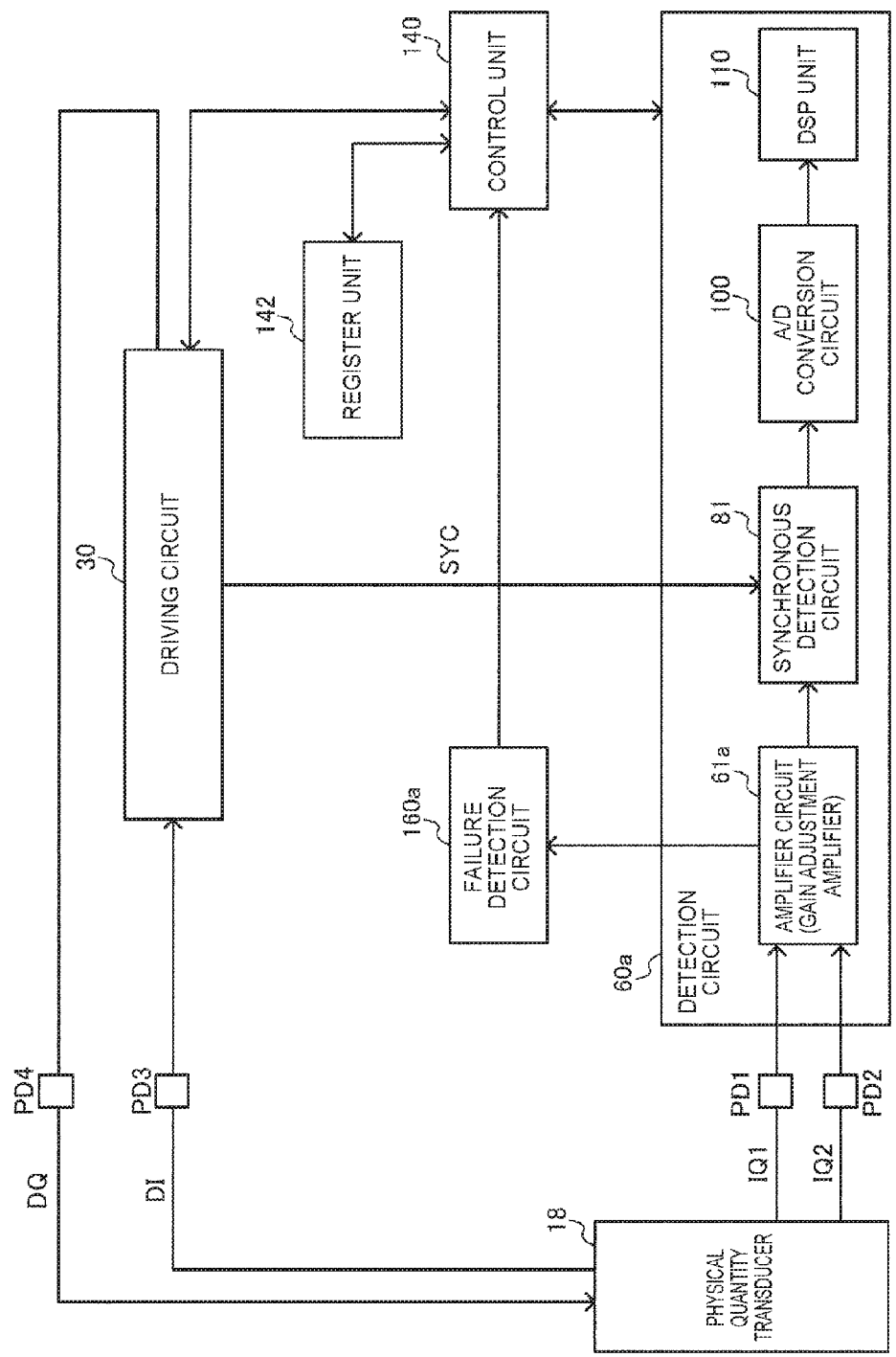
FIG. 15 is an overall system configuration example of the circuit device according to the second embodiment.

FIG. 15 is an overall system configuration example of the circuit device according to this embodiment. The circuit device shown in FIG. 15 includes the driving circuit 30, a detection circuit 60a, the control unit 140, the register unit 142, and the failure detection circuit 160a.

The driving circuit 30 drives the physical quantity transducer 18. For example, the driving circuit 30 receives the feedback signal DI from the physical quantity transducer 18 and outputs the driving signal DQ corresponding to the feedback signal DI to drive the physical quantity transducer 18. For example, the first and second detection signals IQ1 and IQ2 from the physical quantity transducer 18 are input to the detection circuit 60a of the circuit device via the terminals PD1 and PD2 (the pads). The feedback signal DI from the physical quantity transducer 18 is input to the driving circuit 30 of the circuit device via the terminal PD3 (the pad). The driving circuit 30 outputs the driving signal DQ to the physical quantity transducer 18 via the terminal PD4 (the pad).

The detection circuit 60a includes an amplifier circuit 61a, the A/D conversion circuit 100, and the DSP unit 110 (the digital-signal processing unit). The amplifier circuit 61a includes the gain adjustment amplifier 76a explained with reference to FIGS. 12 and 13. In this way, the circuit device according to this embodiment includes the driving circuit 30 that drives the physical quantity transducer 18 and the detection circuit 60a to which the first and second detection signals IQ1 and IQ2 from the physical quantity transducer 18 are input. The detection circuit 60a is configured by the first and second operational amplifiers OPD1 and OPD2 and the first and second voltage division circuits 77 and 78 as shown in FIGS. 12 and 13. The detection circuit 60a includes the gain adjustment amplifier 76a to which the first and second signals QC1 and QC2 corresponding to the first and second detection signals IQ1 and IQ2 are input. Details of the amplifier circuit 61a, the A/D conversion circuit 100, and the DSP unit 110 are explained below.

Note that the detection circuit 60a is not limited to the configuration shown in FIG. 15. Various modified implementations such as omission of a part of the components thereof and addition of other components are possible. For example, the detection circuit 60a may be the detection circuit 60a of a type that does not include the A/D conversion circuit 100 and the DSP unit 110 and outputs an analog detection result.

The control unit 140 performs various kinds of control processing. For example, the control unit 140 performs control processing of the driving circuit 30 and control processing of the detection circuit 60a. The control unit 140 receives the monitoring result signal DGD from the failure detection circuit 160a and performs failure determination processing. That is, the control unit 140 performs the various kinds of failure determination processing explained with reference to FIGS. 14A and 14B. The control unit 140 can be realized by, for example, a logic circuit generated by an automatic arrangement and wiring method such as a gate array or a processor that operates on the basis of firmware or the like.

The register unit 142 includes a register in which various kinds of information are set. The register unit 142 can be realized by, for example, a memory such as an SRAM or a flip-flop circuit. For example, failure determination result information in the control unit 140 is stored in the register unit 142. An external controller or the like can read out the failure determination result information by accessing the register unit 142.

Figure 16:
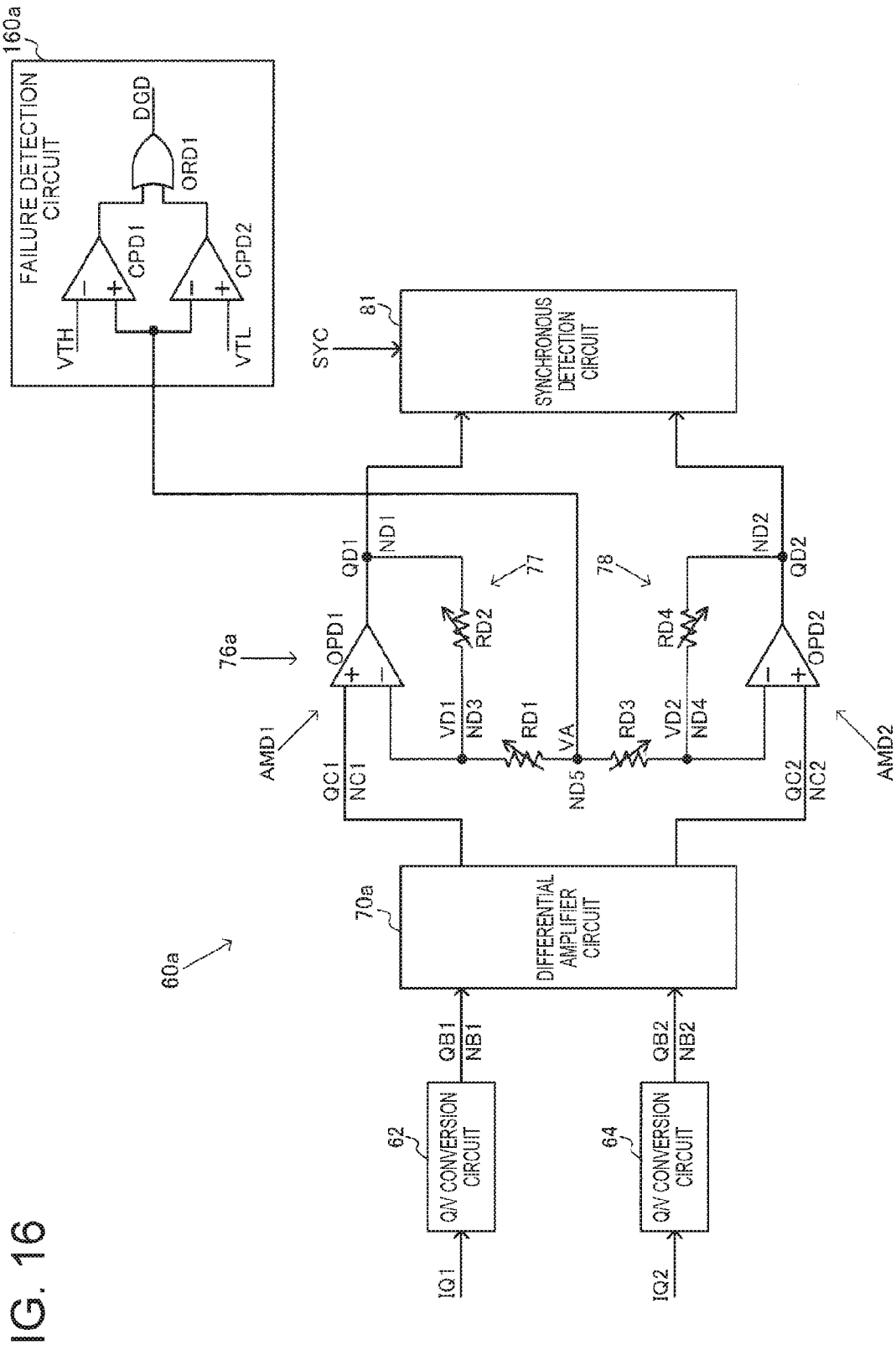
FIG. 16 is a configuration example of a detection circuit in the second embodiment.

A configuration example of the detection circuit 60a is shown in FIG. 16. Note that the detection circuit 60a is not limited to a configuration shown in FIG. 16. Various modified implementations such as omission of a part of the components and addition of other components are possible.

The detection circuit 60a includes the Q/V conversion circuits 62 and 64 (the first and second charge/voltage conversion circuits). The first detection signal IQ1 is input to the Q/V conversion circuit 62. The Q/V conversion circuit 62 outputs the first signal QB1. The second detection signal IQ2 is input to the Q/V conversion circuit 64. The Q/V conversion circuit 64 outputs the second signal QB2.

The Q/V conversion circuits 62 and 64 (charge amplifiers) are circuits that convert a charge signal (a micro charge signal or a micro current signal) from the physical quantity transducer 18 into a voltage signal. The Q/V conversion circuits 62 and 64 can also be considered a type of an I/V conversion circuit. For example, the Q/V conversion circuit 62 converts the first detection signal IQ1, which is a micro charge signal, into the first signal QB1, which is a voltage signal. The Q/V conversion circuit 64 converts the second detection signal IQ2, which is a micro charge signal, into the second signal QB2, which is a voltage signal. The first and second signals QB1 and QB2 after the conversion are also differential signals of opposite phases each other. The Q/V conversion circuits 62 and 64 include, for example, operational amplifiers and feedback capacitors. The Q/V conversion circuits 62 and 64 may include feedback resistance elements.

The detection circuit 60a includes a differential amplifier circuit 70a that is provided on a pre-stage side of the gain adjustment amplifier 76a and outputs the first and second signals QC1 and QC2 to the gain adjustment amplifier 76a. The differential amplifier circuit 70a performs differential amplification of the signals QB1 and QB2 output from the Q/V conversion circuits 62 and 64 and outputs the signals QC1 and QC2 after the differential amplification. For example, the differential amplifier circuit 70a performs differential amplification for amplifying a differential component (a difference) between the signals QB1 and QB2 and outputs the signals QC1 and QC2, which are differential signals. By performing such differential amplification, it is possible to remove an unnecessary signal having a phase same as the phase of the desired signal.

The detection circuit 60a includes the synchronous detection circuit 81 that is provided on a post stage side of the gain adjustment amplifier 76a and performs synchronous detection on the basis of the synchronization signal SYC from the driving circuit 30. The synchronous detection circuit 81 performs the synchronous detection based on the synchronization signal SYC on the output signals QD1 and QD2 from the gain adjustment amplifier 76a and performs, while removing an unnecessary signal, synchronous detection for extracting a desired signal.

As explained above, with the circuit device according to this embodiment, the differential input/differential output gain adjustment amplifier 76a is realized by combining the two amplifiers AMD1 and AMD2. Individual failure detection of the gain adjustment amplifier 76a is realized by monitoring a voltage at the node ND5, to which one end of the resistance element RD1 and one end of the resistance element RD3 of the amplifiers AMD1 and AMD2 are connected in common, with the failure detection circuit 160a as the monitoring voltage VA. Consequently, it is possible to perform proper failure detection of the gain adjustment amplifier 76a and achieve improvement of reliability and the like.

For example, in the detection circuit 60a shown in FIG. 16, in a method of simply performing overall failure diagnosis, when the gain adjustment amplifier 76a individually fails, the failure is likely to be overlooked.

In this regard, in this embodiment, the monitoring voltage VA of the node ND5, to which one end of the resistance element RD1 and one end of the resistance element RD3 are connected in common, is monitored and failure detection is performed effectively making use of the resistance elements RD1 to RD4 of the amplifiers AMD1 and AMD2. Therefore, it is possible to perform individual failure detection of the gain adjustment amplifier 76a. Therefore, for example, even when a failure occurs in the gain adjustment amplifier 76a over time, it is possible to appropriately cope with the failure and greatly improve reliability for the failure.

2. Detailed Configurations of an Electronic Apparatus, a Gyro Sensor, and a Circuit Device In FIG. 17, a detailed configuration example of a circuit device 20a, a gyro sensor 510a (in a broad sense, a physical-quantity detecting apparatus) including the circuit device 20a, and an electronic apparatus 500a including the gyro sensor 510a according to the second embodiment is shown.

Figure 17:
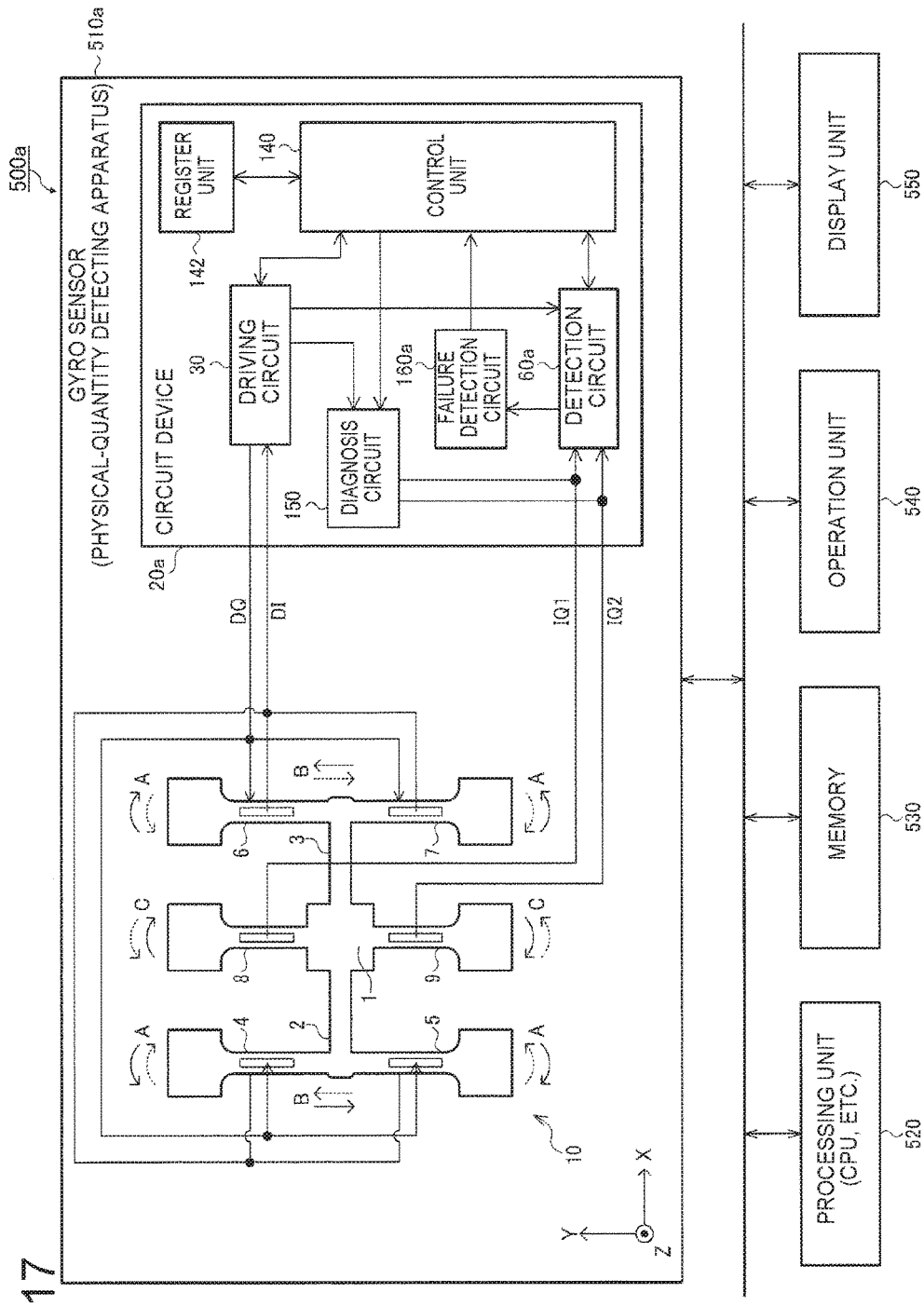
FIG. 17 is a configuration example of the circuit device, an electronic apparatus, and a gyro sensor (a physical-quantity detecting apparatus) according to the second embodiment.

Note that the circuit device 20a, the electronic apparatus 500a, and the gyro sensor 510a are not limited to configurations shown in FIG. 17. Various modified implementations such as omission of a part of the components thereof and addition of other components are possible. As the electronic apparatus 500a according to this embodiment, various apparatuses such as a digital camera, a video camera, a smart phone, a cellular phone, a car navigation system, a robot, a biological-information detecting apparatus, a game machine, a clock, a health instrument, and a portable information terminal can be assumed. In the following explanation, an example is explained in which a physical quantity transducer is a piezoelectric vibrator element (a vibration gyro) and a sensor is a gyro sensor. However, the invention is not limited to this. The invention is also applicable to, for example, a vibration gyro of a capacitance detection system formed of a silicon substrate or the like and a physical quantity transducer that detects a physical quantity equivalent to angular velocity information and physical quantities other than the angular velocity information.

The electronic apparatus 500a includes the gyro sensor 510a and the processing unit 520. The electronic apparatus 500a can include the memory 530, the operation unit 540, and the display unit 550. The processing unit 520 (a controller) realized by a CPU, an MPU, or the like performs control of the gyro sensor 510a and the like and overall control of the electronic apparatus 500a. The processing unit 520 performs processing on the basis of angular velocity information (in a broad sense, a physical quantity) detected by the gyro sensor 510a. The processing unit 520 performs processing for camera shake correction, posture control, GPS autonomous navigation, and the like on the basis of, for example, the angular velocity information. The memory 530 (a ROM, a RAM, etc.) stores a control program and various data and functions as a work area and a data storage area. The operation unit 540 is used by a user to operate the electronic apparatus 500a. The display unit 550 displays various kinds of information to the user.

The gyro sensor 510a (the physical-quantity detecting apparatus) includes the vibrator element 10 and the circuit device 20a. The vibrator element 10 (in a broad sense, a physical quantity transducer) is a piezoelectric vibrator element formed of a thin plate of a piezoelectric material such as quartz crystal. Specifically, the vibrator element 10 is a vibrator element of a double T type formed of a Z-cut quartz substrate.

The circuit device 20a includes the driving circuit 30, the detection circuit 60a, the control unit 140, the register unit 142, the diagnosis circuit 150, and the failure detection circuit 160a. Note that various modified implementations such as omission of apart of these components and addition of other components are possible.

The driving circuit 30 outputs the driving signal DQ and drives the vibrator element 10. For example, the driving circuit 30 receives the feedback signal DI from the vibrator element 10 and outputs the driving signal DQ corresponding to the feedback signal DI to excite the vibrator element 10. The detection circuit 60a receives the detection signals IQ1 and IQ2 (detection currents or charges) from the vibrator element 10 driven by the driving signal DQ and detects (extracts), from the detection signals IQ1 and IQ2, a desired signal (a Coriolis force signal) corresponding to a physical quantity applied to the vibrator element 10.

The diagnosis circuit 150 is a circuit for diagnosing (self-diagnosing) the detection circuit 60a (the circuit device) in the diagnosis mode (the diagnosis period). For example, the diagnosis circuit 150 performs an operation for generating a pseudo-desired signal (a pseudo angular velocity signal, etc.) for diagnosing the detection circuit 60a and supplying the pseudo-desired signal to the detection circuit 60a. Diagnosis for determining whether the detection circuit 60a and the like are normally operating is performed on the basis of a detection result of the pseudo-desired signal. Note that details of the diagnosis circuit 150 are explained below.

The vibrator element 10 includes the base 1, the coupling arms 2 and 3, the driving arms 4, 5, 6, and 7, and the detection arms 8 and 9. The detection arms 8 and 9 extend in the +Y-axis direction and the −Y-axis direction with respect to the base 1 having a rectangular shape. The coupling arms 2 and 3 extend in the −X-axis direction and the +X-axis direction with respect to the base 1. The driving arms 4 and 5 extend in the +Y-axis direction and the −Y-axis direction with respect to the coupling arm 2. The driving arms 6 and 7 extend in the +Y-axis direction and the −Y-axis direction with respect to the coupling arm 3. Note that the X axis, the Y axis, and the Z axis indicate the axes of quartz crystal. The X axis, the Y axis, and the Z axis are also respectively called electric axis, mechanical axis, and optical axis.

The driving signal DQ from the driving circuit 30 is input to drive electrodes provided on the upper surfaces of the driving arms 4 and 5 and drive electrodes provided on side surfaces of the driving arms 6 and 7. Signals from drive electrodes provided on side surfaces of the driving arms 4 and 5 and drive electrodes provided on the upper surfaces of the driving arms 6 and 7 are input to the driving circuit 30 as the feedback signal DI. Signals from detection electrodes provided on the upper surfaces of the detection arms 8 and 9 are input to the detection circuit 60a as the detection signals IQ1 and IQ2. Note that common electrodes provided on side surfaces of the detection arms 8 and 9 are, for example, grounded.

When the driving signal DQ of an alternating current is applied by the driving circuit 30, the driving arms 4, 5, 6, and 7 perform flexural vibration (excitation vibration) as indicated by an arrow A according to an inverse piezoelectric effect. That is, the driving arms 4, 5, 6, and 7 perform flexural vibration in which the distal ends of the driving arms 4 and 6 repeat approach and separation each other and the distal ends of the driving arms 5 and 7 also repeat approach and separation each other. At this point, the driving arms 4 and 5 and the driving arms 6 and 7 are performing symmetrical vibration with respect to the Y axis that passes the center of gravity position of the base 1. Therefore, the base 1, the coupling arms 2 and 3, and the detection arms 8 and 9 hardly vibrate.

In this state, when angular velocity about the Z axis serving as a rotation axis is applied to the vibrator element 10 (when the vibrator element 10 rotates about the Z axis), the driving arms 4, 5, 6, and 7 vibrate as indicated by an arrow B with the Coriolis force. That is, the Coriolis force in a direction of the arrow B orthogonal to a direction of the arrow A and a direction of the Z axis acts on the driving arms 4, 5, 6, and 7, whereby a vibration component in the direction of the arrow B is generated. The vibration in the arrow B direction is transmitted to the base 1 via the coupling arms 2 and 3. The detection arms 8 and 9 perform flexural vibration in a direction of an arrow C. A charge signal generated by a piezoelectric effect by the flexural vibration of the detection arms 8 and 9 is input to the detection circuit 60$a$ as the detection signals IQ1 and IQ2. The vibration in the arrow B direction of the driving arms 4, 5, 6, and 7 is vibration in a circumferential direction with respect to the center of gravity position of the base 1. The vibration of the detection arms 8 and 9 is vibration in the direction of the arrow C in a direction opposite to the arrow B direction in the circumferential direction. Therefore, the detection signals IQ1 and IQ2 are signals having a phase 90 degrees shifted from the phase of the driving signal DQ.

For example, when the angular velocity of the vibrator element 10 (the gyro sensor) around the Z axis is represented as ω, the mass of the vibrator element 10 is represented as m, and the vibration speed of the vibrator element 10 is represented as v, the Coriolis force is represented as Fc=2 m·v·ω. Therefore, the detection circuit 60$a$ can calculate the angular velocity ω by detecting a desired signal, which is a signal corresponding to the Coriolis force. The processing unit 520 can perform various kinds of processing for camera shake correction, posture control, GPS autonomous navigation, and the like by using the calculated angular velocity ω.

Note that, in the example shown in FIG. 17, the vibrator element 10 is the double T type. However, the vibrator element 10 in this embodiment is not limited to such a structure. The vibrator element 10 may be, for example, a tuning fork type, an H type, or the like. The piezoelectric material of the vibrator element 10 may be a material such as ceramics or silicon other than quartz crystal.

Figure 18:
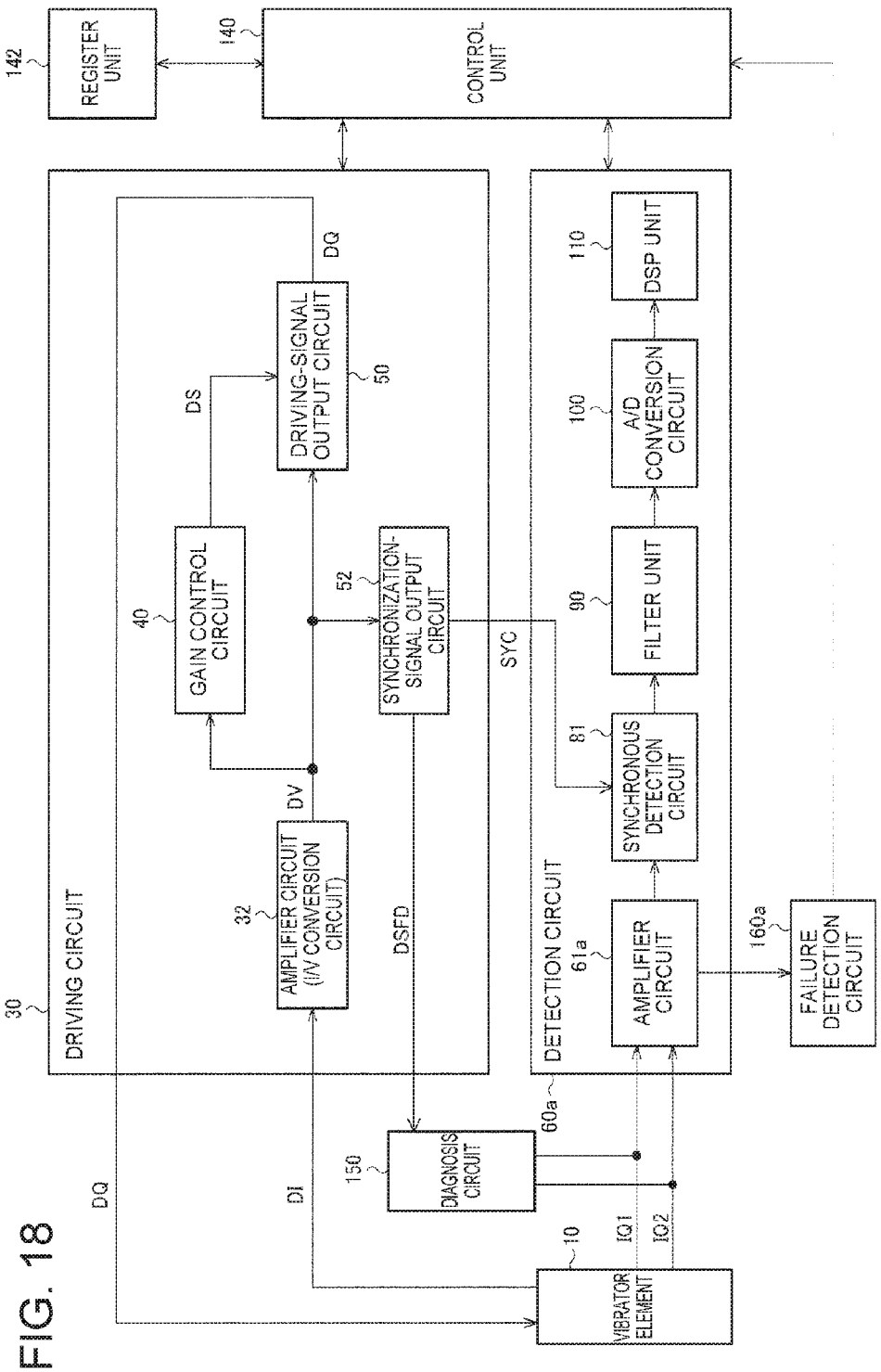
FIG. 18 is a detailed configuration example of a driving circuit and the detection circuit in the second embodiment.

A detailed configuration example of the driving circuit 30 and the detection circuit 60$a$ of the circuit device is shown in FIG. 18.

The driving circuit 30 includes the amplifier circuit 32 to which the feedback signal DI from the vibrator element 10 is input, the gain control circuit 40 that performs automatic gain control, and the driving-signal output circuit 50 that outputs the driving signal DQ to the vibrator element 10. The driving circuit 30 includes the synchronization-signal output circuit 52 that outputs the synchronization signal SYC to the detection circuit 60$a$. Note that the configuration of the driving circuit 30 is not limited to FIG. 18. Various modified implementations such as omission of a part of these components and addition of other components are possible.

The amplifier circuit 32 (the I/V conversion circuit) amplifies the feedback signal DI from the vibrator element 10. For example, the amplifier circuit 32 converts the signal DI of an electric current from the vibrator element 10 into the signal DV of a voltage and outputs the signal DV. The amplifier circuit 32 can be realized by an operational amplifier, a feedback resistance element, a feedback capacitor, and the like.

The driving-signal output circuit 50 outputs the driving signal DQ on the basis of the signal DV after the amplification by the amplifier circuit 32. For example, when the driving-signal output circuit 50 outputs a driving signal of a rectangular wave (or a sine wave), the driving-signal output circuit 50 can be realized by a comparator and the like.

The gain control circuit 40 (AGC) outputs the control voltage DS to the driving-signal output circuit 50 and controls the amplitude of the driving signal DQ. Specifically, the gain control circuit 40 monitors the signal DV and controls a gain of an oscillation loop. For example, in the driving circuit 30, the amplitude of the driving voltage supplied to the vibrator element 10 (the vibrator element for driving) needs to be kept fixed in order to keep the sensitivity of the gyro sensor fixed. Therefore, the gain control circuit 40 for automatically adjusting a gain is provided in an oscillation loop of a drive vibration system. The gain control circuit 40 variably automatically adjusts the gain such that the amplitude of the feedback signal DI from the vibrator element 10 (vibration speed v of the vibrator element) is fixed. The gain control circuit 40 can be realized by a full-wave rectifier that full-wave rectifies the output signal DV of the amplifier circuit 32, an integrator that performs integration processing of an output signal of the full-wave rectifier, and the like.

The synchronization-signal output circuit 52 receives the signal DV after the amplification by the amplifier circuit 32 and outputs the synchronization signal SYC (a reference signal) to the detection circuit 60$a$. The synchronization-signal output circuit 52 can be realized by a comparator that performs binarization processing of the signal DV of a sine wave (an alternating current) and generates the synchronization signal SYC of a rectangular wave, a phase adjustment circuit (a phase shifter) that performs phase adjustment of the synchronization signal SYC, and the like.

The synchronization-signal output circuit 52 outputs a signal DSFD to the diagnosis circuit 150. The signal DSFD is a signal having a phase same as the phase of the synchronization signal SYC and is generated by, for example, a comparator that performs binarization processing of the signal DV of the sine wave. Note that the synchronization signal SYC itself may be output to the diagnosis circuit 150 as the signal DSFD.

The detection circuit 60$a$ includes the amplifier circuit 61$a$, the synchronous detection circuit 81, the filter unit 90, the A/D conversion circuit 100, and the DSP unit 110. The amplifier circuit 61$a$ receives the first and second detection signals IQ1 and IQ2 from the vibrator element 10 and performs charge-voltage conversion, differential signal amplification, gain adjustment, and the like. The synchronous detection circuit 81 performs synchronous detection on the basis of the synchronization signal SYC from the driving circuit 30. The filter unit 90 (a low-pass filter) functions as a pre-filter of the A/D conversion circuit 100. The filter unit 90 also functions as a circuit that attenuates an unnecessary signal that cannot be fully removed by the synchronous detection. The A/D conversion circuit 100 performs A/D conversion of a signal after the synchronous detection. The DSP unit 110 performs digital signal processing such as digital filter processing and digital correction processing on a digital signal from the A/D conversion circuit 100.

Note that, for example, the detection signals IQ1 and IQ2, which are charge signals (current signals), from the vibrator element 10 have a phase 90 degrees behind the phase of the driving signal DQ, which is a voltage signal. The phase delays 90 degrees in a Q/V conversion circuit and the like of the amplifier circuit 61$a$. Therefore, an output signal of the amplifier circuit 61$a$ has a phase 180 degrees behind the phase of the driving signal DQ. Therefore, for example, by performing the synchronous detection using the synchronization signal SYC in phase with the driving signal DQ (DV), it is possible to remove an unnecessary signal or the like having a phase 90 degrees behind the phase of the driving signal DQ.

The control unit 140 performs control processing of the circuit device 20a. The control unit 140 can be realized by a logic circuit (a gate array, etc.), a processor, and the like. Various kinds of switch control, mode setting, and the like in the circuit device 20a are performed by the control unit 140.

Note that, in FIG. 18, a configuration example of a circuit device of a digital gyro that outputs detected angular velocity as digital data is shown. However, this embodiment is not limited to this and may be a configuration of a circuit device of an analog gyro that outputs detected angular velocity as an analog voltage (a DC voltage).

3. Detailed Circuit Configuration Example of the Detection Circuit

Figure 19:
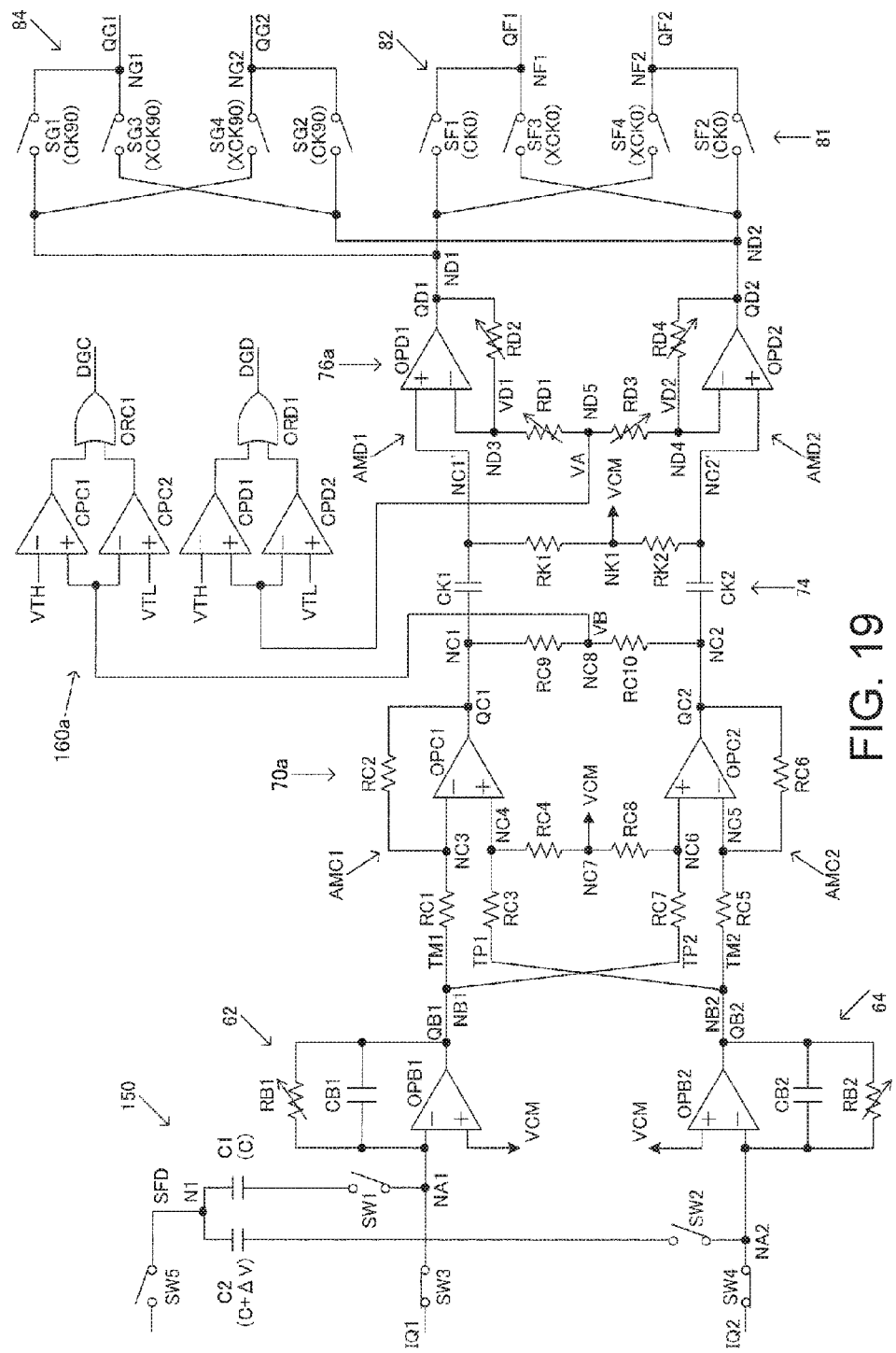
FIG. 19 is a more detailed configuration example of the detection circuit in the second embodiment.

A more detailed configuration example of the detection circuit 60a is shown in FIG. 19. Note that the detection circuit 60a is not limited to a configuration shown in FIG. 19. Various modified implementations such as omission of a part of these components and addition of other components are possible.

The diagnosis circuit 150 includes the first and second capacitors C1 and C2. The first capacitor C1 is provided between the input node NA1 of the Q/V conversion circuit 62, to which the detection signal IQ1 is input, and the first node N1. The second capacitor C2 is provided between the input node NA2 of the Q/V conversion circuit 64, to which the detection signal IQ2 is input, and the first node N1. The input nodes NA1 and NA2 are nodes on one end sides of the first and second capacitors C1 and C2. The first node N1 is a node on the other end sides of the first and second capacitors C1 and C2.

A capacity value of the second capacitor C2 is different from a capacity value of the first capacitor C1. For example, when the capacity value of the first capacitor C1 is represented as C, the capacity value of the second capacitor C2 is C+ΔC. ΔC may be a positive capacity value or may be a negative capacity value. A ratio of ΔC (the absolute value of ΔC) to the capacity value C can be set to, for example, approximately 5% to 30%.

During the diagnosis mode (the diagnosis period), the diagnosis signal SFD is input to the first node N1. For example, after power-on and before a normal operation period, the diagnosis signal SFD is supplied to the first node N1. Diagnosis processing (self-diagnosis) of the detection circuit 60a (the circuit device) is executed. For example, the diagnosis signal SFD is not a signal supplied from the outside of the circuit device and is a signal generated on the inside of the circuit device. For example, as shown in FIG. 18, the diagnosis signal SFD is a signal generated on the basis of the signal DSFD from the driving circuit 30. Specifically, the diagnosis signal SFD is a signal having a phase same as (substantially the same as) the phase of the synchronization signal SYC (the reference signal) output by the driving circuit 30.

In this way, the diagnosis signal SFD is input to the first node N1 in the diagnosis mode. Consequently, the Q/V conversion circuit 62 outputs the signal QB1 having first voltage amplitude corresponding to a first capacity ratio of the first capacitor C1 and the feedback capacitor of the Q/V conversion circuit 62. The Q/V conversion circuit 64 outputs the signal QB2 having second voltage amplitude corresponding to a second capacity ratio of the second capacitor C2 and the feedback capacitor of the Q/V conversion circuit 64. Since the capacity values of the first and second capacitors C1 and C2 are different, the first and second capacity ratios are also different capacity ratios. Therefore, the first voltage amplitude of the signal QB1 output by the Q/V conversion circuit 62 and the second voltage amplitude of the signal QB2 output by the Q/V conversion circuit 64 are also different voltages. Therefore, a voltage difference between the first and second voltage amplitudes is differentially amplified by the differential amplifier circuit 70a or the like at a post stage. Consequently, in the diagnosis mode, it is possible to supply a desired signal for diagnosis, which is a pseudo-desired signal, to the detection circuit 60a. It is possible to diagnose on the basis of a detection result of the detection circuit 60a for the desired signal for diagnosis whether the detection circuit 60a is normally operating.

The diagnosis circuit 150 includes first, second, third, and fourth switch elements SW1, SW2, SW3, and SW4. The diagnosis circuit 150 includes a fifth switch SW5 for inputting the diagnosis signal SFD to the first node N1. The first switch element SW1 is provided between one end of the first capacitor C1 and the input node NA1. The second switch element SW2 is provided between one end of the second capacitor C2 and the input node NA2.

The third switch element SW3 is provided between the terminal PD1 (FIG. 15) of the circuit device and the input node NA1. The fourth switch element SW4 is provided between the terminal PD2 and the input node NA2.

During the diagnosis mode (the diagnosis period), the first and second switch elements SW1 and SW2 are turned on and the third and fourth switch elements SW3 and SW4 are turned off. Consequently, it is possible to supply the desired signal for diagnosis (the pseudo-desired signal) obtained by using the diagnosis signal SFD to the detection circuit 60a via the turned-on first and second switch elements SW1 and SW2 while cutting off, with the turned-off third and fourth switch elements SW3 and SW4, electric connection to the first and second terminals PD1 and PD2 side.

In the normal operation period, the first and second switch elements SW1 and SW2 are turned off and the third and fourth switch elements SW3 and SW4 are turned on. The normal operation period is a period in which the detection circuit 60a performs a detection operation. That is, the normal operation period is a period in which the detection circuit 60a performs detection processing of a desired signal using the detection signals IQ1 and IQ2. Consequently, in the normal operation period, it is possible to realize detection processing using the first and second detection signals IQ1 and IQ2 input via the turned-on third and fourth switch elements SW3 and SW4 while cutting off, with the turned-off first and second switch elements SW1 and SW2, electric connection to the first and second capacitors C1 and C2 side.

The Q/V conversion circuit 62 includes the operational amplifier OPB1, the feedback capacitor CB1, and the feedback resistance element RB1. The non-inversion input terminal of the operational amplifier OPB1 is set to the analog common voltage VCM. The feedback capacitor CB1 is provided between the output terminal and the inversion input terminal of the operational amplifier OPB1. The feedback resistance element RB1 is also provided between the output terminal and the inversion input terminal of the operational amplifier OPB1. The feedback resistance element RB1 is an element for setting a DC bias point of an output signal of the operational amplifier OPB1. The feedback resistance element RB1 may be omitted.

The Q/V conversion circuit 64 includes the operational amplifier OPB2, the feedback capacitor CB2, and the feedback resistance element RB2. The non-inversion input terminal of the operational amplifier OPB2 is set to the analog common voltage VCM. The feedback capacitor CB2 is provided between the output terminal and the inversion input terminal of the operational amplifier OPB2. The feedback resistance element RB2 is also provided between the output terminal and the inversion input terminal of the operational amplifier OPB2. The feedback resistance element RB2 is an element for setting a DC bias point of an output signal of the operational amplifier OPB2. The feedback resistance element RB2 may be omitted.

The Q/V conversion circuits 62 and 64 store charges of charge signals, which are the detection signals IQ1 and IQ2, from the vibrator element 10 in the feedback capacitors CB1 and CB2 to convert the charge signals into voltage signals. The Q/V conversion circuits 62 and 64 have a low-pass filter characteristic. For example, the capacity values of the feedback capacitors CB1 and CB2 are set such that a cut-off frequency of the Q/V conversion circuits 62 and 64 is sufficiently lower than a driving frequency (a resonance frequency) of the physical quantity transducer 18.

The differential amplifier circuit 70a is provided at a post stage of the Q/V conversion circuits 62 and 64. The differential amplifier circuit 70a includes the first amplifier AMC1 and the second amplifier AMC2. The first amplifier AMC1 is a differential input-to-single-ended output amplifier. The second amplifier AMC2 is also a differential input-to-single-ended output amplifier.

The first amplifier AMC1 includes the first operational amplifier OPC1 and the first to fourth resistance elements RC1 to RC4.

The first resistance element RC1 is provided between the inversion input terminal TM1 (the node NB1) of the first amplifier AMC1 and the inversion input terminal (the node NC3) of the first operational amplifier OPC1. The second resistance element RC2 is provided between the inversion input terminal of the first operational amplifier OPC1 and the output terminal of the first operational amplifier OPC1 (the output terminal of the amplifier AMC1; the node NC1). That is, the first and second resistance elements RC1 and RC2 are connected in series between the inversion input terminal TM1 of the first amplifier AMC1 and the output terminal (NC1) of the first operational amplifier OPC1. The signal QB1 from the Q/V conversion circuit 62 at the pre-stage is input to the inversion input terminal TM1 (−) of the first amplifier AMC1.

The third resistance element RC3 is provided between the non-inversion input terminal TP1 (the node NB2) of the first amplifier AMC1 and the non-inversion input terminal (the node NC4) of the first operational amplifier OPC1. The fourth resistance element RC4 is provided between the non-inversion input terminal (NC4) of the first operational amplifier OPC1 and the node NC7 having the analog common voltage VCM. That is, the third and fourth resistance elements RC3 and RC4 are connected in series between the non-inversion input terminal TP1 of the first amplifier AMC1 and the node NC7. The signal QB2 from the Q/V conversion circuit 64 at the pre-stage is input to the non-inversion input terminal TP1 (+) of the first amplifier AMC1.

The amplifier AMC2 includes the second operational amplifier OPC2 and the fifth to eighth resistance elements RC5 to RC8.

The fifth resistance element RC5 is provided between the inversion input terminal TM2 (the node NB2) of the second amplifier AMC2 and the inversion input terminal (the node NC5) of the second operational amplifier OPC2. The sixth resistance element RC6 is provided between the inversion input terminal (NC5) of the second operational amplifier OPC2 and the output terminal of the second operational amplifier OPC2 (the output terminal of the second amplifier AMC2; the node NC2). That is, the fifth and sixth resistance elements RC5 and RC6 are connected in series between the inversion input terminal TM2 of the second amplifier AMC2 and the output terminal (NC2) of the second operational amplifier OPC2. The signal QB2 from the Q/V conversion circuit 64 at the pre-stage is input to the inversion input terminal TM2(−) of the second amplifier AMC2.

The seventh resistance element RC7 is provided between the non-inversion input terminal TP2 (the node NB1) of the second amplifier AMC2 and the non-inversion input terminal (the node NC6) of the second operational amplifier OPC2. The eighth resistance element RC8 is provided between the non-inversion input terminal (NC6) of the second operational amplifier OPC2 and the node NC7 having the analog common voltage VCM. That is, the seventh and eighth resistance elements RC7 and RC8 are connected in series between the non-inversion input terminal TP2 of the second amplifier AMC2 and the node NC7. The signal QB1 from the Q/V conversion circuit 62 at the pre-stage is input to the non-inversion input terminal TP2 of the second amplifier AMC2.

In this way, the differential amplifier circuit 70a shown in FIG. 19 is configured by the two differential input-to-single-ended output amplifiers AMC1 and AMC2. That is, the differential amplifier circuit 70a is configured by the differential input-to-single-ended output first amplifier AMC1, to the inversion input terminal TM1(−) of which the signal QB1 of the signals QB1 and QB2 forming the differential signals is input and to the non-inversion input terminal TP1 (+) of which the signal QB2 is input, and the differential input-to-single-ended output second amplifier AMC2, to the non-inversion input terminal TP2(+) of which the signal QB1 is input and to the inversion input terminal TM2(−) of which the signal QB2 is input.

By adopting such a configuration, the differential signals QC1 and QC2, voltages of which change to the positive side or the negative side on the basis of the analog common voltage VCM (the analog ground), are output from the differential amplifier circuit 70a. For example, when the signal QC1 is a positive voltage with respect to the analog common voltage VCM, the signal QC2 is a negative voltage with respect to the analog common voltage VCM. When the signal QC1 is a negative voltage with respect to the analog common voltage VCM, the signal QC2 is a positive voltage with respect to the analog common voltage VCM.

For example, a resistance value of the resistance elements RC1, RC3, RC5, and RC7 is represented as R1, a resistance value of the resistance elements RC2, RC4, RC6, and RC8 is represented as R2, and a gain of differential amplification of the differential amplifier circuit 70a is represented as GC, a relation of GC/2=R2/R1 holds. When the signals QB1 and QB2 are input, the differential amplifier circuit 70a outputs the signals QC1 and QC2 indicated by the following expressions.

$$QC1=VCM-(GC/2)\times(QB1-QB2)$$

$$QC2=VCM+(GC/2)\times(QB1-QB2)$$

$$QC1-QC2=-GC\times(QB1-QB2)$$

That is, the differential amplifier circuit 70a outputs the differential signals QC1 and QC2 obtained by multiplying a differential component (QB1−QB2) with the gain GC and inverting a polarity on the basis of the analog common voltage VCM.

The resistance elements RC9 and RC10 are provided between the output node NC1 of the output signal QC1 of the amplifier AMC1 and the output node NC2 of the output signal QC2 of the amplifier AMC2. A voltage division circuit is configured by the resistance elements RC9 and RC10. The monitoring voltage VB obtained by dividing the voltage of the output signal QC1 of the amplifier AMC1 and the voltage of the output signal QC2 of the amplifier AMC2 is generated at the connection node NC8 of the resistance element RC9 and the resistance element RC10. For example, when resistance values of the resistance elements RC9 and RC10 are equal, the monitoring voltage VB is a midpoint voltage between the voltage of the signal QC1 and the voltage of the signal QC2. Therefore, when the voltage of the signal QC1 is represented as VQC1 and the voltage of the signal QC2 is represented as VQC2, the monitoring voltage can be represented as VB=(VQC1+VQC2)/2. The resistance values of the resistance elements RC9 and RC10 are optional.

The failure detection circuit 160a performs failure detection of the differential amplifier circuit 70a on the basis of the monitoring voltage VB. That is, the failure detection circuit 160a performs the failure detection by detecting whether the monitoring voltage VB obtained by the voltage division of the signals QC1 and QC2 is within a determination voltage range based on (centering on) the analog common voltage VCM. For example, the failure detection circuit 160a performs the failure detection by detecting whether the monitoring voltage VB is within a determination voltage range between the threshold voltage VTH on the high potential side and the threshold voltage VTL on the low potential side.

Specifically, the failure detection circuit 160a includes the comparators CPC1 and CPC2 and the OR circuit ORC1 in addition to the components explained with reference to FIG. 13. The threshold voltage VTH on the high potential side is input to the inversion input terminal of the comparator CPC1. The monitoring voltage VB, which is the divided voltage (the midpoint voltage) by the resistance elements RC9 and RC10, is input to the non-inversion input terminal of the comparator CPC1. The monitoring voltage VB is input to the inversion input terminal of the comparator CPC2. The threshold voltage VTL on the low potential side is input to the non-inversion input terminal of the comparator CPC2. Output signals of the comparators CPC1 and CPC2 are input to the OR circuit ORC1. The ORC1 outputs the monitoring result signal DGC (a diagnosis signal or a failure detection signal).

For example, when the monitoring voltage VB is within the determination voltage range between the threshold voltage VTH and the threshold voltage VTL, the monitoring result signal DGC changes to the L level to inform the control unit 140 and the like that a failure is not detected. On the other hand, when the monitoring voltage VB is outside the determination voltage range, the monitoring result signal DGC changes to the H level to inform the control unit 140 and the like that a failure is detected.

Consequently, in FIG. 19, individual failure detection of the differential amplifier circuit 70a is also realized. That is, in the normal state, the output signals QC1 and QC2 of the differential amplifier circuit 70a also have symmetrical signal waveforms centering on the analog common voltage VCM as shown in FIG. 14A. The monitoring voltage VB, which is the midpoint voltage between the output signals QC1 and QC2, coincides with the analog common voltage VCM. On the other hand, when a failure occurs, the symmetry collapses, the output signals QC1 and QC2 change to the signal waveforms shown in FIG. 14B, and a voltage level of the monitoring voltage VB fluctuates. The fluctuation in the monitoring voltage VB is detected by the failure detection circuit 160a (the comparators CPC1 and CPC2 and the OR circuit ORC1). That is, the failure detection circuit 160a detects whether the monitoring voltage VB is within the determination voltage range to perform the failure detection. Consequently, it is possible to realize individual failure detection of the differential amplifier circuit 70a.

Note that the determination voltage range in performing the failure detection of the differential amplifier circuit 70a and the determination voltage range in performing the failure detection of the gain adjustment amplifier 76a may be different. That is, the threshold voltages VTH and VTL on the high potential side and the low potential side for specifying the determination voltage ranges may be set to different voltages.

The high-pass filter unit 74 is provided at a post stage of the differential amplifier circuit 70a. The high-pass filter unit 74 includes the capacitors CK1 and CK2 and the resistance elements RK1 and RK2. One end of the capacitor CK1 is connected to the output node NC1 of the differential amplifier circuit 70a. The other end of the capacitor CK1 is connected to one end of the resistance element RK1. One end of the capacitor CK2 is connected to the output node NC2 of the differential amplifier circuit 70a. The other end of the capacitor CK2 is connected to one end of the resistance element RK2. The other end of the resistance element RK1 and the other end of the resistance element RK2 are connected to the node NK1. The node NK1 is set to the analog common voltage VCM.

By providing the high-pass filter unit 74 at the post stage of the differential amplifier circuit 70a, it is possible to remove DC bias components and the like of the signals QC1 and QC2. Since the node NK1 is set to the analog common voltage VCM, even after passing through the high-pass filter unit 74, the signals QC1 and QC2 from the differential amplifier circuit 70a have symmetrical signal waveforms centering on the analog common voltage VCM.

The gain adjustment amplifier 76a is provided at a post stage of the high-pass filter unit 74. The configuration of the gain adjustment amplifier 76a is as explained with reference to FIG. 13 and the like. Therefore, explanation of the configuration is omitted. Note that, for example, when differential amplification of a signal is performed by only the gain adjustment amplifier 76a, the differential amplifier circuit 70a may be omitted.

The synchronous detection circuit 81 is provided at a post stage of the gain adjustment amplifier 76a. The synchronous detection circuit 81 includes the switching mixer 82 and the switching mixer 84. The switching mixer 82 is a mixer for extraction of a desired signal (angular velocity) (for a normal operation). That is, the switching mixer 82 performs differential synchronous detection on the basis of the synchronization signal SYC from the driving circuit 30 to detect a desired signal. The switching mixer 84 is a mixer for detection (for diagnosis) of an unnecessary signal.

For example, the synchronous detection circuit 81 causes the vibrator element 10 to arbitrarily generate a vibration leak signal. The switching mixer 84 detects the vibration leak signal to perform failure diagnosis of the detection circuit 60a.

For example, in FIG. 17, if vibration energy is balanced between the driving arms 4 and 5 and the driving arms 6 and 7 when the driving arms 4 and 5 and the driving arms 6 and 7 perform flexural vibration, the detection arms 8 and 9 do not perform the flexural vibration in a state in which angular velocity is not applied to the vibrator element 10. On the other hand, the balance of the vibration energy of the driving arms 4 and 5 and the driving arms 6 and 7 is collapsed, the flexural vibration of the detection arms 8 and 9 occurs even in a state in which angular velocity is not applied to the vibrator element 10. The flexural vibration is called leak vibration and is flexural vibration in the direction of the arrow C like the vibration based on the Coriolis force. The vibration based on the Coriolis force (the detection signals IQ1 and IQ2) is a signal having a phase 90 degrees shifted from the phase of the driving signal DQ. However, the leak vibration is vibration in a phase same as the phase of the driving signal DQ. Note that a phase shifts 90 degrees in the Q/V conversion circuits 62 and 64. Therefore, at a stage of the synchronous detection, a signal based on the leak vibration is a signal having a phase 90 degrees shifted from the phase of the synchronization signal SYC.

In this embodiment, a vibration leak component of a desired level is actively generated such that the balance of the vibration energy of the driving arms 4 and 5 and the driving arms 6 and 7 slightly collapses. Mass is differentiated in weight sections at the distal ends of the driving arms 4 and 5 and weight sections at the distal ends of the driving arms 6 and 7 by laser machining or the like to collapse the balance of the vibration energy and cause an arbitrary vibration leak. A level of the vibration leak is a known value. Therefore, it is possible to perform failure diagnosis of the detection circuit 60*a* by detecting a signal of the vibration leak with the switching mixer 84.

The signal QD1 from the gain adjustment amplifier 76*a* at the pre-stage is input to the first input node ND1 of the switching mixer 82. The signal QD2 from the gain adjustment amplifier 76*a* is input to the second input node ND2 of the switching mixer 82. The switching mixer 82 performs differential synchronous detection with the synchronization signal SYC (CK0) from the driving circuit 30 and outputs the differential signals QF1 and QF2 to the first and second output nodes NF1 and NF2.

The switching mixer 82 includes the switch elements SF1, SF2, SF3, and SF4. The switch element SF1 is provided between the first input node ND1 and the first output node NF1 of the switching mixer 82. The switch element SF2 is provided between the second input node ND2 and the second output node NF2 of the switching mixer 82. The switch element SF3 is provided between the second input node ND2 and the first output node NF1. The switch element SF4 is provided between the first input node ND1 and the second output node NF2. The switch elements SF1 to SF4 can be configured by, for example, MOS transistors (e.g., NMOS transistors or transfer gates).

The switch elements SF1 and SF2 are turned on and off by the clock signal CK0. The switch elements SF3 and SF4 are turned on and off by the clock signal XCK0. The clock signal CK0 is equivalent to the synchronization signal SYC. The clock signal XCK0 is an inverted signal of the clock signal CK0 (a signal having a phase 180 degrees different from the phase of the clock signal CK0). Therefore, the switch elements SF1 and SF3 are exclusively turned on and off and the switch elements SF2 and SF4 are exclusively turned on and off. For example, when the clock signal CK0 (SYC) is at the H level (in a broad sense, the first voltage level), the switch elements SF1 and SF2 are turned on and the switch elements SF3 and SF4 are turned off. When the clock signal CK0 is at the L level (in a broad sense, the second voltage level), the switch elements SF1 and SF2 are turned off and the switch elements SF3 and SF4 are turned on.

Consequently, the differential signals QD1 and QD2 from the gain adjustment amplifier 76*a* are synchronously detected in a state of differential signals. Signals after the synchronous detection are output as the differential signals QF1 and QF2. An unnecessary signal such as noise (1/f noise) generated by the circuit (the Q/V conversion circuit, the differential amplifier circuit, or the gain adjustment amplifier) at the pre-stage is frequency-converted into a high-frequency band by the switching mixer 82. The desired signal, which is the signal corresponding to the Coriolis force, is dropped to a direct-current signal. The unnecessary signal such as the 1/f noise frequency-converted into the high-frequency band by the switching mixer 82 is removed by the filter unit 90 (FIG. 18) provided at a post stage. The filter unit 90 is, for example, a passive filter configured by a passive element. That is, as the filter unit 90, a passive filter configured by a passive element such as a resistance element or a capacitor without using an operational amplifier can be adopted.

The signal QD1 from the gain adjustment amplifier 76*a* at the pre-stage is input to the first input node ND1 of the switching mixer 84. The signal QD2 from the gain adjustment amplifier 76*a* is input to the second input node ND2 of the switching mixer 84. The switching mixer 84 outputs the differential signals QG1 and QG2 to the first and second output nodes NG1 and NG2.

The switching mixer 84 includes the switch elements SG1, SG2, SG3, and SG4. The switch element SG1 is provided between the first input node ND1 and the first output node NG1. The switch element SG2 is provided between the second input node ND2 and the second output node NG2. The switch element SG3 is provided between the second input node ND2 and the first output node NG1. The switch element SG4 is provided between the first input node ND1 and the second output node NG2. The switch elements SG1 to SG4 can be configured by, for example, MOS transistors (e.g., NMOS transistors or transfer gates).

The switch elements SG1 and SG2 are turned on and off by a clock signal CK90. The switch elements SG3 and SG4 are turned on and off by a clock signal XCK90. The clock signal CK90 is a signal having a phase 90 degrees different from the phase of the clock signal CK0 (the synchronization signal SYC). The clock signal XCK 90 is an inverted signal of the clock signal CK90 (a signal having a phase 180 degrees different from the phase of the clock signal CK90). Therefore, the switch elements SG1 and SG3 are exclusively turned on and off. The switch elements SG2 and SG4 are exclusively turned on and off. For example, when the clock signal CK90 is at the H level, the switch elements SG1 and SG2 are turned on and the switch elements SG3 and SG4 are turned off. When the clock signal CK90 is at the L level, the switch elements SG1 and SG2 are turned off and the switch elements SG3 and SG4 are turned on.

The signal of the vibration leak (in a broad sense, an unnecessary signal) arbitrarily generated in the vibrator element 10 has a phase 90 degrees different from the phase of the synchronization signal SYC (the desired signal). Therefore, the switching mixer 84 synchronously detects the signals QD1 and QD2 on the basis of the clock signal CK90 having a phase 90 degrees different from the phase of the clock signal CK0, which is the synchronization signal SYC. Consequently, it is possible to extract an arbitrarily mixed vibration leak signal. A level of the vibration leak signal in this case is known. Therefore, by A/D-converting a detection result by the switching mixer 84 and comparing the detection result with an expected value, it is possible to detect that an expected vibration leak signal is mixed in the signals QD1 and QD2. When the expected vibration leak signal is detected, it is possible to determine that the detection circuit 60a is normally operating. This diagnosis processing performed using the switching mixer 84 is executed in the period of the constant diagnosis explained with reference to FIG. 11 in the first embodiment.

In the following explanation, "an analog-common-voltage generation circuit that generates the analog common voltage VCM", "self-diagnosis by the diagnosis circuit 150", and "the operation of the circuit device" are explained. However, "the analog-common-voltage generation circuit that generates the analog common voltage VCM" is the same as the configuration explained with reference to FIG. 9 in the first embodiment. Therefore, explanation of "the analog-common-voltage generation circuit that generates the analog common voltage VCM" is omitted.

The self-diagnosis by the diagnosis circuit 150 is explained with reference to FIG. 10. In FIG. 10, the diagnosis signal SFD, voltage amplitude of which is VB, is input to the first node N1 shown in FIG. 19. Then, the Q/V conversion circuit 62 outputs the signal QB1, voltage amplitude of which is VB1. The Q/V conversion circuit 64 outputs the signal QB2, voltage amplitude of which is VB2. Note that, in FIG. 10, the diagnosis signal SFD is a rectangular wave. However, the diagnosis signal SFD may be a periodical signal such as a sine wave.

For example, capacity values of the feedback capacitors CB1 and CB2 are equal. A capacity value of the capacitor C2 is larger than a capacity value of the capacitor C1. The capacity value of the capacitors CB1 and CB2 is, for example, approximately 0.5 pF to 1.5 pF. The capacity value C of the capacitor C1 is, for example, approximately 250 fF to 750 fF. The difference ΔC between the capacity values of the capacitors C1 and C2 is, for example, approximately 50 fF to 150 fF. Note that the capacitors C1, C2, CB1, and CB2 can be realized by, for example, capacitors (poly double layer capacitors) formed of polysilicon or capacitors formed of MIM (Meal-Insulator-Metal).

In the way, when the capacitor C2 has the larger capacity value compared with the capacitor C1, as shown in FIG. 10, the Q/V conversion circuits 62 and 64 output the signals QB1 and QB2 that satisfy a relation of VB1<VB2. Specifically, the Q/V conversion circuits 62 and 64 are inverting amplifiers. Therefore, as shown in FIG. 10, when the diagnosis signal SFD has a positive polarity, the Q/V conversion circuits 62 and 64 output the signals QB1 and QB2 that have a negative polarity based on (centering on) the analog common voltage VCM and satisfy the relation of VB1<VB2 concerning voltage amplitude.

That is, both potentials at the input nodes NA1 and NA2 are set to the analog common voltage VCM by virtual grounding (virtual short) by the operational amplifiers OPB1 and OPB2 of the Q/V conversion circuits 62 and 64. Since the capacitor C2 has the larger capacity value compared with the capacitor C1, when the diagnosis signal SFD, voltage amplitude of which is VB, is applied to the other ends of the capacitors C1 and C2, a stored charge amount of the capacitor C2 is larger than a stored charge amount of the capacitor C1. Since the capacity values of the feedback capacitors CB1 and CB2 of the Q/V conversion circuits 62 and 64 are equal, a relation of VB1<VB2 holds concerning the voltage amplitudes of the signals QB1 and QB2. That is, the voltage amplitude VB1 of the signal QB1 is set to amplitude corresponding to a capacity ratio (C1/CB1) of the capacitor C1 and the feedback capacitor CB1. The voltage amplitude VB2 of the signal QB2 is set to amplitude corresponding to a capacity ratio (C2/CB2) of the capacitor C2 and the feedback capacitor CB2. Since the capacitor C2 has the larger capacity value compared with the capacitor C1, the relation of VB1<VB2 holds.

The differential amplifier circuit 70a amplifies a differential component between the signals QB1 and QB2. Therefore, as shown in FIG. 10, signals obtained by multiplying a difference between the signals QB1 and QB2 with a gain and inverting the difference are output as the differential signals QC1 and QC2. For example, when a gain of the differential amplification of the differential amplifier circuit 70a is represented as GC, a differential voltage between the signal QC1 and the signal QC2 can be represented as VDF=GC×(VB2-VB1).

In this way, by inputting the diagnosis signal SFD to the node N1 on the other end side of the capacitor C1, it is possible to supply a desired signal (a pseudo-desired signal) for diagnosis indicated by the signals QC1 and QC2 to the detection circuit 60a. By performing a detection operation for the desired signal for diagnosis and monitoring a result of the detection, the detection circuit 60a is capable of diagnosing whether the detection circuit 60a is normally operating (self-diagnosis or failure diagnosis). Specifically, it is possible to perform diagnosis of the detection circuit 60a by detecting a differential voltage VDF between the signals QC1 and QC2 shown in FIG. 10.

For example, since the capacity values of the capacitors C1, C2, CB1, and CB2 and the voltage amplitude of the diagnosis signal SFD are known, the differential voltage VDF between the signals QC1 and QC2 is also known. Therefore, if a detection result of the detection circuit 60a corresponding to the differential voltage VDF is within a range of an expected value, it is possible to diagnose that the detection circuit 60a is normally operating. Specifically, an unnecessary signal having a phase different from the phase of the synchronization signal SYC (e.g., an unnecessary signal having a phase shifted 90 degrees) is removed by, for example, the synchronous detection of the synchronous detection circuit 81. On the other hand, a desired signal for diagnosis having a phase same as the phase of the synchronization signal SYC is extracted. That is, a component of the desired signal for diagnosis appears in a frequency band of a DC or the like in a frequency spectrum. Therefore, if a value of a DC component (a DC voltage value or an A/D-converted value of a DC voltage) of the desired signal for diagnosis is within the range of the expected value, it is possible to diagnose that the detection circuit 60a is normally operating.

FIG. 11 is an operation sequence chart for explaining the operation of the circuit device according to this embodiment. As shown in FIG. 11, after electric power is input to the circuit device and the power supply is turned on, the circuit device is set in the diagnosis mode and initial diagnosis is performed. That is, diagnosis for verifying whether the detection circuit 60a is normally operating is performed. During the initial diagnosis (the diagnosis mode), the switch elements SW1 and SW2 of the diagnosis circuit 150 are turned on and, on the other hand, the switch elements SW3 and SW4 are turned off. Consequently, the input of the detection signals IQ1 and IQ2 from the vibrator element 10 is electrically cut off. A signal obtained by converting a voltage level of a signal from the driving circuit 30 is input to the node N1 at the other ends of the capacitors C1 and C2 as the diagnosis signal SFD. Consequently, as explained with reference to FIG. 10, it is possible to supply a pseudo-desired signal for diagnosis to the detection circuit 60a and diagnose whether the circuits of the detection circuit 60a are normally operating.

When the initial diagnosis ends and the circuit device changes to the normal operation period in which the desired signal is detected, the switch elements SW3 and SW4 are turned on and, on the other hand, the switch elements SW1 and SW2 are turned off. Consequently, the detection signals IQ1 and IQ2 from the vibrator element 10 are input to the detection circuit 60a and detection processing of the desired signal is performed. At this point, since the switch elements SW1 and SW2 are turned off, it is possible to prevent a situation in which, for example, noise based on a signal from the driving circuit 30 is transmitted to the input nodes NA1 and NA2 of the detection circuit 60a.

In this way, in FIG. 11, after the power-on and before the normal operation period, the circuit device is set in the diagnosis mode. The setting in the diagnosis mode is realized when, for example, a controller on the outside of the circuit device issues a command for starting the diagnosis mode (the initial diagnosis) and the command is received via an interface of the circuit device. Alternatively, after the power-on, the operation mode of the circuit device may be automatically set to the diagnosis mode. Note that, after the start of the normal operation, the normal operation may be stopped once and the diagnosis processing of the circuit device may be performed on the basis of, for example, the issuance of the command from the controller on the outside of the circuit device.

As shown in FIG. 11, in the normal operation period, constant diagnosis for constantly checking whether the detection circuit 60a is normally operating is performed.

In the constant diagnosis, the failure detection circuit 160a performs failure detection of the differential amplifier circuit 70a and the gain adjustment amplifier 76a. That is, the failure detection circuit 160a detects whether the monitoring voltages VB and VA are within the determination voltage range. The control unit 140 performs failure diagnosis of the differential amplifier circuit 70a and the gain adjustment amplifier 76a on the basis of the monitoring result signals DGC and DGD from the failure detection circuit 160a.

In the constant diagnosis, the switching mixer 84 performs the synchronous detection for extracting an arbitrarily generated vibration leak signal. The control unit 140 performs failure diagnosis of the entire detection circuit 60a by detecting whether a component of the extracted vibration leak signal is within the range of the expected value. At this point, the switching mixer 82 is performing the normal synchronous detection for extracting the desired signal. Therefore, it is possible to simultaneously execute the failure diagnosis by the extraction of the vibration leak signal and the extraction processing of the desired signal by the synchronous detection. The constant diagnosis is realized.

As explained above, in the second embodiment, it is possible to execute, while performing the extraction processing of the desired signal by the synchronous detection, the failure diagnosis of the differential amplifier circuit 70a and the gain adjustment amplifier 76a by the failure detection circuit 160a and the failure diagnosis of the entire detection circuit 60a by the switching mixer 84 in parallel to the extraction processing. It is possible to realize the constant diagnosis during the actual operation of the circuit device. Therefore, it is possible to greatly improve reliability against a failure and performance deterioration due to a change with time.

4. A Moving Object and an Electronic Apparatus

Figure 20A:
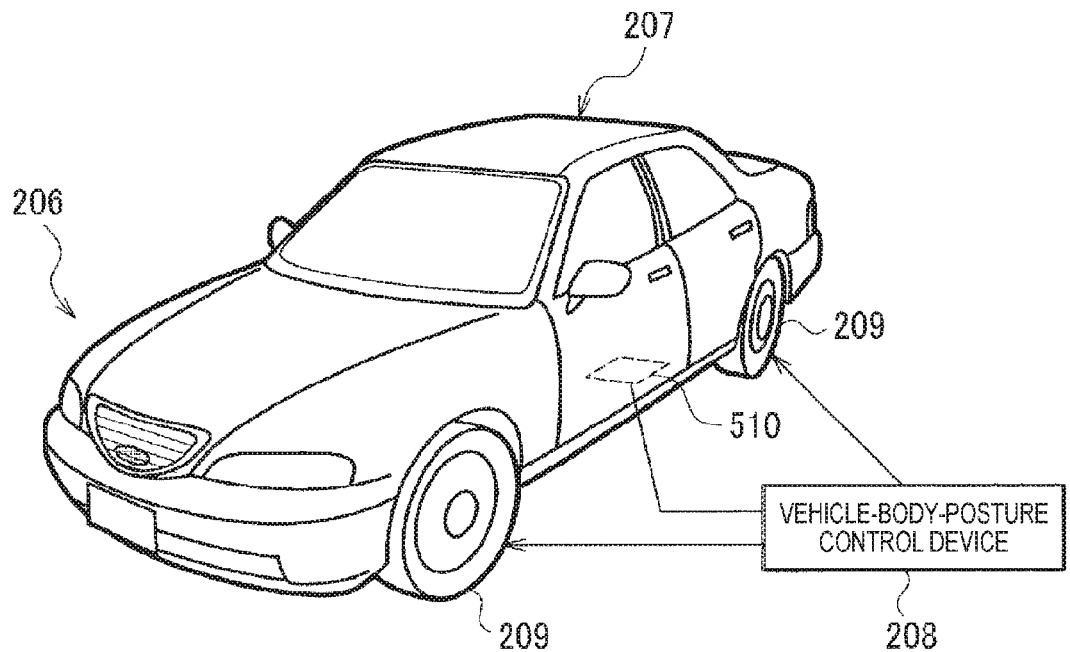
FIG. 20A is a configuration example of a moving object in which a circuit device according to an embodiment is incorporated.

An example of a moving object including the circuit device 20 or 20a according to the embodiment explained above is shown in FIG. 20A. The circuit device 20 or 20a according to the embodiment can be incorporated in various moving objects such as a car, an airplane, a motorcycle, a bicycle, and a ship. The moving object is, for example, a machine or an apparatus that includes a driving mechanism such as an engine or a motor, a steering mechanism such as a handle or a rudder, and various electronic apparatuses. FIG. 20A schematically shows an automobile 206 as a specific example of the moving object. In the automobile 206, the gyro sensor 510 or 510a (a sensor) including the vibrator element 10 and the circuit device 20 or 20a is incorporated. The gyro sensor 510 or 510a can detect the posture of a vehicle body 207. A detection signal of the gyro sensor 510 or 510a is supplied to a vehicle-body-posture control device 208. The vehicle-body-posture control device 208 can control hardness and softness of a suspension and control brakes of respective wheels 209 according to, for example, the posture of the vehicle body 207. Besides, such posture control can be used in various moving objects such as a bipedal walking robot, an airplane, and a helicopter. The gyro sensor 510 can be incorporated in realizing the posture control.

Figure 20B:
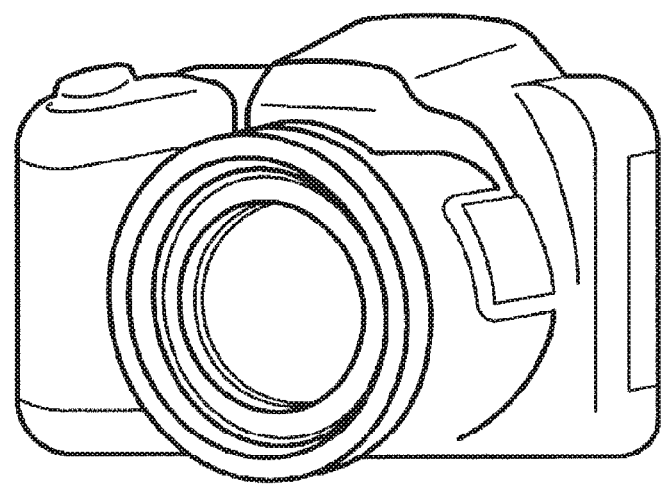
FIG. 20B is a configuration example of an electronic apparatus in which the circuit device according to the embodiment is incorporated.
Figure 20C:
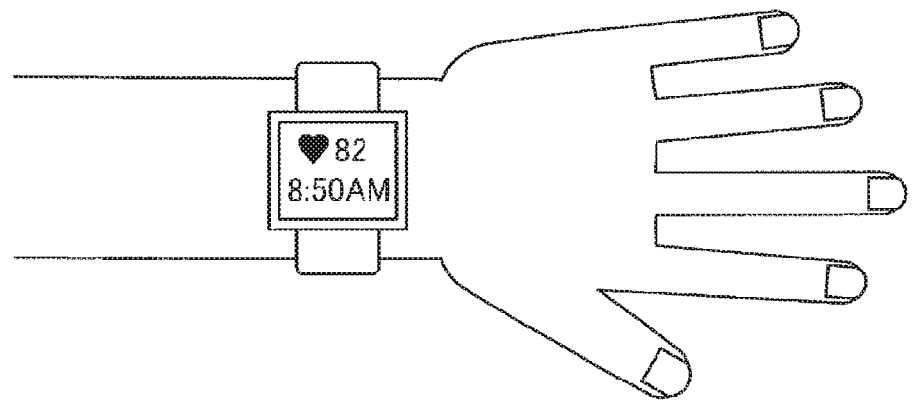
FIG. 20C is a configuration example of an electronic apparatus in which the circuit device according to the embodiment is incorporated.
Figure 20D:
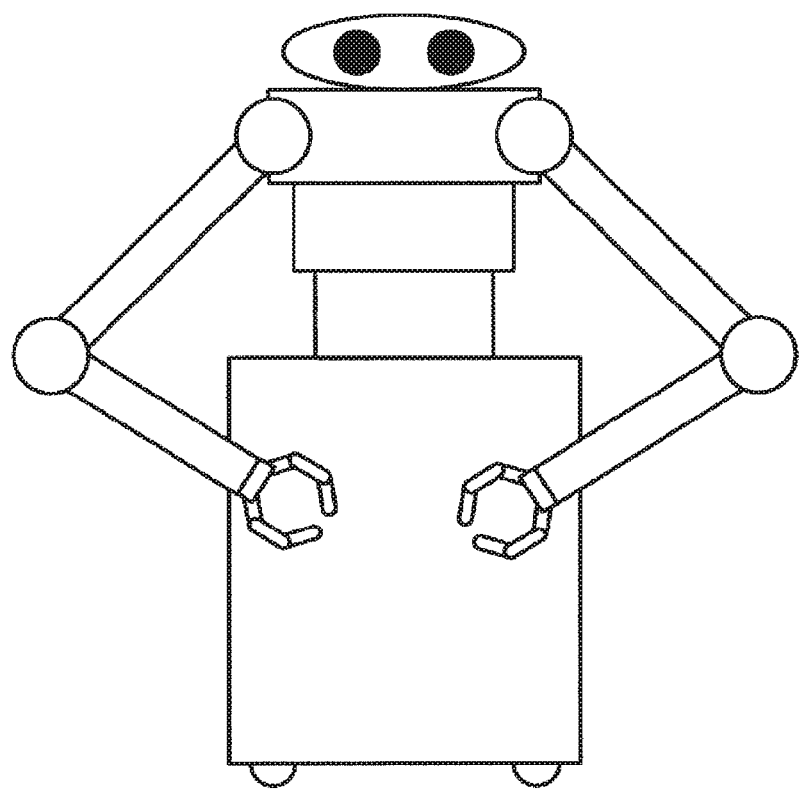
FIG. 20D is a configuration example of a robot in which the circuit device according to the embodiment is incorporated.

As shown in FIGS. 20B and 20C, the circuit device according to this embodiment can be applied to various electronic apparatuses such as a digital still camera and a biological-information detecting apparatus (a wearable health apparatus such as a pulsimeter, a pedometer, or an activity meter). For example, in the digital still camera, it is possible to perform camera shake correction and the like using a gyro sensor or an acceleration sensor. In the biological-information detecting apparatus, it is possible to detect a body motion of a user and detect an exercise state using a gyro sensor or an acceleration sensor. As shown in FIG. 20D, the circuit device according to this embodiment can also be applied to movable sections (arms and joints) and a main body section of a robot. As the robot, both of a moving object (a running/walking robot) and an electronic apparatus (a non-running/non-walking robot) can be assumed. In the case of the running/walking robot, the circuit device according to this embodiment can be used for, for example, autonomous running.

Note that the embodiments are explained in detail above. However, it could be easily understood by those skilled in the art that many modifications are possible without substantively departing from the new matters and the effects of the invention. Therefore, all such modifications are deemed to be included in the scope of the invention. For example, the terms (the gyro sensor, the vibrator element, etc.) described together with the broader or synonymous different terms (the physical-quantity detecting apparatus, the physical quantity transducer, etc.) at least once in the specification or the drawings can be replaced with the different terms in any place in the specification or the drawings. The configurations of the circuit device, the physical-quantity detecting apparatus, the electronic apparatus, and the moving object, the structure of the vibrator element, and the like are not limited to the configurations, the structure, and the like explained in the embodiments. Various modified implementations of the configurations, the structure, and the like are possible.

The entire disclosure of Japanese Patent Application Nos. 2015-051774, filed Mar. 16, 2015 and 2015-051775, filed Mar. 16, 2015 are expressly incorporated by reference herein.

What is claimed is:

1. A circuit device comprising:
   a first amplifier including an inversion input terminal and a non-inversion input terminal;

a second amplifier including an inversion input terminal and a non-inversion input terminal, wherein
a first signal and a second signal forming differential signals are input to the first amplifier and the second amplifier,
the first signal is input to the inversion input terminal of the first amplifier and to the non-inversion input terminal of the second amplifier,
the second signal is input to the non-inversion input terminal of the first amplifier and to the inversion input terminal of the second amplifier,
the first amplifier output a first single-ended output signal,
the second amplifier outputs a second single-ended output signal; and
a failure detection circuit that performs a failure detection of at least one of the first amplifier and the second amplifier on a basis of at least one of the first single-ended output signal and the second single-ended output signal.

2. The circuit device according to claim 1, wherein the first amplifier and second amplifier are amplifiers that perform a single-end output based on a same analog common voltage.

3. The circuit device according to claim 2, wherein the failure detection circuit performs the failure detection by detecting whether a monitoring voltage based on a voltage of the first single-ended output signal and a voltage of the second single-ended output signal is within a determination voltage range based on the same analog common voltage.

4. The circuit device according to claim 1, wherein the failure detection circuit performs the failure detection on a basis of a monitoring voltage obtained by dividing a voltage of the first single-ended output signal and a voltage of the second single-ended output signal.

5. The circuit device according to claim 4, wherein the failure detection circuit performs the failure detection by detecting whether the monitoring voltage is within a determination voltage range between a first threshold voltage on a high potential side and a second threshold voltage on a low potential side.

6. The circuit device according to claim 1, wherein
the first amplifier includes:
a first operational amplifier;
a first resistance element provided between the inversion input terminal of the first amplifier and an inversion input terminal of the first operational amplifier;
a second resistance element provided between the inversion input terminal of the first operational amplifier and an output terminal of the first operational amplifier;
a third resistance element provided between the non-inversion input terminal of the first amplifier and a non-inversion input terminal of the first operational amplifier; and
a fourth resistance element provided between the non-inversion input terminal of the first operational amplifier and an analog common voltage node, and
the second amplifier includes:
a second operational amplifier;
a fifth resistance element provided between the inversion input terminal of the second amplifier and an inversion input terminal of the second operational amplifier;
a sixth resistance element provided between the inversion input terminal of the second operational amplifier and an output terminal of the second operational amplifier;
a seventh resistance element provided between the non-inversion input terminal of the second amplifier and a non-inversion input terminal of the second operational amplifier; and
an eighth resistance element provided between the non-inversion input terminal of the second operational amplifier and the analog common voltage node.

7. The circuit device according to claim 1, further comprising:
a driving circuit configured to drive a physical quantity transducer; and
a detection circuit to which a first detection signal and a second detection signal from the physical quantity transducer are input, wherein
the detection circuit includes a differential amplifier circuit configured by the first amplifier and second amplifier and configured to receive an input of the first signal and second signal corresponding to the first detection signal and the second detection signal.

8. The circuit device according to claim 7, wherein the detection circuit includes:
a first charge/voltage conversion circuit provided on a pre-stage side of the differential amplifier circuit and configured to receive an input of the first detection signal and output the first signal; and
a second charge/voltage conversion circuit provided on the pre-stage side of the differential amplifier circuit and configured to receive an input of the second detection signal and output the second signal.

9. A circuit device comprising:
a first operational amplifier in which a first signal and a second signal forming differential signals are input, wherein the first signal is input to non-inversion input terminal of the first operational amplifier and the second signal is input to an inversion input terminal of the first operational amplifier;
a second operational amplifier in which a third signal and a forth signal forming differentials signals are input, wherein the third signal is input to the inversion input terminal of the second operational amplifier and the fourth signal is input to a non-inversion terminal of the second operation amplifier;
a first voltage division circuit configured to divide a voltage at a first node and a voltage at an output terminal of the first operational amplifier and set the inversion input terminal of the first operational amplifier to a voltage obtained by the first voltage division circuit;
a second voltage division circuit configured to divide the voltage at the first node and a voltage at an output terminal of the second operational amplifier and set the inversion input terminal of the second operational amplifier to a voltage obtained by the second voltage division circuit; and
a failure detection circuit configured to perform a failure detection of at least one of the first operational amplifier and the second operational amplifier on a basis of a monitoring voltage which is the voltage at the first node.

10. The circuit device according to claim 9, wherein
the first voltage division circuit includes:
a first resistance element provided between the first node and the inversion input terminal of the first operational amplifier; and a second resistance element provided between the inversion input terminal of the first operational amplifier and the output terminal of the first operational amplifier, and the second voltage division circuit includes:

a third resistance element provided between the first node and the inversion input terminal of the second operational amplifier; and a fourth resistance element provided between the inversion input terminal of the second operational amplifier and the output terminal of the second operational amplifier.

11. The circuit device according to claim 10, wherein at least one of the first resistive element and the second resistance element and at least one of the third resistive element and the fourth resistance element are resistance elements having variable resistance values.

12. The circuit device according to claim 9, wherein the first signal changes to a positive side or a negative side on a basis of an analog common voltage, the second signal changes to the positive side or the negative side on the basis of the analog common voltage, and the failure detection circuit performs the failure detection by detecting whether the monitoring voltage is within a determination voltage range based on the analog common voltage.

13. The circuit device according to claim 12, wherein the failure detection circuit performs the failure detection by detecting whether the monitoring voltage is within the determination voltage range between a first threshold voltage on a high potential side and a second threshold voltage on a low potential side.

14. The circuit device according to claim 9, further comprising:

a driving circuit configured to drive a physical quantity transducer; and a detection circuit to which a first detection signal and a second detection signal from the physical quantity transducer are input, wherein the detection circuit includes a gain adjustment amplifier configured by the first operational amplifier, the second operational amplifier, the first voltage division circuit, and the second voltage division circuit, the gain adjustment amplifier is configured to receive inputs of the first detection signal and the second detection signal, and the first detection signal corresponds to the first signal, and the second detection signal corresponds to the fourth signal.

15. The circuit device according to claim 14, further comprising a synchronous detection circuit provided on a post-stage side of the gain adjustment amplifier and configured to perform synchronous detection on a basis of a synchronization signal from the driving circuit.

16. The circuit device according to claim 14, wherein the detection circuit includes a differential amplifier circuit provided on a pre-stage side of the gain adjustment amplifier and configured to output the first signal and the fourth signal.

17. The circuit device according to claim 16, wherein the detection circuit includes:

a first charge/voltage conversion circuit provided on a pre-stage side of the differential amplifier circuit and configured to receive an input of the first detection signal; and a second charge/voltage conversion circuit provided on the pre-stage side of the differential amplifier circuit and configured to receive an input of the second detection signal.

18. A physical-quantity detecting apparatus comprising:

the circuit device according to claim 7; and the physical quantity transducer.

19. An electronic apparatus comprising the circuit device according to claim 1.

20. A moving object comprising the circuit device according to claim 1.

* * * * *